US012701712B2

(12) United States Patent
Kim et al.

(10) Patent No.: US 12,701,712 B2
(45) Date of Patent: Aug. 4, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Kang Lib Kim, Suwon-si (KR); Sea Hoon Lee, Suwon-si (KR); Junhee Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 308 days.

(21) Appl. No.: 18/529,241

(22) Filed: Dec. 5, 2023

(65) Prior Publication Data

US 2024/0431113 A1 Dec. 26, 2024

(30) Foreign Application Priority Data

Jun. 21, 2023 (KR) ........................ 10-2023-0079751

(51) Int. Cl.

| | |
|---|---|
| *H10B 43/40* | (2023.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |

(Continued)

(52) U.S. Cl.
CPC ............. *H10B 43/40* (2023.02); *H10B 41/10* (2023.02); *H10B 41/27* (2023.02); *H10B 41/35* (2023.02); *H10B 41/40* (2023.02);

*H10B 43/10* (2023.02); *H10B 43/27* (2023.02); *H10B 43/35* (2023.02); *H10B 80/00* (2023.02); *H10W 90/00* (2026.01); *H10W 90/752* (2026.01)

(58) Field of Classification Search
CPC ........ H10B 43/40; H10B 41/10; H10B 41/27; H10B 41/35; H10B 41/40; H10B 43/10; H10B 43/27; H10B 43/35; H10B 80/00; H10B 43/50; H10W 90/00; H10W 90/752; H10W 90/24; H10W 90/754
See application file for complete search history.

(56) References Cited

U.S. PATENT DOCUMENTS

| | | | |
|---|---|---|---|
| 9,337,207 B2 | 5/2016 | Park et al. | |
| 10,283,566 B2 | 5/2019 | Sel et al. | |

(Continued)

*Primary Examiner* — Douglas W Owens
(74) *Attorney, Agent, or Firm* — Harness, Dickey & Pierce, P.L.C.

(57) ABSTRACT

A semiconductor device includes a circuit region including a peripheral circuit on a substrate; and a cell region adjacent to the circuit region. The cell region includes a cell array region and a connecting region. The cell region also includes a gate stack that includes an interlayer insulating layer and a gate electrode, alternately stacked on the substrate; a channel in the cell array region that extends through the gate stack; a main support in the connecting region that extends through the gate stack; and a contact electrode in the connecting region connected to the gate electrode through the gate stack. The main support includes a first portion extending along a first direction; and a second portion extending from the first portion in a second direction crossing the first direction. At least a portion of the contact electrode is surrounded by the first and second portions of the main support.

20 Claims, 38 Drawing Sheets

(51) Int. Cl.
    *H10B 43/27*         (2023.01)
    *H10B 43/35*         (2023.01)
    *H10B 80/00*         (2026.01)
    *H10W 90/00*        (2026.01)

(56)              References Cited

U.S. PATENT DOCUMENTS

| | | |
|---|---|---|
| 10,504,914 B2 | 12/2019 | Wang |
| 11,444,097 B2 | 9/2022 | Takeshita et al. |
| 11,508,746 B2 | 11/2022 | Clampitt et al. |
| 12,538,486 B2 * | 1/2026 | Lee ........................ H10B 41/41 |
| 12,538,487 B2 * | 1/2026 | Im ......................... H10B 43/27 |
| 2014/0306279 A1 | 10/2014 | Park et al. |
| 2018/0350879 A1 | 12/2018 | Sel et al. |
| 2019/0259773 A1 | 8/2019 | Wang |
| 2020/0035702 A1 * | 1/2020 | Lee ........................ H10B 41/10 |
| 2021/0126007 A1 | 4/2021 | Clampitt et al. |
| 2021/0265378 A1 | 8/2021 | Takeshita et al. |
| 2022/0130954 A1 | 4/2022 | Luo et al. |
| 2022/0199639 A1 | 6/2022 | Yeh et al. |
| 2024/0081060 A1 * | 3/2024 | Kim ...................... H10B 43/27 |
| 2024/0276729 A1 * | 8/2024 | Choi ...................... H10B 43/27 |

* cited by examiner

SEMICONDUCTOR DEVICE AND ELECTRONIC SYSTEM INCLUDING THE SAME

CROSS-REFERENCE TO RELATED APPLICATION

This application claims priority to and the benefit of Korean Patent Application No. 10-2023-0079751, filed in the Korean Intellectual Property Office on Jun. 21, 2023, the entire contents of which are incorporated herein by reference.

BACKGROUND OF THE INVENTION

1. Field

The present disclosure relates to a semiconductor device and an electronic system including the same.

2. Description of the Related Art

A semiconductor is a material belonging to an intermediate region between a conductor and an insulator, and refers to a material that conducts electricity under a predetermined condition. Various semiconductor devices can be manufactured by using such a semiconductor material, and for example, a memory device and the like can be manufactured. Memory devices may be classified into volatile memory devices and non-volatile memory devices. In the case of a non-volatile memory device, contents may not be deleted even if power is cut off, and may be used in various electronic devices such as mobile phones, digital cameras, and PCs.

In accordance with a recent trend of increasing storage capacity, improving a degree of integration of non-volatile memory devices is desirable. The degree of integration of memory devices two-dimensionally arranged on a plane may be limited. Accordingly, a vertical non-volatile memory device arranged in three dimensions has been proposed.

SUMMARY

Example embodiments attempt to provide a semiconductor device and an electronic system including the same, capable of improving reliability and productivity.

An example embodiment of the present disclosure provides a semiconductor device including: a circuit region configured to include a peripheral circuit structure on a substrate; and a cell region adjacent to the circuit region and configured to include a cell array region and a connecting region, wherein the cell region includes a gate stack structure configured to include an interlayer insulating layer and a gate electrode which are alternately stacked on the substrate, a channel structure in the cell array region and to configured to extend through the gate stack structure, a main support structure in the connecting region and configured to extend through the gate stack structure, and a contact electrode in the connecting region and connected to the gate electrode through the gate stack structure, and the main support structure includes, a first portion configured to extend along a first direction; and a second portion configured to extend from the first portion in a second direction crossing the first direction, wherein at least a portion of the contact electrode is surrounded by the first portion and the second portion of the main support structure.

An example embodiment of the present disclosure provides a semiconductor device including: a circuit region configured to include a peripheral circuit structure on a substrate; and a cell region adjacent to the circuit region and configured to include a cell array region and a connecting region, and the cell region may include a gate stack structure configured to include a plurality of interlayer insulating layers and a plurality of gate electrodes alternately stacked on the substrate, a channel structure in the cell array region configured to extend through the gate stack structure, a support structure in the connecting region to extend through the gate stack structure, and a contact electrode in the connecting region connected to the gate electrode through the gate stack structure, each of the gate electrodes may include a pad electrode in the connecting region, the contact electrode may be electrically connected to a pad electrode of one of the gate electrodes and insulated from remaining gate electrodes with an insulating pattern provided therebetween, and the contact electrode may be at least partially surrounded by the support structure in a plan view, and may include a first contact portion surrounded by the gate stack structure in a cross-sectional view, and connected to the peripheral circuit structure; and a second contact portion on the first contact portion and on the gate stack structure and connected to an upper surface of the pad electrode.

An example embodiment of the present disclosure provides an electronic system including: a main substrate; a semiconductor device on the main substrate; and a controller electrically connected to the semiconductor device on the main substrate, the semiconductor device may include: a circuit region configured to include a peripheral circuit structure on a substrate, and a cell region adjacent to the circuit region and configured to include a cell array region and a connecting region, the cell region may include a gate stack structure configured to include a plurality of interlayer insulating layers and a plurality of gate electrodes which are alternately stacked on the substrate; a channel structure in the cell array region and to configured to extend through the gate stack structure, a support structure in the connecting region and configured to extend through the gate stack structure, and a contact electrode in the connecting region and connected to the gate electrode through the gate stack structure, each of the gate electrodes may include a pad electrode in the connecting region configured to be connected to the contact electrode, and the contact electrode may be electrically connected to a pad electrode of one of the gate electrodes and insulated from remaining gate electrodes with an insulating pattern provided therebetween, and the contact electrode may be at least partially surrounded by the support structure in a plan view, and may include a first contact portion surrounded by the gate stack structure in a cross-sectional view and connected to the peripheral circuit structure, and a second contact portion on the first contact portion and on the gate stack structure and connected to an upper surface of the pad electrode.

According to the example embodiments, in an etching process step for forming a plurality of contact electrodes, as etching is performed in a same etching environment, such as a type or thickness of layers in a region where the contact electrodes are formed, reliability and productivity of semiconductor devices may be improved.

BRIEF DESCRIPTION OF THE DRAWINGS

FIG. 5A to FIG. 5E illustrate cross-sectional views taken along line C-C' of FIG. 1 according to some example embodiments.

FIG. 10, FIG. 12, FIG. 17, FIG. 22, and FIG. 24 illustrate cross-sectional views corresponding to the top plan views for describing a manufacturing method of a semiconductor device according to an example embodiment.

DETAILED DESCRIPTION

Figure 1:
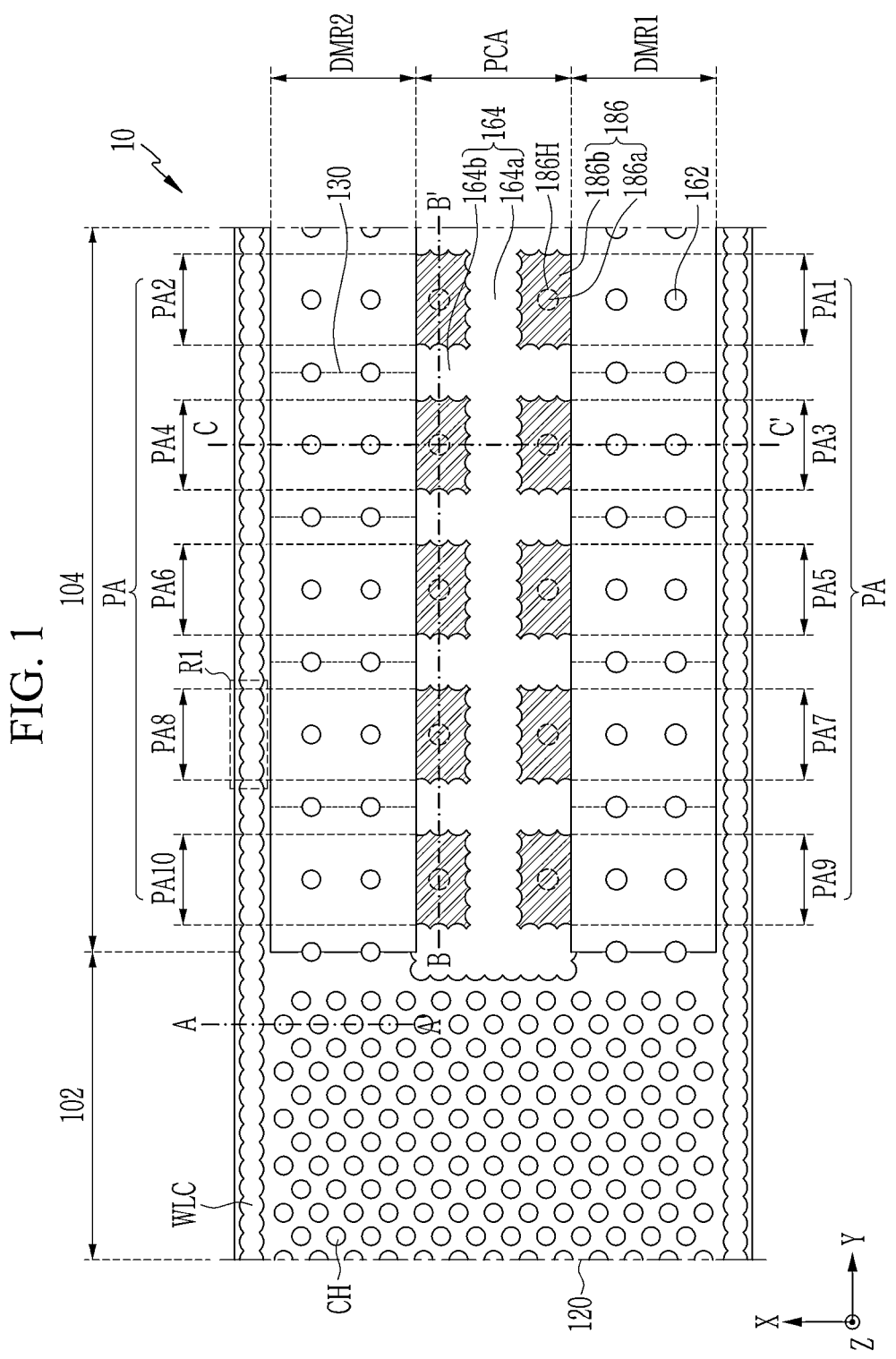
FIG. 1 illustrates a partial top plan view showing a semiconductor device according to an example embodiment.

The present disclosure will be described more fully hereinafter with reference to the accompanying drawings, in which example embodiments of the disclosure are shown. As those skilled in the art would realize, the described example embodiments may be modified in various different ways, all without departing from the spirit or scope of the present disclosure.

To clearly describe the present disclosure, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

Hereinafter, a semiconductor device according to an example embodiment will be described with reference to FIG. 1 and FIG. 5E.

Figure 2:
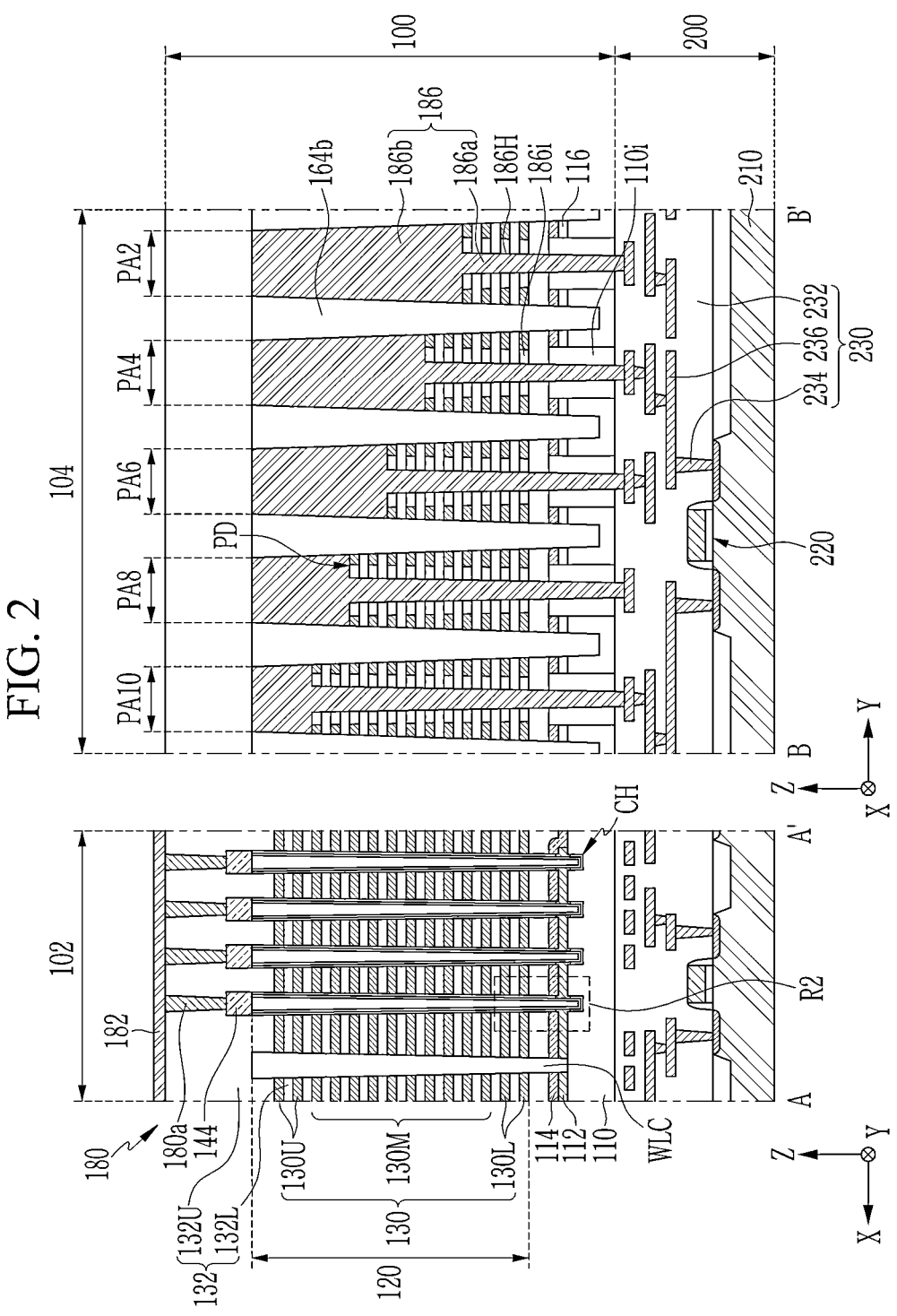
FIG. 2 illustrates a cross-sectional view taken along a line A-A' and a line B-B' of FIG. 1.
Figure 3:
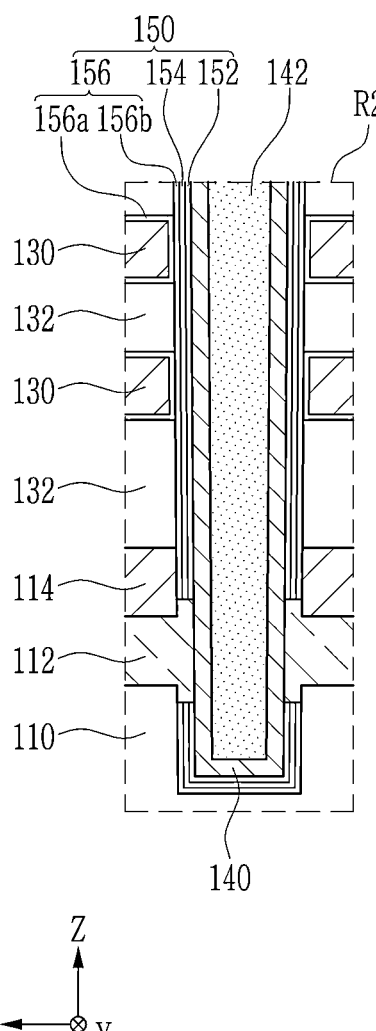
FIG. 3 illustrates a partially enlarged view of a region R2 of FIG. 2.
Figure 4:
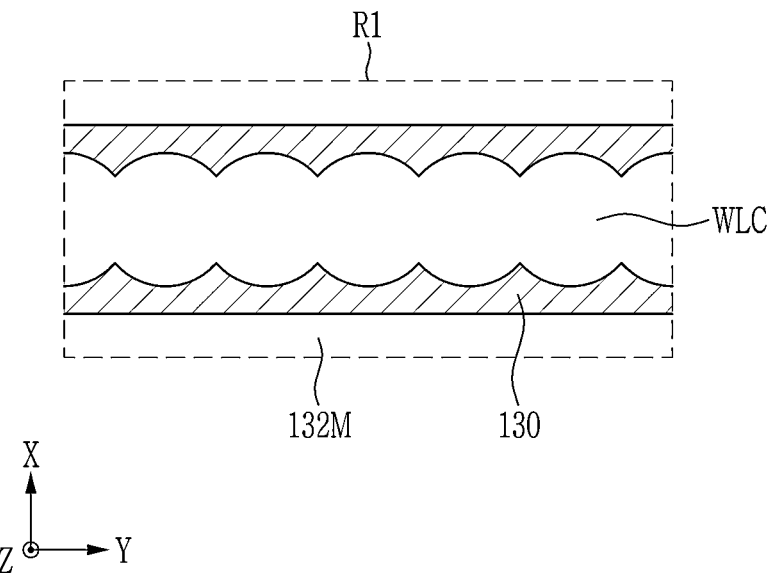
FIG. 4 illustrates a partially enlarged view of a region R1 of FIG. 1.

FIG. 1 illustrates a partial top plan view showing a semiconductor device according to an example embodiment. FIG. 2 illustrates a cross-sectional view taken along a line A-A' and a line B-B' of FIG. 1. FIG. 3 illustrates a partially enlarged view of a region R2 of FIG. 2. FIG. 4 illustrates a partially enlarged view of a region R1 of FIG. 1. FIG. 5A to FIG. 5E illustrate cross-sectional views taken along line C-C' of FIG. 1 according to some example embodiments.

For brief illustration and clear understanding, in FIG. 1, some components are omitted, and a channel structure CH, a contact electrode 184, a main support structure 164, and a sub-support structure 162 are mainly illustrated. In addition, in FIG. 1, illustration of some insulating layers is omitted for clear understanding of a disposition and shape of components in a plan view.

Referring to FIG. 1 to FIG. 5E, a semiconductor device 10 according to an example embodiment includes a cell region 100 including a memory cell structure and a circuit region 200 including a peripheral circuit structure for controlling an operation of the memory cell structure. For example, the circuit region 200 and the cell region 100 may respectively be portions corresponding to a first structure 1100F and a second structure 1100S of a semiconductor device 1100 included in an electronic system 1000 illustrated in FIG. 25. Alternatively, the circuit region 200 and the cell region 100 may be portions including a first structure 3100 and a second structure 3200 of a semiconductor chip 2200 illustrated in FIG. 27, respectively.

Herein, the circuit region 200 may include a peripheral circuit structure positioned on a first substrate 210, and the cell region 100 may include a gate stack structure 120 and a channel structure CH positioned on a cell array region 102 of the second substrate 110 as a memory cell structure. A first wire portion 230 electrically connected to the peripheral circuit structure may be positioned in the circuit region 200, and a second wire portion 180 electrically connected to the memory cell structure may be positioned in the cell region 100.

In an example embodiment, the cell region 100 may be positioned on the circuit region 200. Accordingly, since an area corresponding to the circuit region 200 does not need to be secured separately from the cell region 100, an area of the semiconductor device 10 may be reduced. However, the present disclosure is not limited thereto, and the circuit region 200 may be positioned next to the cell region 100. In addition, a disposition relationship between the cell region 100 and the circuit region 200 may be variously changed.

The circuit region 200 may include the first substrate 210 and a circuit element 220 and the first wire portion 230 positioned on the first substrate 210.

The first substrate 210 may be a semiconductor substrate including a semiconductor material. For example, the first substrate 210 may be a semiconductor substrate made of a semiconductor material or may be a semiconductor substrate on which a semiconductor layer is formed on a base substrate. For example, the first substrate 210 may include, e.g., silicon, epitaxial silicon, germanium, silicon-germanium, silicon-on-insulator (SOI), or germanium on insulator (GOI).

The circuit element 220 formed on the first substrate 210 may include various circuit elements that control the operation of the memory cell structure provided in the cell region 100. For example, the circuit element 220 may configure peripheral circuit structures such as a decoder circuit 1110 (see FIG. 25), a page buffer 1120 (see FIG. 25), and a logic circuit 1130 (see FIG. 25).

The circuit element 220 may include, e.g., a transistor, but the present disclosure is not limited thereto. For example, the peripheral circuit element 220 may include not only active elements such as transistors, but also passive elements such as capacitors, resistors, and inductors.

The first wire portion 230 positioned on the first substrate 210 may be electrically connected to the circuit element 220. As an example, the first wire portion 230 may include a plurality of wiring layers 236 spaced apart with a circuit insulating layer 232 provided therebetween and connected to form a desired path by a contact via 234. The wiring layer 236 or the contact via 234 may include various conductive materials, and the circuit insulating layer 232 may include various insulating materials.

The cell region 100 may include the cell array region 102 and a connecting region 104. The gate stack structure 120 and the channel structure CH may be positioned on the second substrate 110 in the cell array region 102. In the connecting region 104, a structure for connecting the gate stack structure 120 and/or the channel structure CH formed in the cell array region 102 to the circuit region 200 or an external circuit may be positioned.

The second substrate 110 may include an semiconductor material. For example, the second substrate 110 may include polysilicon doped with impurities. The second substrate 110 may function as a common source line. The second substrate 110 may function as a source region supplying a current to memory cells positioned on the second substrate 110. The second substrate 110 may be formed in a plate shape. That is, the second substrate 110 may be formed as a plate common source line.

In an example embodiment, the second substrate 110 may include a semiconductor layer including a semiconductor material. For example, the second substrate 110 may be a semiconductor substrate made of a semiconductor material or may be a substrate on which a semiconductor layer is disposed on a base substrate.

For example, the second substrate 110 may be formed of silicon, germanium, silicon-germanium, silicon on insulator, or germanium on insulator. Herein, the semiconductor layer included in the second substrate 110 may be doped with a P-type or N-type impurity, and for example, an n-type impurity (e.g., phosphorus (P), arsenic (As), etc.) may be doped.

A substrate insulating portion 110i may be provided in a region of the second substrate 110 through which a contact electrode 186 extends. However, a material of the second substrate 110, a conductivity type of impurities doped in the semiconductor layer, and a material thereof are not limited thereto, and may be variously changed.

At least a portion of the circuit insulating layer 232 may be positioned between the second substrate 110 and the first wire portion 230. A portion of the circuit insulating layer 232 disposed between the second substrate 110 and the first wire portion 230 may be formed of a single layer or multiple layers. For example, a layer containing a silicon nitride and a layer containing a silicon oxide may be positioned between the second substrate 110 and the first wire portion 230. Herein, the layer containing the silicon oxide may be positioned on the layer containing the silicon nitride.

In the cell array region 102, the gate stack structure 120 including cell insulating layers 132 and gate electrodes 130 alternately stacked on the first surface (e.g., a front surface or an upper surface) of the second substrate 110, and the channel structure CH extending in a direction crossing the second substrate 110 through the gate stack structure 120 may be position.

Horizontal conductive layers 112 and 114 may be provided between the second substrate 110 and the gate stack structure 120 in the cell array region 102. The horizontal conductive layers 112 and 114 may serve to electrically connect the channel structure CH and the second substrate 110. For example, the horizontal conductive layers 112 and 114 may include a first horizontal conductive layer 112 positioned on the first surface of the second substrate 110, and may further include a second horizontal conductive layer 114 positioned on the first horizontal conductive layer 112. That is, the first horizontal conductive layer 112 may be disposed between the second substrate 110 and the second horizontal conductive layer 114.

The first horizontal conductive layer 112 may not be provided and a horizontal insulating layer 116 may be provided between the second substrate 110 and the gate stack structure 120 in a portion of the connecting region 104. In a manufacturing process, a portion of the horizontal insulating layer 116 may be replaced with the first horizontal conductive layer 112, and another portion of the horizontal insulating layer 116 located in the connecting region 104 may remain in the connecting region 104.

The first horizontal conductive layer 112 may function as a portion of a common source line of the semiconductor device 10. For example, the first horizontal conductive layer 112 and the second substrate 110 may function as the common source line.

As illustrated in the enlarged view of FIG. 3, the channel structure CH may extend to the second substrate 110 through the horizontal conductive layers 112 and 114, and the gate dielectric layer 150 may be removed from a portion where the first horizontal conductive layer 112 is positioned so that the first horizontal conductive layer 112 may be directly connected to a channel layer 140 around the channel layer 140. Accordingly, the first horizontal conductive layer 112 may electrically connect the second substrate 110 and the channel layer 140 to each other.

The first and second horizontal conductive layers 112 and 114 may include a semiconductor material. For example, the first horizontal conductive layer 112 may be polycrystalline silicon doped with impurities, and the second horizontal conductive layer 114 may be polycrystalline silicon doped with impurities or a layer including impurities diffused from the first horizontal conductive layer 112. The present disclosure is not limited thereto, and the second horizontal conductive layer 114 may include an insulating material. In addition, in some example embodiments, the second horizontal conductive layer 114 may be omitted.

A gate stack structure 120 in which cell insulating layers 132 and gate electrodes 130 are alternately stacked may be positioned on the second substrate 110. That is, the gate stack structure 120 may be positioned on the first and second horizontal conductive layers 112, and 114 disposed on the second substrate 110.

In FIG. 2, although the gate stack structure 120 is illustrated as including one gate stack structure, the present disclosure is not limited thereto, the gate stack structure 120 may be formed to include one gate stack structure, it may also be formed to include three or more gate stack structures.

For example, in some example embodiments, the gate stack structure 120 may include a plurality of gate stack structures sequentially stacked on the second substrate 110. Accordingly, since a number of stacked gate electrodes 130 may be increased, a number of memory cells may be increased with a stable structure. That is, when the gate stack structure 120 is formed to include a plurality of gate stack structures, a structure thereof may be simplified while increasing data storage capacity.

In the gate stack structure 120, the gate electrode 130 may include a lower gate electrode 130L, a memory cell gate electrode 130M, and an upper gate electrode 130U sequentially positioned on the second substrate 110.

The lower gate electrode 130L may be used as a gate electrode of a ground select transistor, the memory cell gate electrode 130M may constitute a memory cell, and the upper gate electrode 130U may be used as a gate electrode of a string select transistor.

A number of memory cell gate electrodes 130M may be determined according to data storage capacity of the semiconductor device 10. According to some example embodiments, one or two or more lower gate electrodes 130L and one or two or more upper gate electrodes 130U may be provided, and it may have substantially a same structure as that of the memory cell gate electrode 130M or a different structure.

In addition, a portion of the gate electrode 130, e.g., the memory cell gate electrode 130M adjacent to the lower gate electrode 130L and the upper gate electrode 130U may be a dummy gate electrode.

The cell insulating layers 132 may include an interlayer insulating layer 132L positioned under the gate electrode 130 or between two adjacent gate electrodes 130 in the gate stack structure 120, an intermediate insulating layer 132M for planarizing a step between the gate stack structure 120 having a step shape in dummy regions DMR1 and DMR2 and the gate stack structure 120 positioned in a different region; and an upper insulating layer 132U positioned at an upper portion of the gate stack structure 120

The upper insulating layer 132U may form part or all of a cell region insulating layer positioned at an entire upper portion of the cell region 100. In some example embodiments, thicknesses of the cell insulating layers 132 may not all be the same. For example, a thickness of the intermediate insulating layer 132M is greater than a thickness of the interlayer insulating layer 132L and a thickness of the upper insulating layer 132U, and the thickness of the upper insulating layer 132U may be greater than the thickness of the interlayer insulating layer 132L. However, the configuration, shape, and structure of the cell insulating layer 132 are not limited thereto, and may be variously changed.

The gate electrode 130 may include various conductive materials. For example, the gate electrode 130 may include a metal material such as tungsten ((W), copper (Cu), or aluminum (Al).

In some example embodiments, the gate electrode 130 may include polycrystalline silicon, a metal nitride (e.g., titanium nitride (TiN), tantalum nitride (TaN), or the like), or a combination thereof. Although not illustrated, outside the gate electrode 130, an insulating film made of an insulating material may be positioned, or a portion of the gate dielectric layer 150 may be positioned.

The cell insulating layer 132 may include various insulating materials. For example, the cell insulating layer 132 may include a silicon oxide, a silicon nitride, a silicon oxynitride, a low dielectric constant material having a lower dielectric constant than the silicon oxide, or a combination thereof.

In an example embodiment, the channel structure CH extending in a direction crossing the second substrate 110 (for example, a Z direction perpendicular to the second substrate 110) may be formed through the gate stacking structure 120.

Specifically the channel structure CH may include a channel layer 140 and a gate dielectric layer 150 disposed on the channel layer 140 between the gate electrode 130 and the channel layer 140.

The channel structure CH may further include a core insulating layer 142 disposed inside the channel layer 140, and a channel pad 144 positioned on the channel layer 140 and/or the gate dielectric layer 150.

Each channel structure CH forms one memory cell string, and a plurality of channel structures CH may be spaced apart from each other while forming rows and columns in a plan view. For example, the channel structures CH may be arranged in various forms such as a lattice form or a zigzag form in a plan view.

The channel structures CH may each have a columnar shape in cross-sectional view. For example, when the channel structure CH is viewed in a cross-sectional view, it may have an inclined side surface such that its width narrows as it approaches the second substrate 110 according to an aspect ratio. A cross-sectional shape of the channel structure CH is not limited thereto, and a disposition, structure, and shape of the channel structure CH may be variously changed.

The core insulating layer 142 may be provided in a central portion of the channel structure CH, and the channel layer 140 may be formed while surrounding sidewalls of the core insulating layer 142. For example, the core insulating layer 142 may have a column shape such as a cylinder shape or a polygonal column shape, and the channel layer 140 may have a planar shape such column annular shape. However, the present disclosure is not limited thereto, and the core insulating layer 142 may not be provided and the channel layer 140 may have a columnar shape (e.g., a cylindrical shape or a polygonal columnar shape).

The channel layer 140 may include a semiconductor material, e.g., polycrystalline silicon. The core insulating layer 142 may include various insulating materials. For example, the core insulating layer 142 may include a silicon oxide, a silicon nitride, a silicon oxynitride, or a combination thereof. However, materials of the channel layer 140 and the core insulating layer 142 are not limited thereto, and may be variously changed.

The gate dielectric layer 150 positioned between the gate electrode 130 and the channel layer 140 may include a tunneling layer 152, a charge storage layer 154, and a blocking layer 156 sequentially stacked on the channel layer 140.

Herein, the tunneling layer 152 is a layer through which charges are tunneled according to a voltage applied to the gate electrode 130, and may include an insulating material capable of tunneling charges. The tunneling layer 152 may include a material such as a silicon oxide or a silicon nitride.

For example, the tunneling layer 152 may be formed by stacking a layer including a silicon oxide and a layer including a silicon nitride.

The charge storage layer 154 disposed between the tunneling layer 152 and the blocking layer 156 may be used as a data storage region. For example, the charge storage layer 154 may include a silicon nitride capable of trapping charges. If the charge storage layer 154 is made of a silicon nitride, it may have relatively excellent retention, and may be advantageous for integration, compared to the case made of polysilicon. However, a material of the charge storage layer 154 is not limited thereto, and may be variously changed.

The blocking layer 156 may be disposed between the charge storage layer 154 and the gate electrode 130. The blocking layer 156 may include an insulating material capable of preventing an undesirable flow of charges into the gate electrode 130. For example, the blocking layer 156 may include a silicon oxide, a silicon nitride, a silicon oxynitride, a high dielectric constant material, or a combination thereof.

Herein, the high dielectric constant material indicates a dielectric material having a higher dielectric constant than that of the silicon oxide. For example, the high dielectric constant material may include, e.g., an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), a praseodymium oxide ($Pr_2O_3$), or a combination thereof.

A channel pad 144 may be disposed on the channel layer 140 and/or the gate dielectric layer 150. The channel pad 144 may be positioned to cover an upper surface of the core insulating layer 142 and to be electrically connected to the channel layer 140. Although the channel pad 144 is illustrated to cover an upper surface of the gate dielectric layer 150, the present disclosure is not limited thereto. For example, the channel pad 144 may not cover the upper surface of the gate dielectric layer 150. That is, a side surface of the channel pad 144 may be surrounded by the gate dielectric layer 150.

The side surface of the channel pad 144 may contact the tunneling layer 152. The channel pad 144 may include a conductive material, e.g., polysilicon doped with impurities. However, a material of the channel pad 144 is not limited thereto, and may be variously changed.

Although not illustrated in FIG. 2, if the gate stack structure 120 includes a plurality of stacked gate stack structures, the channel structure CH may include a plurality of channel structures extending through the respective gate stack structures. For example, if a plurality of gate stack structures 120 include a first gate stack structure and a second gate stack structure, a plurality of channel structures CH may include a first channel structure extending through the first gate stack structure and a second channel structure extending through the second gate stack structure.

The first channel structure and the second channel structure may have forms connected to each other. Each of the first channel structure and the second channel structure may have an inclined side surface such that a width thereof becomes narrower closer to the second substrate 110 according to an aspect ratio in a cross-sectional view. As such, if the gate stack structure 120 is formed to include a plurality of stacked gate stack structures, a bent portion may be provided due to a difference in width at a portion where the first channel structure and the second channel structure are connected. However, shapes of the first channel structure and the second channel structure are not limited thereto, and may be variously changed. For example, the first channel structure and the second channel structure may have inclined side surfaces continuously connected without bending.

In an example embodiment, the semiconductor device 10 may include a separation structure WLC. The separation structure WLC may extend in the second direction Y in a plan view, and may be spaced apart from each other in the first direction X crossing the second direction Y. That is, the separation structure WLC may extend in the second direction Y in a plan view, and may be spaced apart from each other in the first direction X to be positioned at edges of the cell array region 102 and the connecting region 104.

The gate stack structures 120 partitioned by the separation WLC may constitute one memory cell block. However, a range of the memory cell block is not limited thereto, and may be variously changed.

The separation structure WLC may have a line shape extending in the second direction Y in a plan view. A side surface of the separation structure WLC may have an embossing shape including a convex portion and a concave portion in a plan view. However, a disposition and shape of the separation structure WLC is not limited thereto, and may be variously changed. For example, the separation structure WLC may have a side surface with a line shape including a straight line, and may be further positioned not only at an edge of an extension region 146 but also in other regions. For example, although not illustrated in FIG. 1, the separation structure WLC extends in the first direction X, it may be further positioned at a first edge of the cell array region 102 in the second direction Y and a second edge of the connecting region 104 in the second direction Y, respectively, and may be connected to the separation structure WLC extending in the second direction Y. That is, the separation structure WLC may extend in the first direction X and the second direction Y, may be positioned a edges of the cell array area 102 and the connecting area 104, and may surround elements positioned in the cell array region 102 and connecting region 104. However, a disposition and shape of the separation structure WLC is not limited thereto, and may be variously changed.

The separation structure 146 may extend to the second substrate 110 through the gate electrode 130 and the cell insulating layer 132 in a cross-sectional view. As an example, the separating structure WLC may have an inclined side surface of which width decreases toward the second substrate 110 when viewed in a cross-sectional view due to a high aspect ratio. However, a cross-sectional shape of the separation structure WLC is not limited thereto, and a side surface of the separation structure WLC may be perpendicular to the second substrate 110.

In addition, although not illustrated in FIG. 2, if the gate stack structure 120 includes a plurality of stacked gate stack structures, in a cross-sectional view, the separation structure WLC may have continuously inclined side surfaces in the first gate stack structure and the second gate stack structure, and may not include a bent portion. In addition, in some example embodiments, in a cross-sectional view, the separation structure WLC may include a bent portion at a boundary between the first gate stack structure and the second gate stack structure.

The separating structure WLC may be filled with a variety of insulating materials. For example, the separating structure WLC may include an insulating material such as a silicon oxide, a silicon nitride, or a silicon oxynitride. However, a material included in the structure WLC is not limited thereto, and may be variously changed.

Although not illustrated in FIG. 2, the semiconductor device 10 according to an example embodiment may further include an upper separation pattern (not illustrated) positioned between the channel structures CH. That is, the upper separation pattern may be positioned by extending through one or plurality of gate electrodes 130 including the upper gate electrode 130U positioned between the separating structures WLC. The upper separation pattern may separate, e.g., three gate electrodes 130 from each other in a crossing direction (X-axis direction). However, a number of gate electrodes 130 separated by the upper separation pattern is not limited thereto, and may be variously changed.

The upper separation pattern may have a form filled with an insulating material, and may be referred to herein as an insulating pattern. For example, the upper separation pattern, e.g. the insulating pattern, may include an insulating material such as a silicon oxide, a silicon nitride, or a silicon oxynitride. However, the present disclosure is not limited thereto, and a structure, shape, and material of the upper separation pattern may be variously modified.

The connecting region 104 and the second wire portion 180 may be provided to connect the gate stack structure 120 and the channel structure CH provided in the cell array region 102 to the circuit region 200 or an external circuit.

Herein, the second wire portion 180 may include all members electrically connecting the gate electrode 130, the channel structure CH, the horizontal conductive layers 112 and 114, and/or the second substrate 110 to the circuit region 200 or an external circuit. For example, the second wire portion 180 may include a bit line 182, a contact electrode 186, and a contact via 180a connected to each of them.

The bit line 182 may be positioned on the cell insulating layer 132 of the gate stack structure 120 formed in the cell array region 102. The bit line 182 may extend in the cross direction (X-axis direction in the drawing) crossing one direction in which the gate electrode 130 extends. The bit line 182 may be electrically connected to the channel structure CH, e.g., the channel pad 144 through the contact via 180a.

The connecting region 104 may be positioned around the cell array region 102. members for connection with the gate electrode 130, the horizontal conductive layers 112 and 114, and/or the second substrate 110, and the circuit region 200 may be positioned in the connecting region 104. In addition, the connecting region 104 may include a portion where an input/output pad and an input/output connecting wire are formed.

The connecting region 104 may include a pad contact region PCA positioned in a center of the connecting region 104 and dummy regions DMR1 and DMR2 positioned at opposite sides of the pad contact region PCA. That is, the first dummy region DMR1 may be positioned between the pad contact region PCA and the separation structure WLC positioned at a first edge of the connecting region 104, and the second dummy region DMR2 may be positioned between the pad contact region PCA and the separation structure WLC positioned at a second edge of the connecting region 104.

The gate stack structure 120 positioned in the first dummy region DMR1 and the second dummy region DMR2 may be disconnected by the main support structure 164 positioned in the pad contact region PCA.

The main support structure 164 extending in the first direction X and the second direction Y in a plan view from the pad contact region PCA, and a plurality of pad regions PA at least partially surrounded by the main support structure 164 may be positioned in the pad contact region PCA. In addition, the contact electrode 186 connected to the pad electrodes PD connected to the gate electrode 130 extending from the dummy regions DMR1 and DMR2 toward the pad contact region PCA may be positioned in each of the pad regions PA. A detailed description of the pad electrode PD and the contact electrode 186 will be described later.

A plurality of sub-support structures 162 may be positioned in the dummy regions DMR1 and DMR2.

Specifically, the main support structure 164 may include a first portion 164a extending in the second direction Y in the pad contact region PCA and a second portion 164b extending from the first portion 164a toward the first direction X intersecting the second direction Y. That is, the second portion 164b of the main supporting structure 164 may extend from the first portion 164a toward a first side and a second side of the first direction X in a plan view.

In an example embodiment, the main support structure 164 may have a line shape in a plan view, similar to the above-described separation structure WLC. That is, at least one of the first portion 164a or the second portion 164b of the main support structure 164 may have a line shape. In other words, the first portion 164a and the second portion 164b of the main support structure 164 may be integrally formed in a plan view, and the first portion 164a and the second portion 164b may have a shape integrally connected without being disconnected.

A side surface of the main support structure 164 may have an embossed shape including a convex portion and a concave portion in a plan view. Specifically, a side surface of the first portion 164a of the main support structure 164 may have an embossed shape in a plan view. A side surface of the second portion 164b of the main support structure 164 may have an embossed shape in a plan view.

In addition, an end portion of the second portion 164b of the main support structure 164 which is positioned at a first side and at a second side of the main support structure 164 in the first direction X and is aligned on substantially a same boundary as that of a side surface of the contact electrode 186 may have a straight line shape in a plan view. However, a shape of a side surface of the main supporting structure 164 in a plan view is not limited thereto, and may be variously changed. For example, the side surface of the main support structure 164 may have various shapes such as a flat straight line or a curved line in a plan view. For example, the end portion of the second portion 164b of the main support structure 164 which is positioned at a first side and at a second side of the main support structure 164 in the first direction X and is aligned on substantially a same boundary as that of a side surface of the contact electrode 186 may have an embossed shape similar to the side surface of the first portion 164a.

The semiconductor device 10 according to an example embodiment may include a plurality of sub-support structures 162 positioned in dummy regions DMR1 and DMR2. Unlike in the separation structure WLC and the main support structure 164 described above, the sub-support structures 162 may be arranged in an island shape in a plan view. That is, the sub-support structures 162 may be arranged spaced apart in the first direction X and spaced side by side along the second direction Y. In other words, since the sub-support structures 162 are spaced apart from each other, they may have an island shape in a plan view. Although a shape of the sub-support structures 162 is illustrated to have a circular shape in FIG. 1 in a plan view, the present disclosure is not limited thereto, and the shape of the sub-support structures 162 in a plan view may be variously changed. For example, the shape of the sub-support structures 162 may have a polygonal shape in a plan view.

In FIG. 1, although the sub-support structures 162 positioned in the dummy regions DMR1 and DMR2 are spaced apart in the first direction X and arranged along the second direction Y to form two rows, a number and disposition of the sub-support structures 162 are not limited thereto, and may be variously changed. For example, the sub-support structures 162 positioned in the dummy regions DMR1 and DMR2 may be omitted. As another example, the sub-support structure 162 may be further positioned in the pad contact region PCA in addition to the dummy regions DMR1 and DMR2. That is, the sub-support structures 162 may be positioned between the contact electrode 186 and the main support structure 164 in the pad contact region PCA.

In this case, in the pad contact region PCA, the sub-support structures 162 may be positioned at opposite sides of the first contact portion 186a of the contact electrode 186. In the pad contact region PCA, the sub-support structures 162 and the first contact portion 186a of the contact electrode 186 may be aligned along the second direction Y.

The sub-support structures 162 and the main support structure 164 may serve to reduce stress that may be applied to the gate stack structure 120 during a process step of etching the gate stack structure 120, and to maintain a shape thereof against an external force applied to the gate stack structure 120.

Each of the pad regions PA positioned in the pad contact region PCA may be surrounded by the second portion 164b of the main support structure 164 positioned apart from the first portion 164a of the main support structure 164 in the second direction Y in a plan view. That is, the pad regions PA may be spaced apart along the second direction Y with the second portion 164b of the main support structure 164 provided therebetween in a plan view, and may be positioned to face each other in the first direction X with the first portion 164a of the main support structure 164 provided therebetween.

For example, the pad regions PA may include: a first pad region PA1, a third pad region PA3, a fifth pad region PA5, a seventh pad region PA7, and a ninth pad region PA9 positioned at a first side of the main support structure 164 in the first direction X and sequentially positioned along a direction from far to near with respect to the cell array region 102; and a second pad region PA2, a fourth pad region PA4, a sixth pad region PA6, an eighth pad region PA8, and a tenth pad region PA10 positioned at a second side of the main support structure 164 in the first direction X and sequentially positioned along the direction from far to near with respect to the cell array region 102. That is, each of the first pad region PA1 and the second pad region PA2, the third pad region PA3 and the fourth pad region PA4, the fifth pad region PA5 and the sixth pad region PA6, the seventh pad region PA7 and the eighth pad region PA8, and the ninth pad region PA9 and the tenth pad region PA10 may face each other in the first direction X with the first portion 164a of the main support structure 164 interposed therebetween.

In FIG. 1, only 10 pad regions are illustrated for convenience, but this is merely an example, and a number of pad regions may vary according to a number of layers of the gate electrode 130 included in the gate stack structure 120.

In each of the pad regions PA, a pad electrode PD connected to the gate electrode 130 from the dummy regions DMR1 and DMR2 toward the pad region PA may be positioned. That is, the gate electrode 130 extending from the cell array region 102 to the connecting region 104 may extend from the dummy regions DMR1 and DMR2 toward the pad region PA, and the gate electrode 130 positioned in the pad region PA may be the pad electrode PD connected to the contact electrode 186. In other words, the pad electrode PD may be a portion of the gate electrode 130 positioned in the pad region PA.

A contact electrode 186 connected to the pad electrode PD may be positioned in each of the pad regions PA. The pad electrode PD and the contact electrode 186 positioned in each of the pad regions PA may be at least surrounded by the main support structure 164 in a plan view. That is, three of four edges of the contact electrode 186 may be surrounded by the second portions 164b and the first portion 164a of the main support structure 164 in a plan view. However, a disposition relationship between the contact electrode 186 and the main support structure 164 in a plan view is not limited thereto, and may be variously changed.

Figure 5A:
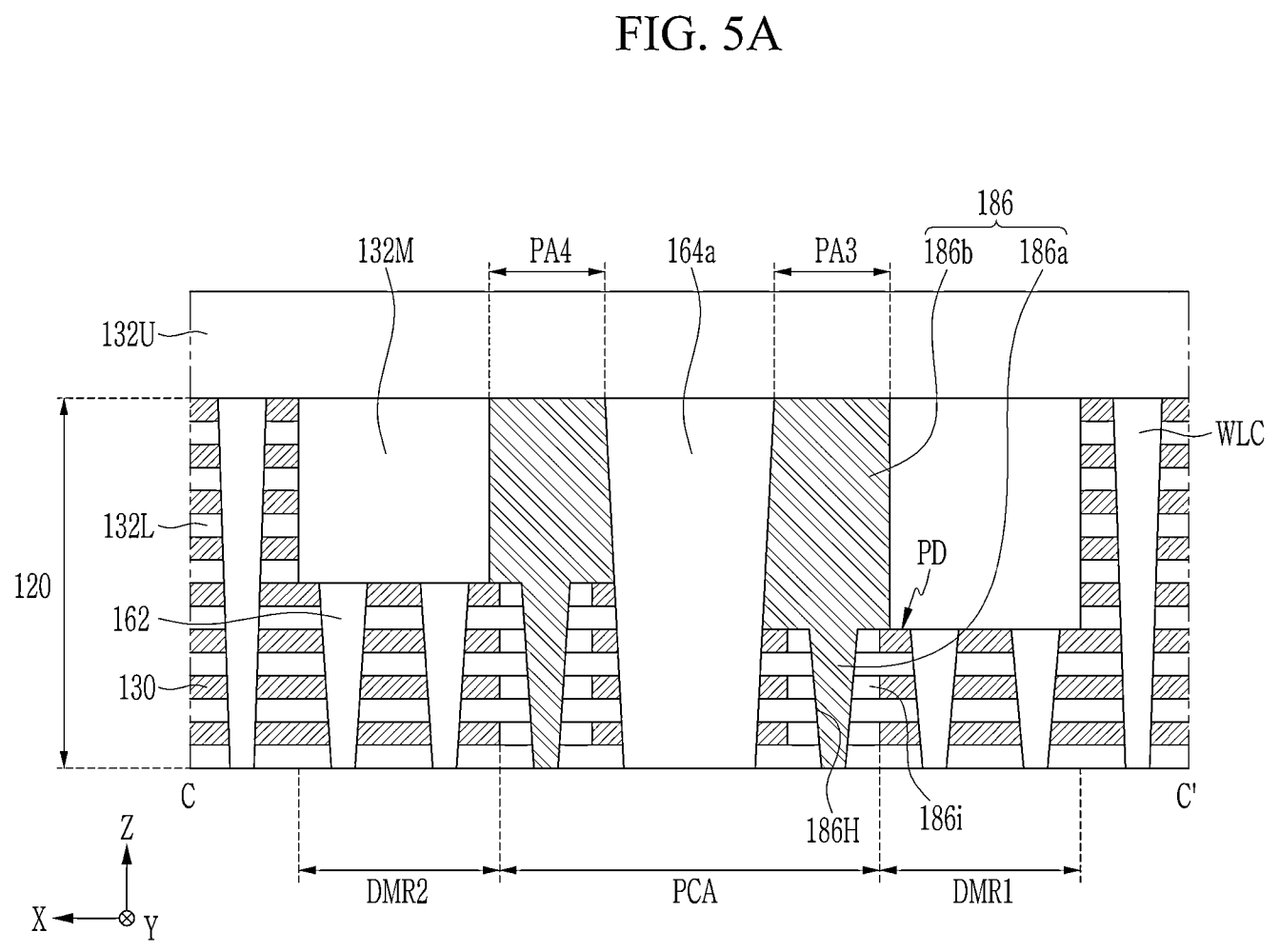

As illustrated in FIG. 5A, the contact electrode 186 according to an example embodiment may include a first contact portion 186a extending through the gate stack structure 120 positioned in the pad contact region PCA, and a second contact portion 186b positioned on the first contact portion 186a and connected to an upper surface of the pad electrode PD.

The contact electrode 186 has a plate-like shape in a plan view, and may be arranged in an island shape by being spaced apart along the first direction X and the second direction Y with the main support structure 164 provided therebetween. A side surface of the contact electrode 186 may directly contact a side surface of the main support structure 164.

In some example embodiments, another insulating layer may be further positioned between the contact electrode 186 and the main support structure 164. For example, in a process step of removing a sacrificial insulating layer 130P (see FIG. 22) and the interlayer insulating layer 132L before forming the contact electrode 186, as a portion of the sacrificial insulating layer 130P and a portion of the interlayer insulating layer 132L remain, the sacrificial insulating layer 130P and the interlayer insulating layer 132L may be disposed between the contact electrode 186 and the main support structure 164.

In a process step of forming a contact electrode hole 186H according to some example embodiments, as a portion of an insulation pattern 186i is etched together, a shape of a contact electrode 186H may change. Accordingly, a shape of the contact electrode 186 positioned within the contact electrode hole 186H may vary.

Figure 5B:
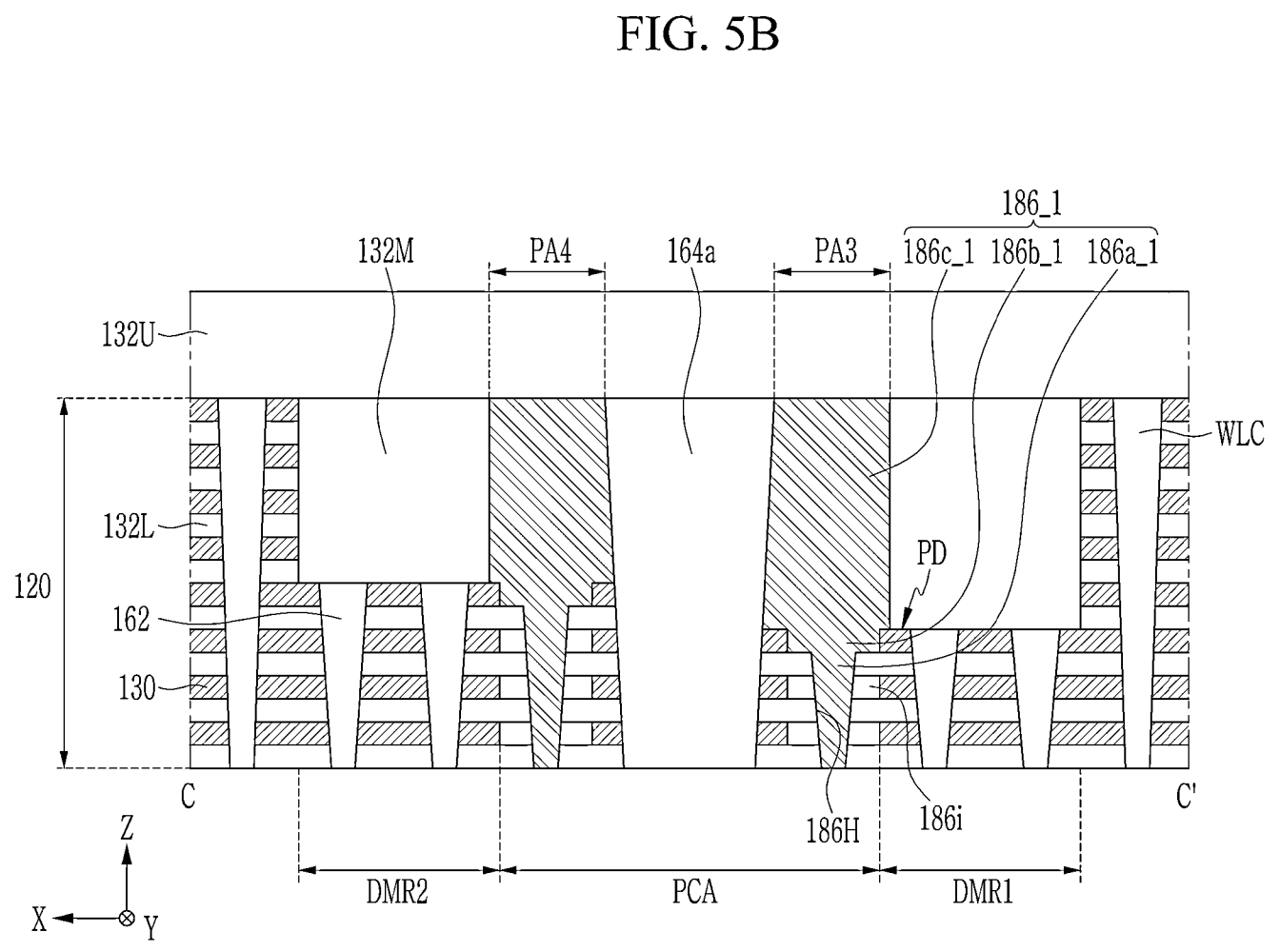

For example, as illustrated in FIG. 5B, a contact electrode 186_1 according to some example embodiments may include a first contact portion 186a_1 extending through the gate stack structure 120 positioned in the pad contact region PCA, a second contact portion 186b_1 positioned on the first contact portion 186a_1 and connected to a side surface of the pad electrode PD, and a third contact portion 186c_1 positioned on the second contact portion 186b_1 and connected to an upper surface of the pad electrode PD.

In addition, a width of the first contact portion 186a_1 in the first direction X, a width of the second contact portion 186b_1, and a third contact portion 186c_1 may be different. That is, the width of the first contact portion 186a_1 along the first direction X may be the smallest, and the width of the third contact portion 186c_1 along the first direction X may be the largest.

In some example embodiments, the contact electrodes 186_2, 186_3, and 186_4 may surround a filling insulating layer 186L positioned on the contact electrode hole 186H in the pad regions PA3 and PA4.

Figure 5C:
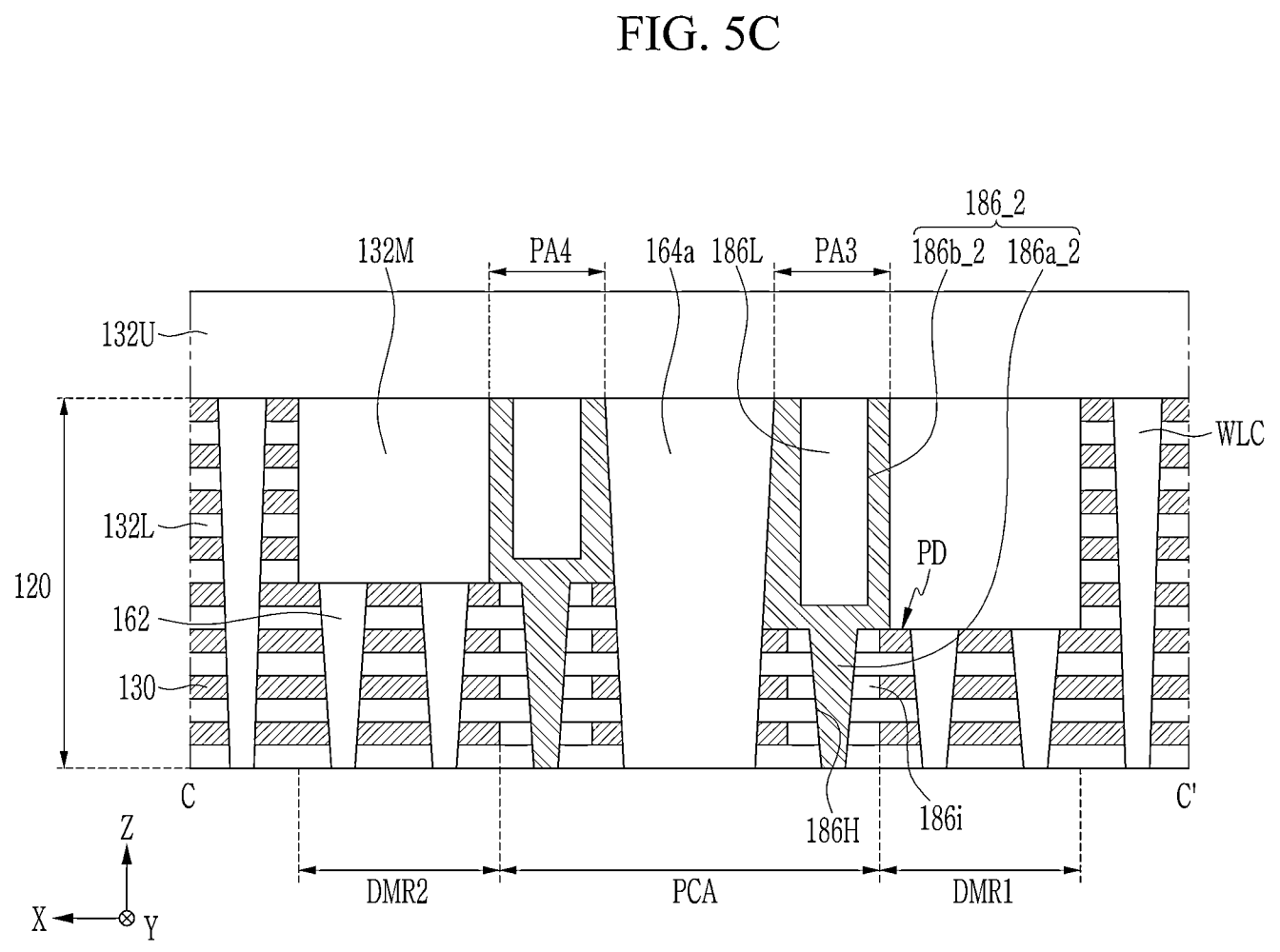

For example, as illustrated in FIG. 5C, the contact electrode 186_2 may include a first contact portion 186a_2 extending through the gate stack structure 120 positioned in the pad regions PA3 and PA4, and a second contact portion 186b_2 surrounding the filling insulating layer 186L positioned on the first contact portion 186a_2.

That is, the second contact portion 186b_2 is positioned on the first contact portion 186a_2, and may be connected to an upper surface of the pad electrode PD. The second contact portion 186b_2 may surround a lower surface and side surfaces of the filling insulating layer 186L.

The second contact portion 186b_2 may be conformally positioned along a side surface of the intermediate insulating layer 132M, a side surface of the first portion 164a of the main support structure 164, an upper surface of the pad electrode PD, and an upper surface of the insulation pattern 186i. Accordingly, a width of the second contact portion 186b_2 along the first direction X may be smaller than a width of the first contact portion 186a_2 along the first direction X.

An upper surface of the filling insulating layer 186L may be positioned at substantially a same level as an upper surface of the intermediate insulating layer 132M and an upper surface of the second contact portion 186b_2. In addition, an upper surface of the filling insulating layer 186L may directly contact the upper insulating layer 132U.

Figure 5D:
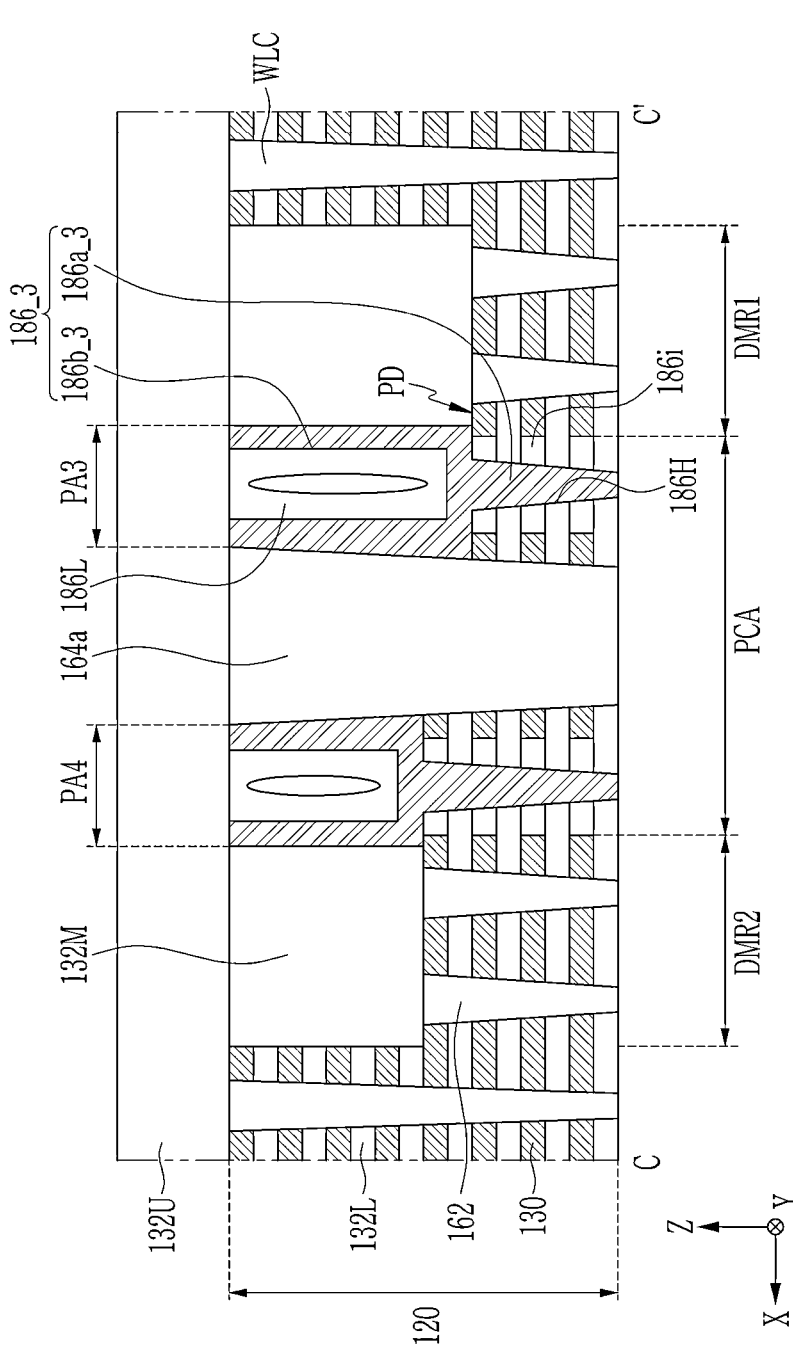

In some example embodiments, as illustrated in FIG. 5D, the filling insulating layer 186L having the lower surface and the side surfaces surrounded by a contact electrode 186_3 including a first contact portion 186a_3 and a second contact portion 186b_3 positioned on the first contact portion 186a_3 may include an air-gap.

The air-gap may be positioned approximately at a center of the filling insulating layer 186L, and the air-gap may be surrounded by the filling insulating layer 186L. The air-gap may be formed in a process step of forming the filling insulating layer 186L. In FIG. 5D, it has been illustrated that the air-gap is positioned approximately at the center of the filling insulating layer 186L and has an elliptical shape, but a position and shape of the air-gap are not limited thereto, and may be variously changed.

The filling insulating layer 186L may include an insulating material. For example, the filling insulating layer 1186L may include an insulating material such as a silicon oxide, a silicon nitride, or a silicon oxynitride. However, a material included in the filling insulating layer 186L is not limited thereto, and may be variously changed.

Figure 5E:
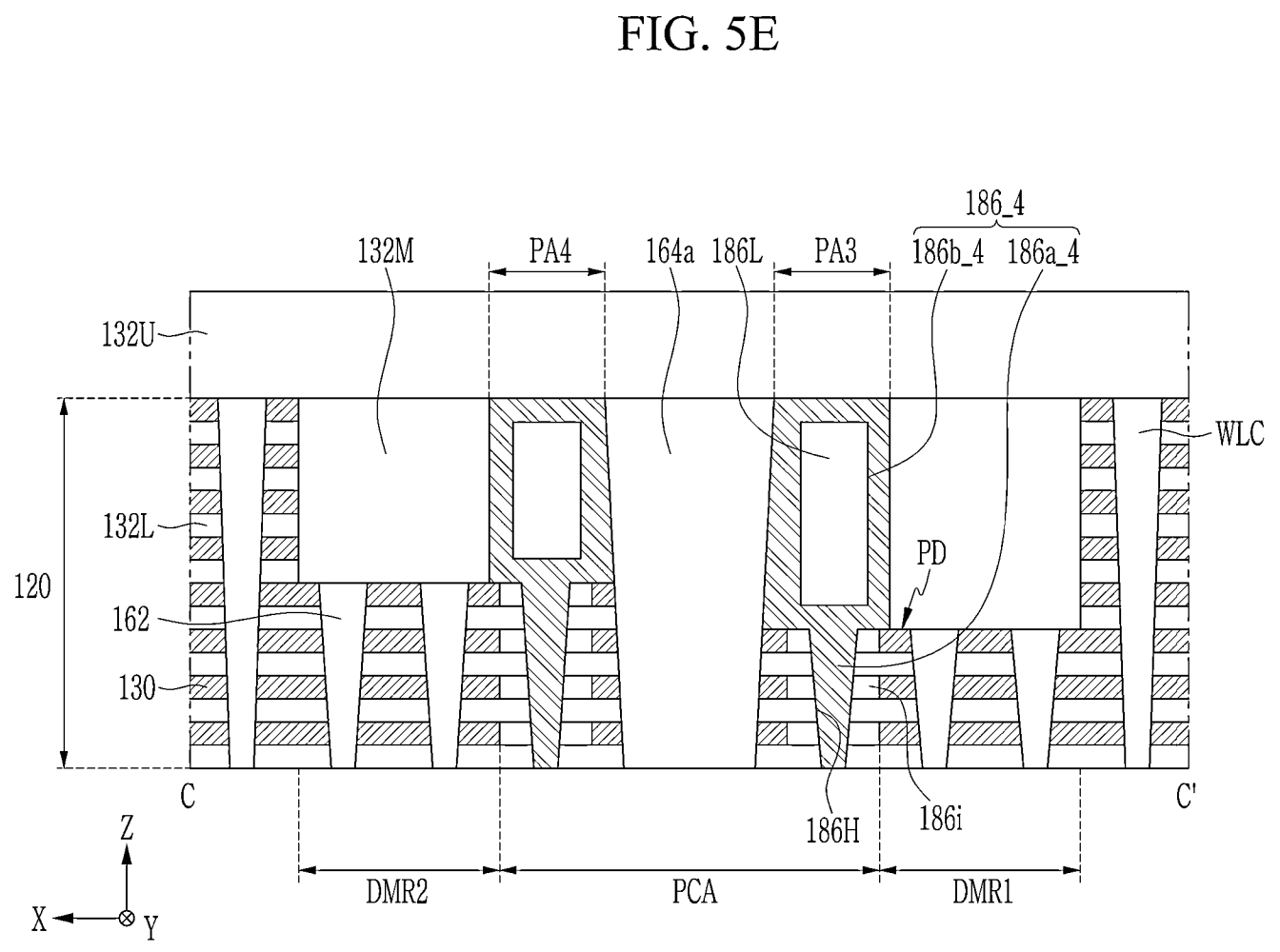

As another example, as illustrated in FIG. 5E, a contact electrode 186_4 may include a first contact portion 186a_4 extending through the gate stack structure 120 positioned in the pad regions PA3 and PA4, and a second contact portion 186b_4 surrounding the filling insulating layer 186L positioned on the first contact portion 186a_4.

Unlike in the example embodiment illustrated in FIG. 5C, in the present example embodiment, the second contact portion 186b_4 may cover the upper surface of the filling insulating layer 186L as well as the lower surface and the side surfaces of the filling insulating layer 186L. That is, the filling insulating layer 186L may be buried in the second contact portion 186b_4. Accordingly, the upper surface of the filling insulating layer 186L may directly contact the second contact portion 186b_4.

In addition, the upper surface of the filling insulating layer 186L may be positioned at a level lower than that of an upper surface of the intermediate insulating layer 132M and that of an upper surface of the second contact portion 186b_4.

The gate electrodes 130 may extend from the cell array region 102 to the dummy regions DMR1 and DMR2 of the connecting region 104 along the second direction Y. Extension lengths of the gate electrodes 130 along the second direction Y in the dummy regions DMR1 and DMR2 of the connecting region 104 may sequentially decrease as a distance from the second substrate 110 increases. That is, the gate electrodes 130 in the dummy regions DMR1 and DMR2 of the connecting region 104 may have a step shape in a cross-sectional view.

The gate electrodes 130 may extend from the dummy regions DMR1 and DMR2 to the pad region PA. Similar to the gate electrodes 130 positioned in the dummy regions DMR1 and DMR2, the gate electrodes 130 positioned in the pad contact region PCA may have a step shape in a cross-sectional view. However, unlike the gate electrodes 130 positioned in the pad contact region PCA, the gate electrodes 130 positioned in the dummy regions DMR1 and DMR2 may be disconnected by the main support structure 164 positioned at each end of the gate electrodes 130.

As such, as the gate electrodes 130 positioned in the dummy regions DMR1 and DMR2 and the pad region PA have a step shape in a cross-sectional view, each of the upper surfaces of the pad electrodes PD connected to the gate electrodes 130 extending from the dummy regions DMR1 and DMR2 to the pad region PA may contact the contact electrode 186 at different levels.

The gate electrode 130 positioned in the dummy regions DMR1 and DMR2 may be connected to the pad electrode PD positioned in the pad region PA of the pad contact region PCA. Herein, the gate electrodes 130 connected to the pad electrode PD may be positioned at substantially a same level, and may be integrally formed.

For example, as illustrated in FIGS. 1 and 2, pad electrodes PD respectively positioned in the second pad region PA2, the fourth pad region PA4, the sixth pad region PA6, the eighth pad region PA8, and the tenth pad region PA10 may be positioned at a higher level as it approaches the cell array region 102.

Accordingly, the pad electrode PD positioned in the second pad region PA2 may be positioned at a lowest level, and the pad electrode PD positioned in the tenth pad region PA10 may be positioned at a highest level.

Although not illustrated in FIG. 2, pad electrodes PD respectively positioned in the first pad region PA1, the third pad region PA3, the fifth pad region PA5, the seventh pad region PA7, and the ninth pad region PA9 may be positioned at a higher level in a direction closer to the cell array region 102.

The gate electrodes 130 positioned in the first dummy region DMR1 and having a step shape in a cross-sectional view may have a different height from the gate electrodes 130 positioned in the second dummy region DMR2 and having a step shape in a cross-sectional view.

Accordingly, the pad electrodes PD positioned in the pad region PA may be positioned at different heights. That is, the pad electrodes PD positioned in the pad region PA spaced apart from each other with the first portion 164a of the main support structure 164 provided therebetween and facing each other may be positioned at different heights. In other words, the pad electrodes PD connected to the gate electrodes 130 extending from the second dummy region DMR2 may be positioned at a higher level than that of the pad electrodes PD connected to the gate electrodes 130 extending from the first dummy region DMR1.

For example, as illustrated in FIG. 5A, the pad electrode PD positioned in the third pad region PA3 spaced apart from each other in the first direction X with the first portion 164a of the main support structure 164 provided therebetween may be positioned at a level that is lower than that of the pad electrode PD positioned in the fourth pad region PA4. Although not illustrated in FIG. 5A, the pad electrodes PD respectively positioned in the first pad region PA1, the fifth pad region PA5, the seventh pad region PA7, and the ninth pad region PA9 may be positioned at a level that is lower than that of the pad electrodes PD respectively positioned in the second pad region PA2, the sixth pad region PA6, the eighth pad region PA8, and the tenth pad region PA10.

Shapes of the gate electrodes 130 positioned in the above-described dummy regions DMR1 and DMR2 and the pad contact region PCA and shapes for positioning the pad electrodes PD at different levels in each pad region PA are examples, and are not limited thereto, and may be variously changed. For example, some of the gate electrodes 130 positioned in the pad contact region PCA and the dummy regions DMR1 and DMR2 have a step shape that goes downward as a distance from the cell array region 102 increases, and if the rest has a step shape that goes up as the distance from the cell array region 102 increases, a level at which the pad electrodes PD are positioned may be variously changed.

As other examples, although the gate stack structure 120 is illustrated as including one gate stack structure 120 in FIG. 2, if the gate stack structure 120 is formed to include one or more gate stack structures 120, or some of the gate electrodes 130 formed to include one or more gate stack structures 120 and positioned in the pad contact region PCA and the dummy regions DMR1 and DMR2 has a step shape that goes down as it moves away from the cell array region 102, and the rest has a step shape that goes up as the distance from the cell array region 102 increases, a level at which the pad electrodes PD are positioned may be variously changed.

Referring to FIG. 2 and FIG. 5A, the contact electrode 186 may be connected to the pad electrode PD connected to the gate electrode 130, and may extend through the gate stack structure 120 and extend to a pad portion positioned in the circuit region 200 to be electrically connected to the circuit region 200.

The contact electrode 186 may include a first contact portion 186a extending through the gate stack structure 120, and a second contact portion 186b positioned on the first contact portion 186a and connected to an upper surface of the pad electrode PD. The second contact portion 186b of the contact electrode 186 may be formed in a region where a stack structure described later is removed.

The first contact portion 186a of the contact electrode 186 may extend through the gate stack structure 120, and be connected to the pad portion positioned in the circuit region 200. The second contact portion 186b of the contact electrode 186 is electrically connected to upper surfaces of the pad electrodes PD positioned in each pad region PA, and the second contact portion 186b of the contact electrode 186 may be electrically connected to the pad portion of the circuit region 200 by the first contact portion 186a.

The second contact portion 186b of the contact electrode 186 may be electrically connected to the pad electrode PD connected to the gate electrode 130 positioned on an uppermost portion of each layer among the gate electrodes 130 having a step shape in a cross-sectional view in the dummy regions DMR1 and DMR2. The first contact portion 186a of the contact electrode 186 may be insulated from the gate electrodes 130 positioned under the pad electrode PD with the insulation pattern 186i provided therebetween.

That is, a side surface of the first contact portion 186a of the contact electrode 186 may directly contact the insulation pattern 186i, and a side surface of the second contact portion 186b may directly contact the main support structure 164 and the intermediate insulating layer 132M. However, the present disclosure is not limited thereto, another layer may be further positioned between the first contact portion 186a of the contact electrode 186 and the insulation pattern 186i and between the second contact portion 186b of the contact electrode 186 and the main support structure 164 and the intermediate insulating layer 132M.

In an example embodiment, the insulation pattern 186i may include a same material as that of the cell insulating layer 132 described above. However, a material included in the insulation pattern 186i is not limited thereto, and may be variously changed.

A width of the first contact portion 186a of the contact electrode 186 may be smaller than that of the second contact portion 186b. The first contact portion 186a and the second contact portion 186b of the contact electrode 186 may be surrounded by the main support structure 164 in a plan view, and the second contact portion 186b of the contact electrode 186 may entirely cover the first contact portion 186a in a plan view.

Each first contact portions 186a of contact electrodes 186 may have an inclined side surface such that a width thereof becomes narrower closer to the second substrate 110 according to an aspect ratio in a cross-sectional view. In addition, a length of the first contact portion 186a of each of the contact electrodes 186 along the third direction Z may decrease as the distance from the cell array region 102 increases.

Each second contact portions 186b of contact electrodes 186 may have an inclined side surface such that a width thereof becomes wider closer to the second substrate 110 according to an aspect ratio in a cross-sectional view. In addition, a length of the second contact portion 186b of each of the contact electrodes 186 along the third direction Z may increase as the distance from the cell array region 102 increases.

For example, a length of the first contact portion 186a of the contact electrode 186 positioned in the second pad region PA2 along the third direction Z may be the shortest, and a length of the first contact portion 186a of the contact electrode 186 positioned in the tenth pad region PA10 along the third direction Z may be the longest. In addition, a length of the second contact portion 186b of the contact electrode 186 positioned in the second pad region PA2 along the third direction Z is the longest, and a length of the second contact portion 186b of the contact electrode 186 positioned in the tenth pad region PA10 along the third direction Z may be the shortest.

In addition, as the pad electrodes PD respectively positioned in the pad regions PA spaced apart from each other in the first direction X are positioned at different heights with the first portion 164a of the main support structure 164 therebetween, lengths of the first contact portion 186a and the second contact portion 186b of the contact electrodes 186 respectively positioned in the pad areas PA spaced apart from each other in the first direction X and facing each other along with the first portion 164a of the main support structure 164 therebetween may be different.

For example, as illustrated in FIG. 5A, a length of the first contact portion 186a of the contact electrode 186 positioned in the fourth pad region PA4 along the third direction Z may be long along the third direction Z of the first contact portion 186*a* of the contact electrode 186 positioned in the third pad region PA3, and a length of the second contact portion 186*b* of the contact electrode 186 positioned in the fourth pad region PA4 along the third direction Z may be shorter than a length of the second contact portion 186*b* of the contact electrode 186 positioned in the third pad region PA3 along the third direction Z.

As such, a difference between the length of the first contact portion 186*a* and the length of the second contact portion 186*b* along the third direction Z of each of the plurality of contact electrodes 186 is due to a difference in height at which the pad electrodes PD electrically connected to the respective contact electrodes 186 are positioned. However, a shape and structure of the contact electrode 186 is not limited thereto, and the shape and structure of each of the contact electrodes 186 may be variously changed according to a connection form between the contact electrode 186 and the pad electrode PD. In addition, a cross-sectional shape of the contact electrode 186 is not limited thereto, and the side surface of the contact electrode 186 may be perpendicular to the second substrate 110.

The gate electrode 186 may include a conductive material. For example, the contact electrode 186 may include tungsten (W), copper (Cu), aluminum (Al), or the like, and may further include a diffusion barrier layer. However, a material included in the contact electrode 186 is not limited, and may be variously changed. In addition, the first contact portion 186*a* and the second contact portion 186*b* of the contact electrode 186 may include different materials.

The first portion 164*a* and the second portion 164*b* of the main support structure 164 may extend through the gate stack structure 120 and the horizontal insulating layer 116, and a lower region of the main support structure 164 may be positioned at a level between upper and lower surfaces of the second substrate 110. However, the present disclosure is not limited thereto, and in some example embodiments, the lower region of the main support structure 164 may further extend in the third direction Z to extend through the second substrate 110.

The main support structure 164 may have an inclined side surface such that a width thereof becomes narrower closer to the second substrate 110 according to an aspect ratio in a cross-sectional view. In addition, a cross-sectional shape of the main support structure 164 is not limited thereto, and the side surface of the main support structure 164 may be perpendicular to the second substrate 110.

The sub-support structure 162 may extend through the gate stack structure 120, and may be positioned in the dummy regions DMR1 and DMR2. The sub-support structure 162 may have an inclined side surface such that a width thereof becomes narrower closer to the second substrate 110 according to an aspect ratio in a cross-sectional view. However, a cross-sectional shape of the sub-support structure 162 is not limited thereto, and the side surface of the sub-support structure 162 may be perpendicular to the second substrate 110.

As the gate stack structure 120 of the dummy regions DMR1 and DMR2 where the sub-support structure 162 is positioned and the pad contact region PCA where the contact electrode 186 is positioned has a step shape in a cross-sectional view, a thickness of the gate stack structure 120 where the first contact portion 186*a* of the contact electrode 186 is positioned in the dummy regions DMR1 and DMR2 where the sub support structure 162 is located and the pad contact region PCA may be thinner than a stack thickness of the gate stack structure 120 where the separation structure WLC is positioned. In addition, the thickness of the gate stack structure 120 where the sub-support structure 162 is positioned may be substantially the same as the thickness of the gate stack structure 120 where the first contact portion 186*a* of the contact electrode 186 Is positioned.

Accordingly, the upper surface of the sub-support structure 162 and the upper surface of the first contact part 186*a* of the contact electrode 186 may be at substantially a same level, and the upper surface of the sub support structure 162 and the upper surface of the first contact portion 186*a* of the contact electrode 186 may be positioned at a level that is lower than those of the upper surface of the separation structure WLC and the upper surface of the main support structure 164.

As described above, step shapes of the gate stack structure 120 positioned in the first dummy region DMR1 and the second dummy region DMR2 have a height difference, and thus the upper surface of the sub-support structure 162 positioned in the first dummy area DMR1 and the upper surface of the sub-support structure 162 positioned in the second dummy area DMR2 may be positioned at different levels. In addition, the upper surface of the sub-support structure 162 positioned in the second dummy region DMR1 may be positioned at substantially a same level as that of the upper surface of the first contact portion 186*a* of the contact electrode 186 positioned in the pad region PA adjacent to the second dummy area DMR2, and thus the upper surface of the sub-support structure 162 positioned in the second dummy region DMR2 may be positioned at a different level from that of the upper surface of the first contact portion 186*a* of the contact electrode 186 positioned in the pad region PA adjacent to the first dummy area DMR1.

For example, as illustrated in FIG. 5A, the upper surface of the sub-support structure 162 positioned in the second dummy region DMR2 and the upper surface of the first contact part 186*a* of the contact electrode 186 positioned in the fourth pad region PA4 may be at a level that is higher than those of the upper surface of the sub-support structure 162 positioned in the first dummy area DMR1 and the upper surface of the first contact portion 186*a* of the contact electrode 186 positioned in the third pad region PA3.

As another example, as illustrated in FIG. 5B, the upper surface of the sub-support structure 162 positioned in the second dummy region DMR2 may be positioned at a level higher than that of the upper surface of the first contact portion 186*a*_1 of the contact electrode 186_1 located in the fourth pad area PA4, and may be positioned at substantially a same level as that of the upper surface of the second contact portion 186*b*_1 of the contact electrode 186_1 positioned in the fourth pad region PA4.

As illustrated in FIG. 4 and FIG. 5A, the isolation structure WLC positioned in the connecting region 104 may be surrounded by the gate stack structure 120 in a plan view. For example, an upper surface of the separation structure WLC positioned in the connecting region 104 may be surrounded by the gate electrode 130 in a plan view, and the separation structure WLC may be spaced apart from the intermediate insulating layer 132M positioned in the dummy regions DMR1 and DMR2 to be described later with the gate electrode 130 provided therebetween. In addition, a side surface of the separation structure WLC positioned in the connecting region 104 may be surrounded by the gate stack structure 120 in a cross-sectional view.

The upper surface of the separation structure WLC and the upper surface of the main support structure 164 may be positioned at substantially a same level. In addition, the upper surface of the second contact portion 186*b* of the contact electrode 186 positioned in the pad area PA may be positioned substantially at a same level with those of the upper surface of the separation structure WLC and the upper surface of the main support structure 164, and a lower surface of the second contact portion 186b of the contact electrode 186 may be positioned at substantially a same level as that of the upper surface of the sub-support structure 162 positioned in the dummy regions DMR1 and DMR2 adjacent to each other.

For example, as illustrated in FIG. 5A, the lower surface of the second contact portion 186b of the contact electrode 186 positioned in the fourth pad region PA4 may be positioned at substantially a same level as that of the upper surface of the sub-support structure 162 positioned in the second dummy region DMR2, and the lower surface of the second contact portion 186b of the contact electrode 186 positioned in the third pad region PA3 may be positioned at substantially a same level as that of the upper surface of the sub-support structure 162 positioned in the first dummy region DMR1. However, a disposition relationship between the sub-support structure 162, the main support structure 164, the contact electrode 186, and the separation structure WLC is not limited thereto, and may be variously changed.

As illustrated in FIG. 2 and FIG. 5A, a width of the first portion 164a of the main support structure 164 in the first direction X may be greater than a width of the separation structure WLC in the first direction X.

A width of the second portion 164b of the main support structure 164 along the first direction X may be greater than the width of the first contact portion 186a of the contact electrode 186 along the first direction X, or may be smaller than the width of the second contact portion 186b of the contact electrode 186 along the first direction X.

In addition, a width of the main support structure 164 along the first direction X may be greater than a width of the separation structure WLC along the first direction X. In addition, widths of the main support structure 164 along the first direction X and the second direction Y may be greater than widths of the sub-support structure 162 along the first direction X and the second direction Y.

The width of the separation structure WLC along the first direction X may be greater than the width of the sub-support structure 162 along the first direction X. In addition, the width of the separation structure WLC along the first direction X may be greater than the width of the first contact portion 186a of the contact electrode 186 along the first direction X.

The width of the sub-support structure 162 along the first direction X may be substantially a same as the width of the first contact portion 186a of the contact electrode 186 along the first direction X. However, a width relationship between the sub-support structure 162, the main support structure 164, the contact electrode 186, and the separation structure WLC is not limited thereto, and may be variously changed. For example, a width of the first portion 164a of the main supporting structure 164 along the first direction X and a width of the second portion 164b along the second direction Y may be substantially the same as the width of the sub support structure 162.

The intermediate insulating layer 132M may be disposed on the sub-support structure 162 and the gate stack structure 120 in the dummy regions DMR1 and DMR2. The intermediate insulating layer 132M may be formed for the purpose of planarizing a step due to the step shape of the gate electrode structure 120 positioned in the dummy regions DMR1 and DMR2. Accordingly, the upper surface of the intermediate insulating layer 132M may be positioned at substantially a same level as those of the separation structure WLC, the upper surface of the second contact portion 186b of the contact electrode 186, and the upper surface of the main support structure 164.

As illustrated in FIG. 5A, the upper insulating layer 132U may cover the separation structure WLC, the intermediate insulating layer 132M, the upper surface of the second contact portion 186b of the contact electrode 186, the upper surface of the main support structure 164, and the gate stack structure 120.

The sub-support structure 162 and the main support structure 164 may have a form filled with an insulating material. For example, the upper separation pattern may include an insulating material such as a silicon oxide, a silicon nitride, or a silicon oxynitride. However, the present disclosure is not limited thereto, and structures, shapes, and materials of the sub-support structure 162 and the main support structure 164 may be variously changed.

In accordance with the semiconductor device 10 according to an example embodiment, if an etching process is performed in a process step of forming the plurality of contact electrodes 186 in the pad contact region PCA, each region of the stack structure for forming the contact electrodes 186 may include substantially same layers, and may have a same stacked thickness.

As such, as the etching process is performed in substantially the same environment, each region of the stack structure in which the contact electrodes 186 are formed may prevent occurrence of defects due to differences in etching conditions that may occur in some regions of a stack structure according to differences in process conditions, such as a type of stacked layers or a thickness of stacked layers.

Accordingly, it is possible to improve reliability of the semiconductor device and also productivity of the semiconductor device by improving electrical characteristics of the contact electrode 186 connected to each of the pad electrodes PD provided in the pad region PA.

Hereinafter, other example embodiments of a semiconductor device will be described with reference to FIG. 6 to FIG. 9. In the following example embodiments, same reference numerals refer to components identical to those of the previously described example embodiments, and redundant descriptions will be omitted or simplified, and description will focus on differences.

Figure 6:
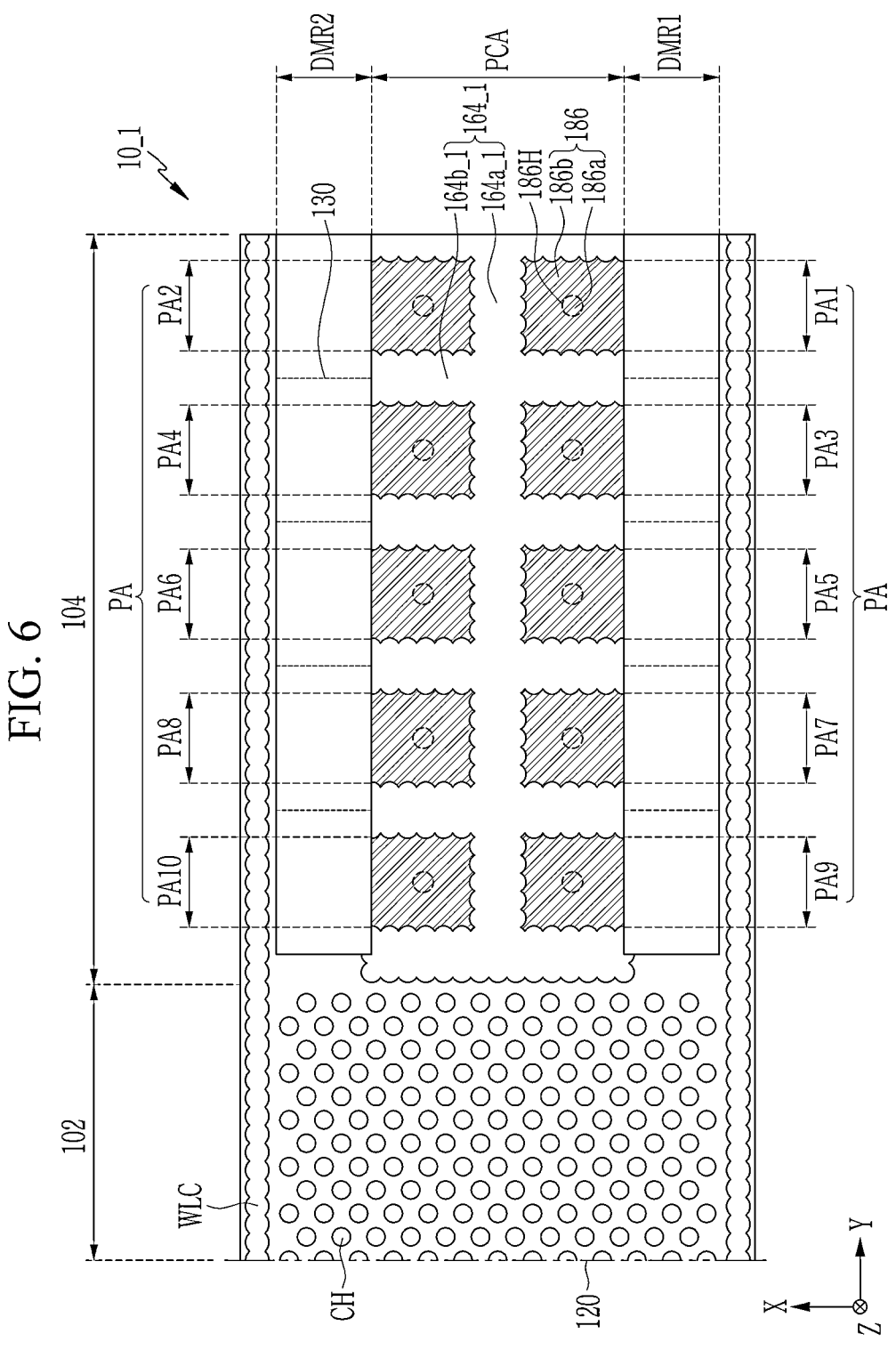
FIG. 6 to FIG. 8 illustrate partial top plan views showing semiconductor devices according to some example embodiments.
Figure 7:
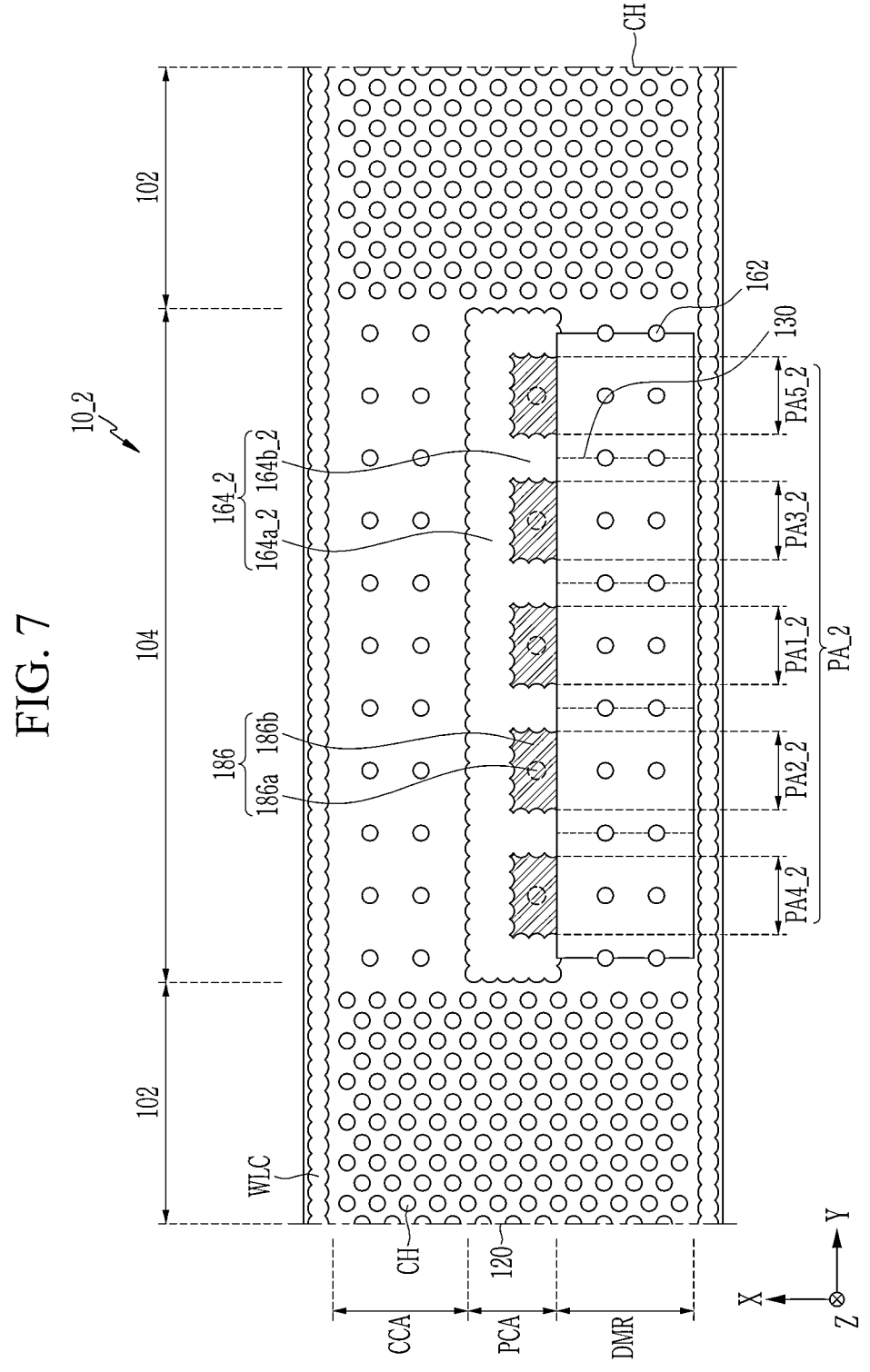
Figure 8:
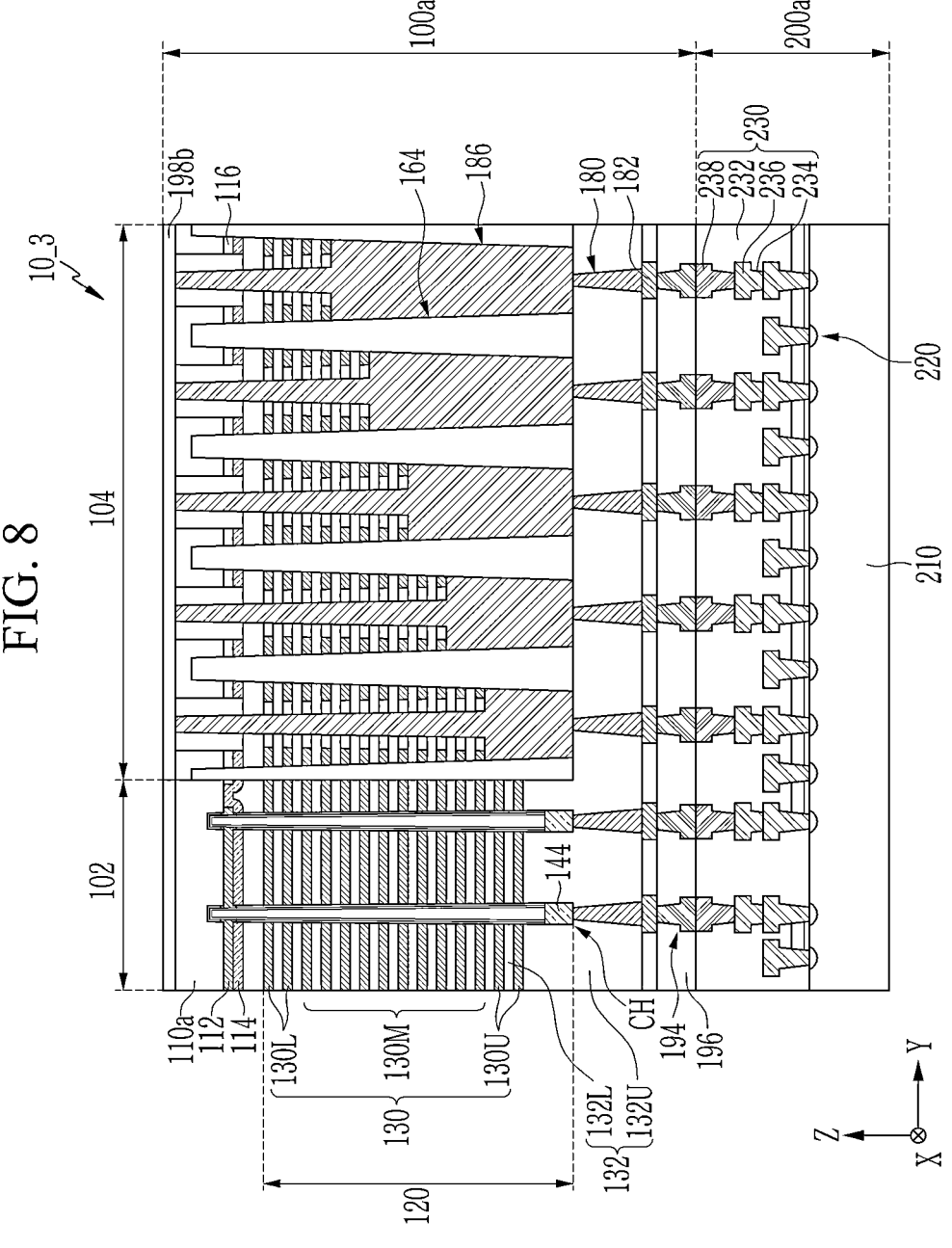

FIG. 6 to FIG. 8 illustrate partial top plan views showing semiconductor devices according to some example embodiments.

In accordance with the semiconductor device 10_1 according to the example embodiment illustrated in FIG. 6, unlike in the semiconductor device 10 according to the example embodiment illustrated in FIG. 1, there is a difference in that the sub-support structures 162 positioned in the dummy regions DMR1 and DMR2 are omitted.

In the present example embodiment, unlike in the example embodiment illustrated in FIG. 1, the main support structure 164_1 may be positioned in the pad contact region PCA and the dummy regions DMR1 and DMR2 of the connecting region 104.

Specifically, referring to FIG. 6, the main support structure 164_1 includes a first portion 164a_1 extending in the second direction Y and a second portion 164b_1 extending in the first direction X from the first portion 164a_1, and compared to the example embodiment illustrated in FIG. 1, the second portion 164b_1 may extend further from the pad contact region PCA in the first direction X to be further positioned in the dummy regions DMR1 and DMR2.

In addition, in the present example embodiment, compared to the example embodiment illustrated in FIG. 1, as an end of the second portion 164b_1 of the main support structure 164_1 extends toward a first side and a second side in the first direction X, an area of the contact electrode 186 surrounded by the main support structure 164_1 may be wider in a plan view.

Accordingly, compared to the example embodiment illustrated in FIG. 1, the dummy regions DMR1 and DMR2 may have a smaller width in the first direction X, and a width of the pad contact region PCA along the first direction X may be greater. In other words, the width of the pad contact region PCA along the first direction X may be greater than that of the dummy regions DMR1 and DMR2 along the first direction X.

In the present example embodiment, Unlike in the example embodiment illustrated in FIG. 1, even if the sub-support structure 162 is not located in the dummy regions DMR1 and DMR2, a shape may be maintained against an external force applied to the gate stack structure 120 while reducing a stress that may be applied to the gate stack structure 120 during a process step of etching the gate stack structure 120, by the second portion 164b_1 of the main support structure 164_1 extending from the pad contact region PCA to the dummy areas DMR1 and DMR2.

In addition, a width of the gate stack structure 120 positioned in the dummy regions DMR1 and DMR2 and having a step shape along the first direction X is smaller than that of the example embodiment illustrated in FIG. 1, and thus even if the sub-support structure 162 is not positioned in the dummy regions DMR1 and DMR2, an original shape may be maintained during a process step of forming a step shape in the gate stack structure 120 positioned in the dummy regions DMR1 and DMR2 without deformation due to a stress or an external force applied to the gate stack structure 120 positioned in the dummy regions DMR1 and DMR2.

Accordingly, in the case of the semiconductor device 10_1 according to the present example embodiment, orders of a process step of forming the step shape in the gate stack structure 120 positioned in the dummy regions DMR1 and DMR2 and a process step of forming the contact electrode 186 in the pad contact region PCA are not limited. That is, whichever process is performed first among the process steps of forming a step shape in the gate stack structure 120 positioned in the dummy regions DMR1 and DMR2 and the process step of forming the contact electrode 186 in the pad contact region PCA, a corresponding fixing step may be performed while maintaining an original shape of the gate stack structure 120, a process order may be diversified.

In accordance with the semiconductor device 10_1 according to the example embodiment illustrated in FIG. 7, unlike in the semiconductor device 10 according to the example embodiment illustrated in FIG. 2, a plurality of cell array regions 102 may be included, and the connecting region 104 may further include a cell contact region CCA.

In accordance with the semiconductor device 10_2 according to the present example embodiment, the cell array regions 102 may be positioned apart from each other in the second direction Y with the connecting region 104 provided therebetween. That is, the connecting region 104 may be positioned between the cell array regions 102. However, a disposition relationship between the cell array region 102 and the connecting region 104 is not limited thereto, and may be variously changed.

In accordance with the semiconductor device 10_2 according to the present example embodiment, unlike in the semiconductor device 10 according to the example embodiment illustrated in FIG. 1, there is differences in that the connecting region 104 further includes the cell contact region CCA connecting the cell array regions 102, and the dummy region DMR is provided only at a first side of the connecting region 104.

Specifically, as illustrated in FIG. 7, the pad contact region PCA is positioned at a center of the connecting region 104, the cell contact region CCA is positioned at first side of the pad contact region PCA in the first direction X, and the dummy region DMR may be positioned at a second side of the pad contact region PCA in the first direction X.

Unlike in the example embodiment shown in FIG. 1, the second portion 164b_2 of the main support structure 164_2 according to the present example embodiment may extend to a first side of the first direction X. That is, unlike in the example embodiment illustrated in FIG. 1 in which the second portion 164b of the main support structure 164 extends to a first side and a second side in the first direction X, in the present example embodiment, the second portion 164b_2 of the main supporting structure 164_2 may extend along the first side of the first direction X. That is, the second portion 164b_2 of the main support structure 164_2 may extend toward the dummy region DMR.

Similar to the example embodiments illustrated in FIG. 1, FIG. 2, and FIG. 5A, a plurality of gate electrodes (not shown) may extend from the dummy region DMR to each of the pad regions PA_2. The gate electrodes positioned in the pad contact region PCA and the gate electrodes positioned in the dummy region DMR may have a step shape in a cross-sectional view.

However, unlike in the example embodiments illustrated in FIG. 1, FIG. 2, and FIG. 5A, which have a step shape that descends downward as the distance from the cell array region 102 increases in a cross-sectional view, in the present example embodiment, the gate electrode positioned in the dummy region DMR has a step shape descending downward as the distance from the cell array region 102 positioned at a first side of the connecting region 104 in the second direction Y is increased in a cross-sectional view, and the connecting region 104 may have a step shape that descends downward as the distance from the cell array region 102 positioned at a second side in the second direction Y is increased. That is, the gate electrode positioned in the dummy region DMR may have a shape in which a step shape descending downward as the distance from the cell array region 102 positioned at a first side of the connecting region 104 increases and a step shape that descends downward as the distance from the cell array region 102 positioned at a second side of the connecting region 104 increases are opposite to each other in a cross-sectional view.

A plurality of pad regions PA_2 may be positioned in the pad contact region PCA. Unlike in the example embodiment illustrated in FIG. 1, in the present example embodiment, the pad regions PA_2 may be positioned only at a first side of the main support structure 164_2 in the first direction X.

In addition, unlike in the example embodiment illustrated in FIG. 1 in which the pad regions PA are spaced apart from each other in the first direction X with the pad contact region PCA provided therebetween, and are position sequentially from a position far from the cell array region 102, that is, along one direction of the second direction Y, in the present example embodiment, some of the pad regions PA_2 may be sequentially positioned along a direction from farther away from the cell array region 102 positioned at a first side of the connecting region 104 to closer to the cell array region 102 of the second direction Y, and the rest of the pad regions PA_2 may be sequentially positioned along a direction from a far side of the cell array region 102 positioned at a second side of the connecting region 104 in the second direction Y to a direction closer to the cell array region 102. That is, the pad regions PA_2 are positioned along substantially a same row, and may be sequentially positioned toward different directions.

As such, As the plurality of gate electrodes positioned in the dummy region DMR and the pad region PA_2 have a step shape facing each other in a cross-sectional view, upper surfaces of pad electrodes (not illustrated) connected to the gate electrodes extending from the dummy region DMR to the pad regions PA_2 may be exposed. That is, pad electrodes connected to the contact electrode 186_2 in each of the pad regions PA_2 may be positioned at different levels.

For example, a first pad region PA1_2, a third pad region PA3_2, and a fifth pad region PA5_2 may be sequentially positioned along a first direction of the second direction Y, and a second pad region PA2_2 and a fourth pad region PA4_2 may be sequentially positioned along a second direction of the second direction Y.

That is, gate electrodes extending from the dummy region DMR to the first pad region PA1_2, the third pad region PA3_2, and the fifth pad region PA5_2, respectively, may have a step shape that goes up as it gets closer to the cell array region 102 positioned at second side of the connecting region 104.

Gate electrodes extending from the dummy region DMR to the second and fourth pad regions PA2_2 and PA4_2, respectively, may have a step shape that goes up as it gets closer to the cell array region 102 provided at a first side of the connecting region 104.

In addition, pad electrodes that extends from the dummy region DMR to the pad region PA_2 configured to be connected to the contact electrode 186_2 in each of the first pad region PA1_2, the second pad region PA2_2, the third pad region PA3_2, the fourth pad region PA4_2, and the fifth pad region PA5_2 may be positioned at different levels. That is, the pad electrode positioned in the second pad region PA2_2 may be positioned at a higher level than that of the pad electrode positioned in the first pad region PA1_2, the pad electrode positioned in the third pad region PA3_2 may be positioned at a higher level than that of the pad electrode positioned in the second pad region PA2_2, the pad electrode positioned in the fourth pad region PA4_2 may be positioned at a higher level than that of the pad electrode positioned in the third pad region PA3_2, and the pad electrode positioned in the fifth pad region PA5_2 may be positioned at a higher level than that of the pad electrode positioned in the fourth pad region PA4_2.

In each of the first pad region PA1_2, the third pad region PA3_2, and the fifth pad region PA5_2, the gate electrodes electrically connected to the pad electrode through the contact electrode 186_2 connected to the cell array region 102 positioned at the second side of the connecting region 104, and in each of the second pad region PA2_2 and the fourth pad region PA4_2, the gate electrodes electrically connected to the pad electrode through the contact electrode 186_2 may be connected to the cell array region 102 positioned at the first side of the connecting region 104. However, a number and disposition of the pad region PA_2 and a shape of the gate electrode positioned in the dummy region DMR are not limited thereto, and as long as the pad electrodes are sequentially exposed in each of the above-described pad regions PA_2 and have a shape or profile connected to each of the contact electrodes 186, various changes may be made.

In the present example embodiment, the sub-support structure 162_2 serving to maintain its original shape without deformation due to a stress or external force applied to the gate electrode structure 120 may be positioned in the cell contact region CCA and the dummy region DMR. The sub-support structures 162_2 are spaced apart from each other in the first and second directions X and Y, and may be arranged in an island shape in a plan view. However, a position, shape, and disposition of the sub-support structure 162_2 are not limited thereto, and may be variously changed. For example, as described with reference to FIG. 6, the sub support structure 162_2 positioned in the dummy region DMR may be omitted. As such, if the sub support structure 162_2 positioned in the dummy region DMR is omitted, like in the example embodiment illustrated in FIG. 6, the second portion 164b_2 of the main support structure 164_2 may further extend along the first direction X to be positioned in the dummy region DMR.

FIG. 8 illustrates a partial cross-sectional view schematically showing a semiconductor device according to another example embodiment.

The semiconductor device according to the example embodiment illustrated in FIG. 8 may have a chip-to-chip (C2C) structure bonded by a wafer bonding method. That is, after manufacturing a lower chip including a circuit region 200a positioned on the first substrate 210 and manufacturing the upper chip including a cell region 100a positioned on a second substrate 110a, the semiconductor device 10_3 may be manufactured by joining them together.

The circuit region 200a may have a first junction structure 238 on a surface facing the cell region 100a on the first substrate 210, the circuit element 220, and the first wire portion 230.

The cell region 100a may include a second junction structure 194 on a surface facing the circuit region 200a on the second substrate 110, the gate stack structure 120, the channel structure CH, and the second wire portion 180.

The second substrate 110a may be a semiconductor substrate including a semiconductor material. For example, the second substrate 110a may be a semiconductor substrate made of a semiconductor material or may be a semiconductor substrate on which a semiconductor layer is formed on a base substrate. For example, the second substrate 110a may be formed of single crystal or polycrystalline silicon, germanium, silicon-germanium, silicon-on-insulator, or germanium-on-insulator.

In the gate stack structure 120, the gate electrode 130 may include the lower gate electrode 130L, the memory cell gate electrode 130M, and the upper gate electrode 130U sequentially positioned on the second substrate 110a toward the circuit region 200a from the second substrate 110a.

That is, as illustrated in FIG. 8, the gate stack structure 120 may be sequentially stacked on a lower portion of the second substrate 110a in the drawing, and thus the gate stack structure 120 illustrated in FIG. 2 may be positioned in a vertically inverted manner.

Accordingly, the channel pad 144 and the second wire portion 180 positioned on the, gate stack structure 120 may be positioned adjacent to the circuit region 200a. In addition, the second junction structure 194 electrically connected to the second wire portion 180 may be provided on a surface facing the circuit region 200a. A region other than the second junction structure 194 may be covered by an insulating layer 196. As such, in the cell region 100a, the second wire portion 180 and the second junction structure 194 may be positioned to face the circuit region 200a.

For example, the second junction structure 194 of the cell region 100a and the first junction structure 238 of the circuit region 200a may be made of aluminum, copper, tungsten, or an alloy including the same. For example, since the first and second junction structure 238 and 194 include copper, the cell region 100a and the circuit region 200a may be bonded by copper-to-copper bonding (directly contacted and bonded).

In FIG. 8, the description of the structure of the gate stack structure 120 and the channel structure CH described above with reference to FIG. 2 to FIG. 5A may be applied as it is. In addition, although FIG. 8 illustrates that the gate stack structure 120 is formed as a single gate stack structure, it may include a plurality of gate stack structures.

In FIG. 8, a same electrical connection structure between the channel structure CH and the horizontal conductive layers 112 and 114 and/or the second substrate 110a as in FIG. 1 is illustrated. However, the present disclosure is not limited thereto, and an electrical connection structure between the channel structure CH and the horizontal conductive layers 112 and 114 and/or the second substrate 110a may be variously modified.

The semiconductor device 10_3 according to the present example embodiment may include an input/output pad (not illustrated) and an input/output connecting wire (not illustrated) electrically connected thereto. The input/output connecting wire may be electrically connected to a portion of the second junction structure 194. The input/output pad may be positioned on, for example, an insulating layer 198b covering an outer surface of the second substrate 110a. According to some example embodiments, a separate input/output pad electrically connected to the circuit region 200a may be provided.

Figure 25:
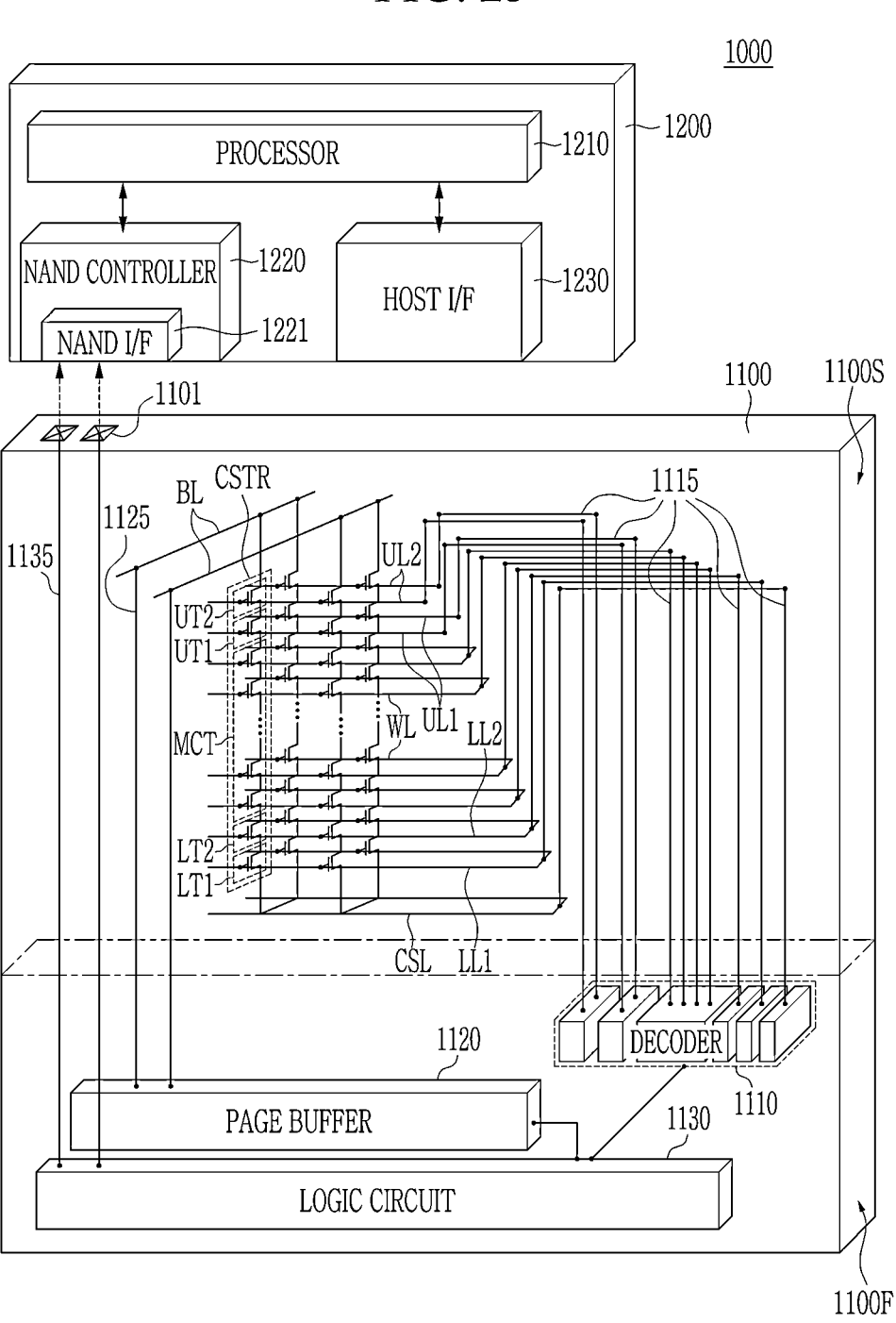
FIG. 25 schematically illustrates an electronic system including a semiconductor device according to an example embodiment.

For example, the circuit region 200a and the cell region 100a may respectively be portions corresponding to a first structure 1100F and a second structure 1100S of a semiconductor device 1100 included in an electronic system 1000 illustrated in FIG. 25. Alternatively, the circuit region 200a and the cell region 100a may be regions including a first structure 4400 and a second structure 4200 of a semiconductor chip 2200a illustrated in FIG. 19, respectively.

Hereinafter, a method of manufacturing a semiconductor device according to an example embodiment will be described with reference to FIG. 9 to FIG. 25.

FIG. 9 to FIG. 25 illustrate process cross-sectional views top plan views, and perspective views sequentially showing a manufacturing method of a semiconductor device according to an example embodiment.

Figure 20:
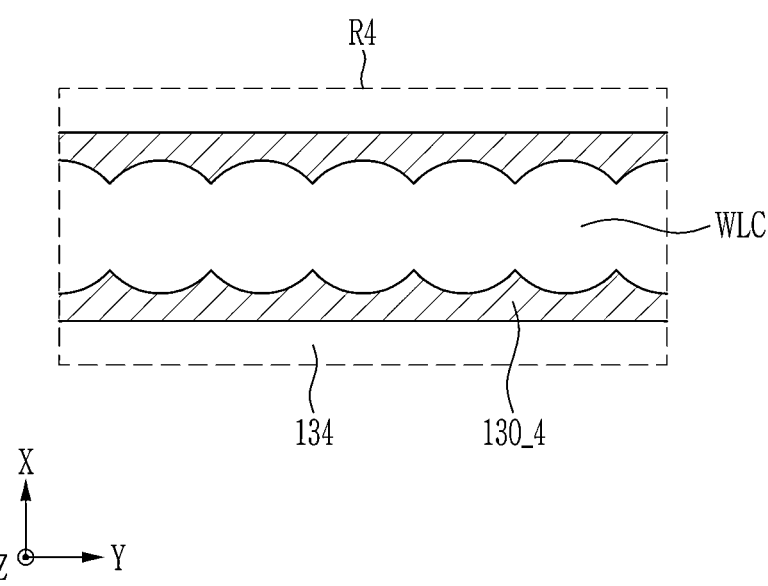
FIG. 20 illustrates a partially enlarged view of a region R4 of FIG. 16.

FIG. 9, FIG. 11, FIG. 14A to FIG. 14D, FIG. 16, FIG. 19A to FIG. 19D, FIG. 21, and FIG. 23 illustrate top plan views for describing a manufacturing method of a semiconductor device according to an example embodiment. FIG. 15 illustrates a partially enlarged view of a region R3 of FIG. 14D. FIG. 20 illustrates a partially enlarged view of a region R4 of FIG. 16.

Figure 13:
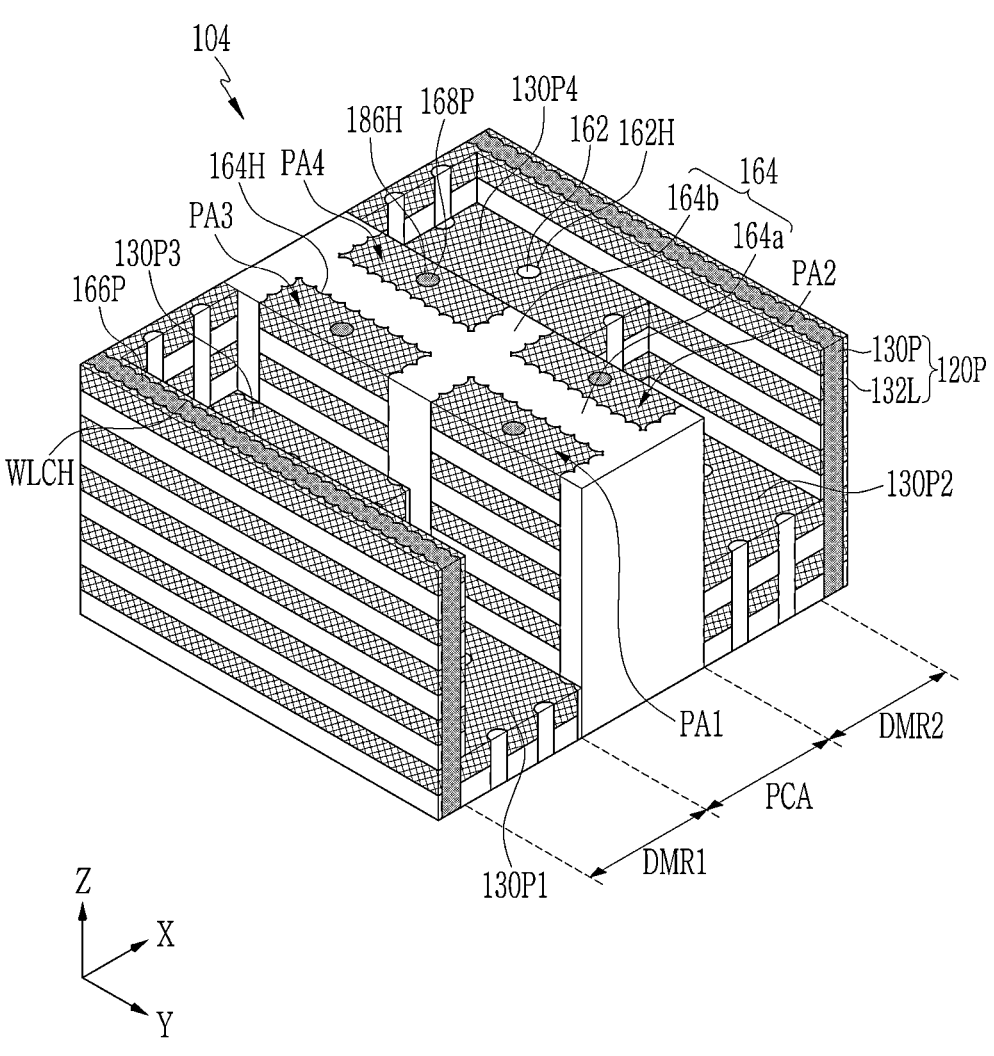
FIG. 13 and FIG. 18 illustrate partial perspective views for describing a manufacturing method of a semiconductor device according to an example embodiment.
Figure 18:
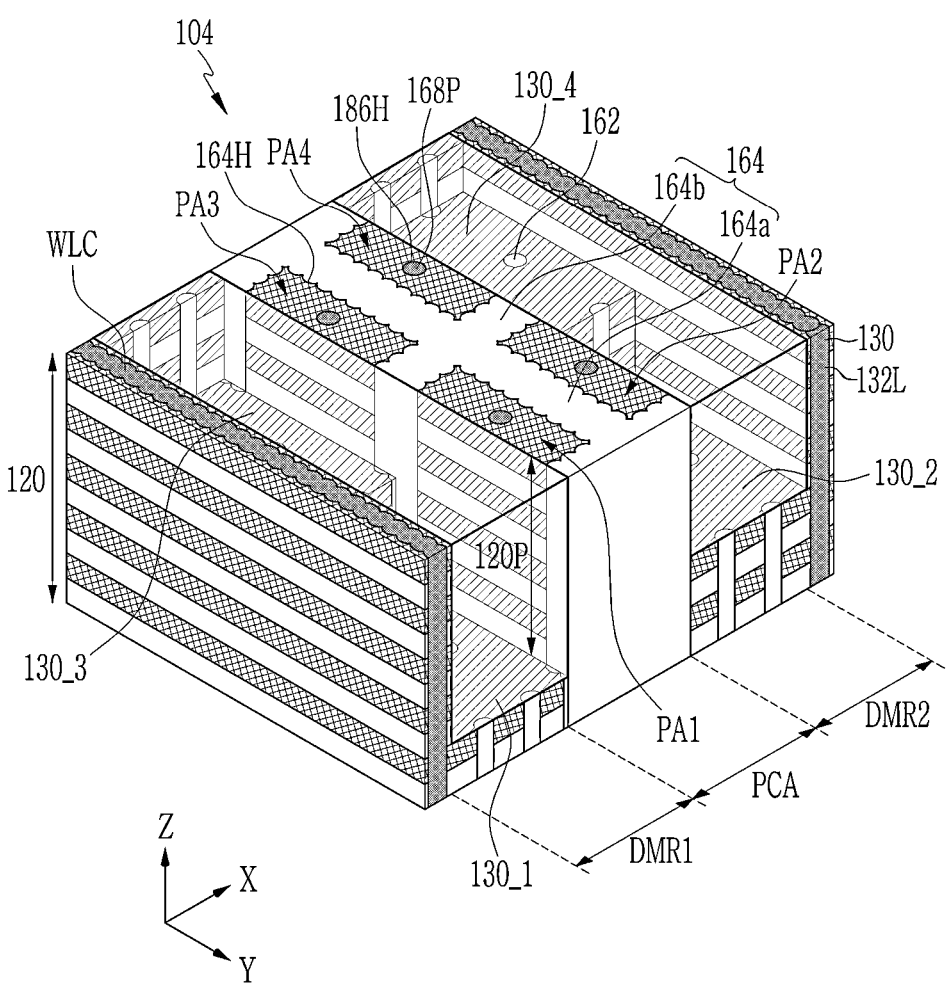
Figure 19A:
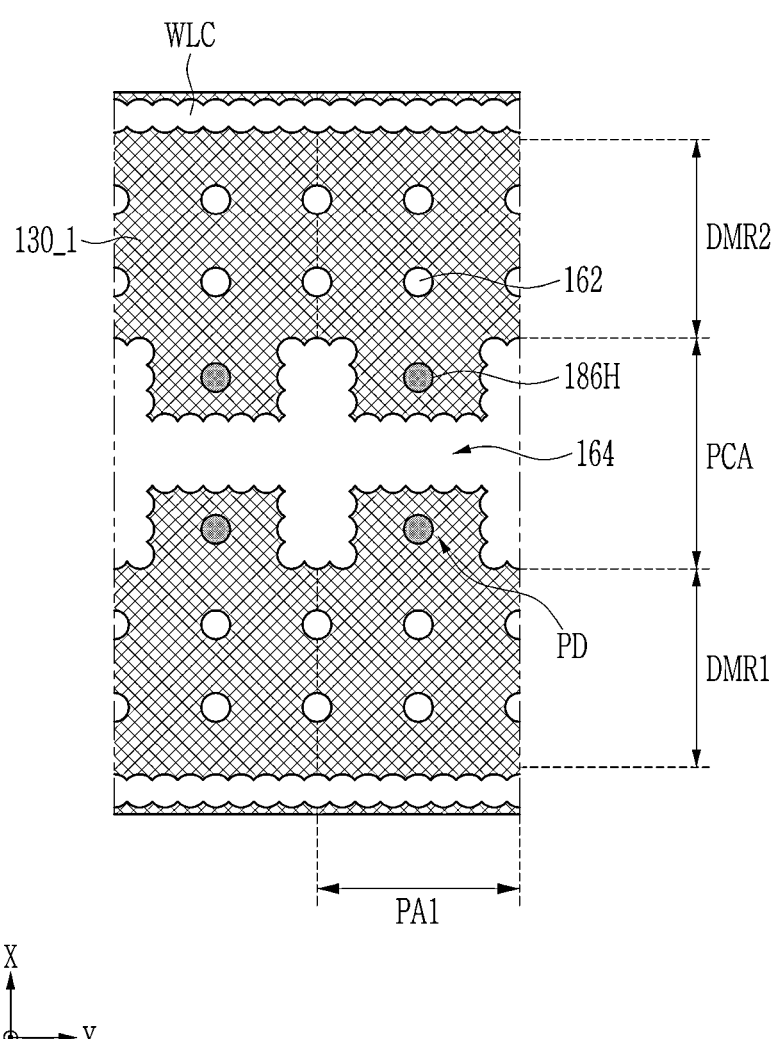
Figure 19B:
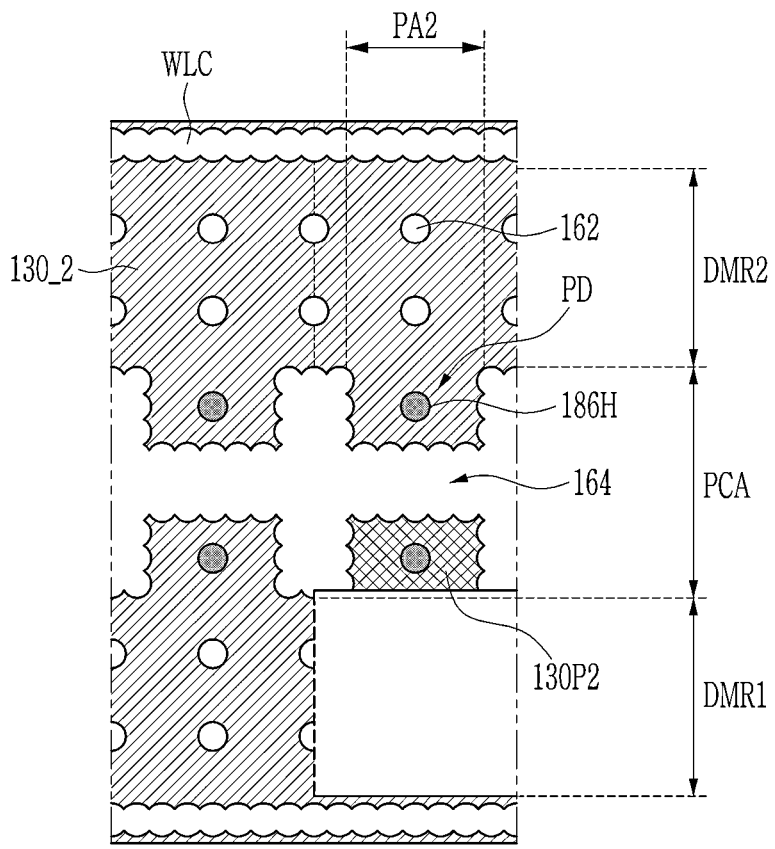
Figure 19B:
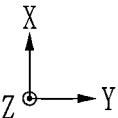
Figure 19C:
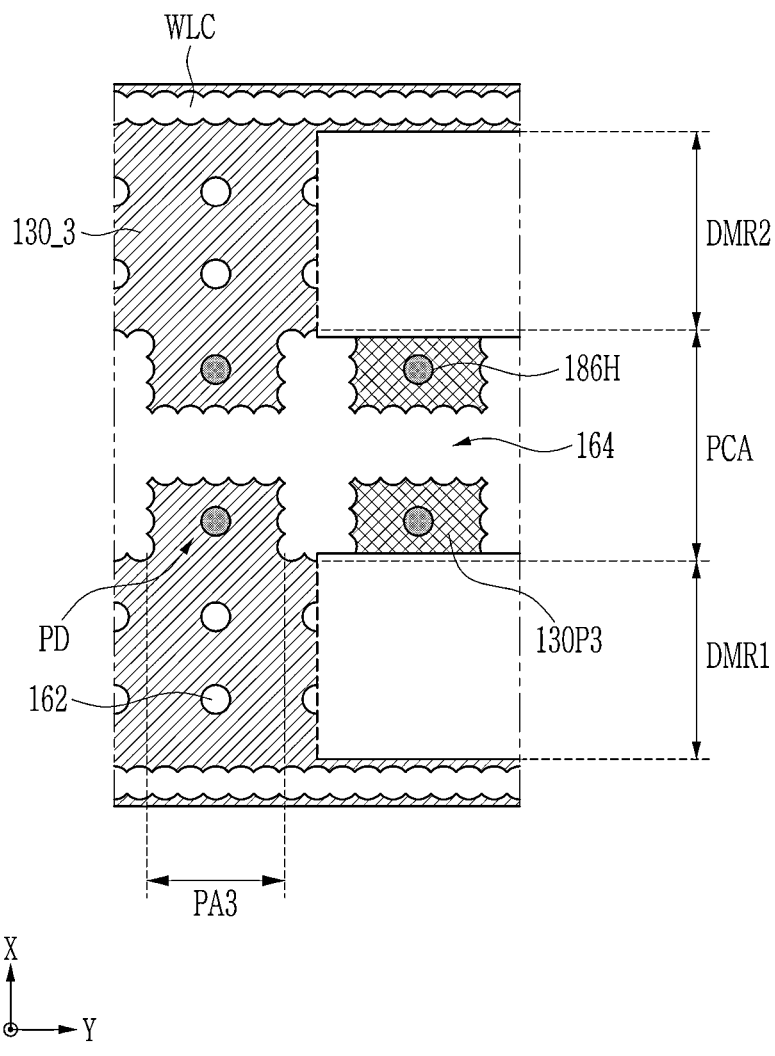
Figure 19D:
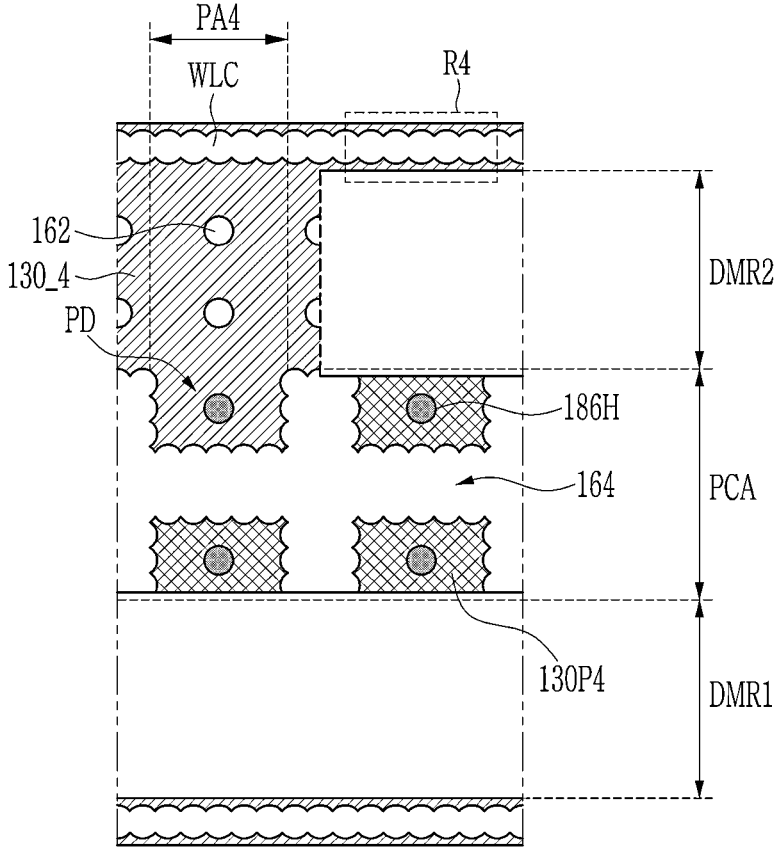
Figure 19D:
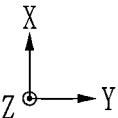

FIG. 13 and FIG. 18 illustrate partial perspective views for describing a manufacturing method of a semiconductor device according to an example embodiment.

FIG. 10, FIG. 12, FIG. 17, FIG. 22, and FIG. 24 illustrate cross-sectional views corresponding to the top plan views for describing a manufacturing method of a semiconductor device according to an example embodiment.

FIG. 9 to FIG. 24 partially illustrate the connecting region 104 and the cell region 100 located in the connecting region 104 for convenience, and Illustration of the cell array region 102 and the cell region 100 positioned in the cell array region 102 is omitted. Hereinafter, a manufacturing method of the cell region 100 positioned in the connecting region 104 of the semiconductor device according to an example embodiment will be mainly described.

Figure 9:
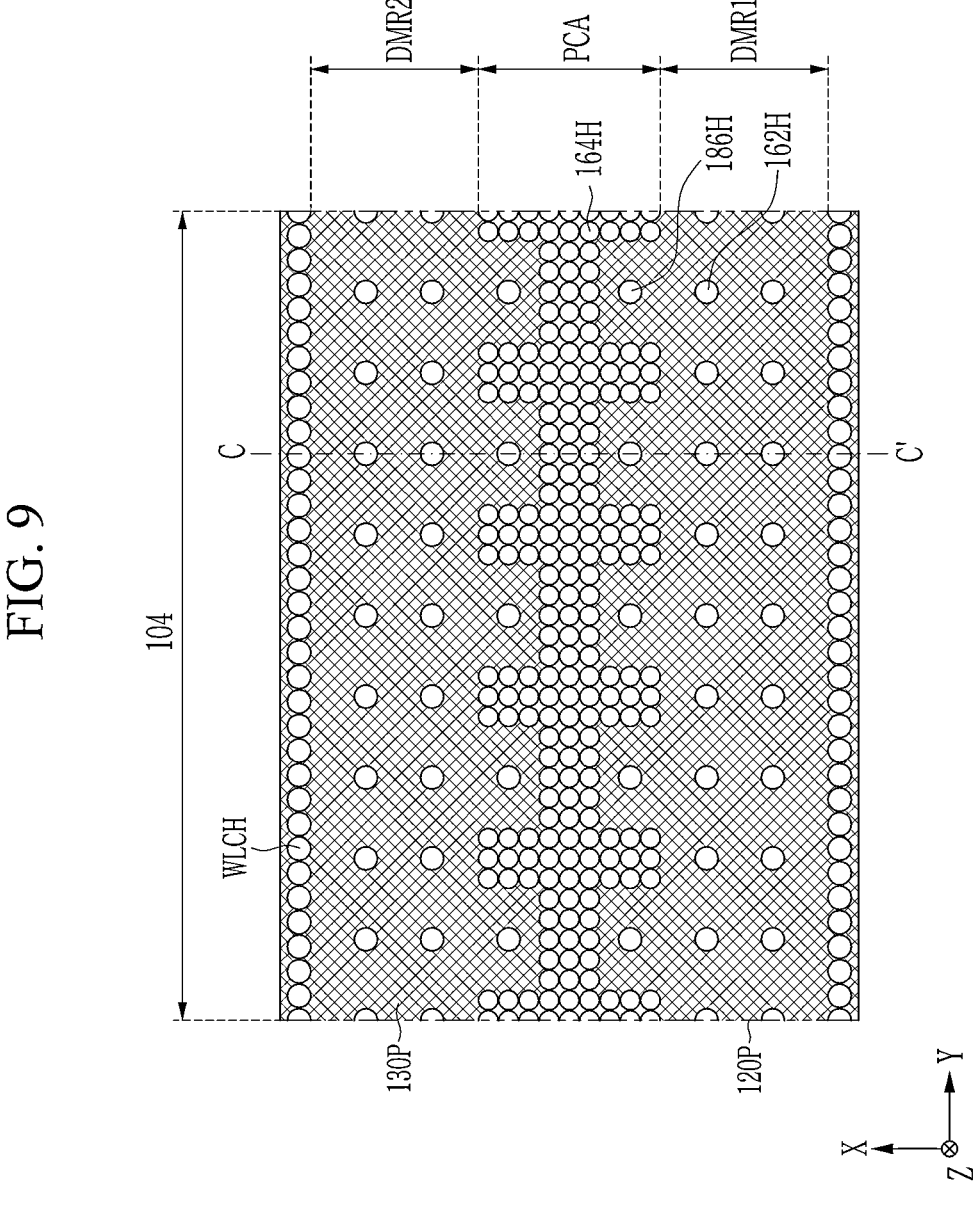
FIG. 9, FIG. 11, FIG. 14A to FIG. 14D, FIG. 16, FIG. 19A to FIG. 19D, FIG. 21, and FIG. 23 illustrate top plan views for describing a manufacturing method of a semiconductor device according to an example embodiment.
Figure 10:
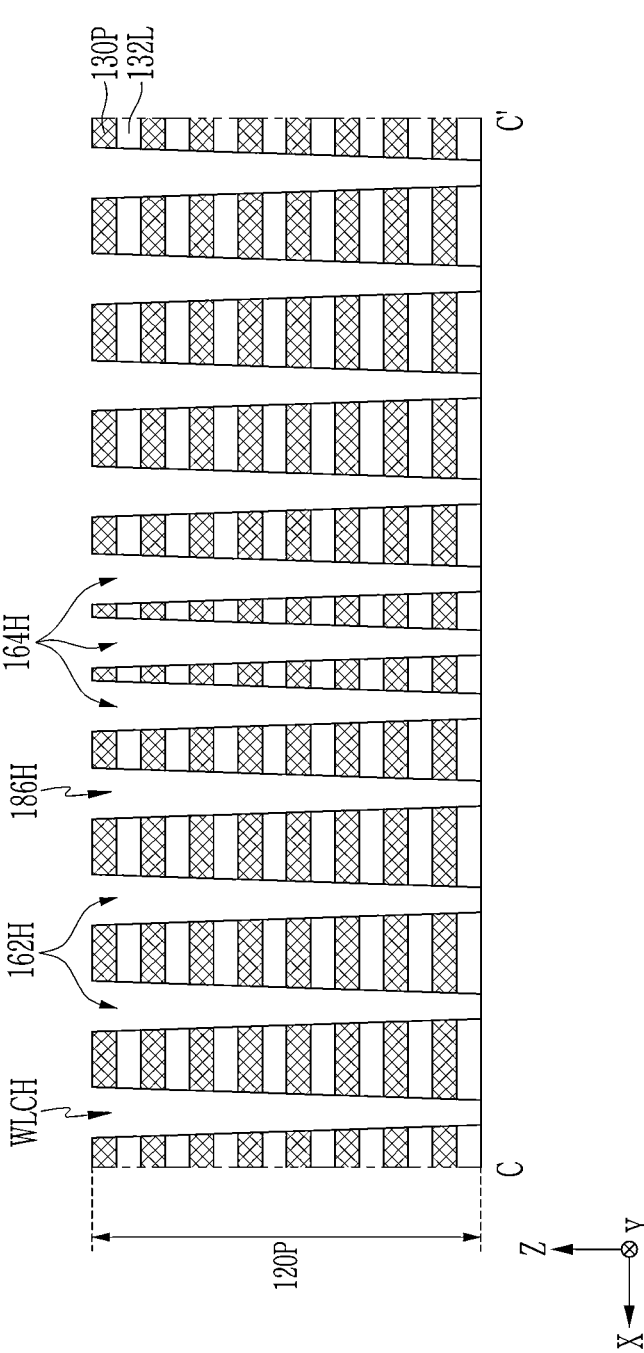

First, referring to FIG. 9 and FIG. 10, a stacked structure 120P may be formed by alternately stacking the interlayer insulating layers 132L and the sacrificial insulating layers 130P on a first surface (e.g., a front surface or an upper surface) of a second substrate (not illustrated) positioned in the connecting region 104 of the semiconductor device 10 according to an example embodiment.

The sacrificial insulating layer 130P may include a material that is different from that of the interlayer insulating layer 132L. For example, the interlayer insulating layer 132L may include a silicon oxide, a silicon nitride, a silicon nitride, and a low dielectric constant material, and the sacrificial insulating layer 130P includes at least one of silicon, a silicon oxide, a silicon carbide, or a silicon nitride, but may be made of a material that is different from that of the interlayer insulating layer 132L.

For example, the interlayer insulating layer 132L may include a silicon oxide, and the sacrificial insulating layer 130P may include a silicon nitride. The sacrificial insulating layer 130P may be a layer replaced with a gate electrode 130 (see FIG. 2) in a subsequent process. That is, the sacrificial insulating layer 130P may be formed to correspond to a portion where the gate electrode 130 (see FIG. 2) is to be formed.

The stack structure 120P positioned in the connecting region 104 of the semiconductor device 10 according to an example embodiment may include the pad contact region PCA positioned approximately at a center, and the dummy regions DMR1 and DMR2 positioned at a first side and a second side of the pad contact region PCA in the first direction X.

Subsequently, as illustrated in FIG. 9 and FIG. 10, a separation structure hole WLCH, a sub-support structure hole 162H, a main support structure hole 164H, and a contact electrode hole 186H may be formed together in the stack structure 120P.

The stack structure 120P may extend through the separation structure hole WLCH, the sub-support structure hole 162H, the main support structure hole 164H, and the contact electrode hole 186H. For example, the separation structure hole WLCH, the sub-support structure hole 162H, the main support structure hole 164H, and the contact electrode hole 186H may have inclined side surfaces each having a width that decreases from an upper surface to a lower surface of the stack structure 120P in a cross-sectional view due to a high aspect ratio thereof. However, cross-sectional shapes of the separation structure hole WLCH, the sub-support structure hole 162H, the main support structure hole 164H, and the contact electrode hole 186H are not limited thereto, and a side surface thereof may be perpendicular to the second substrate (not illustrated).

In a plan view, the separation structure hole WLCH may be formed at an edge of the stack structure 120P positioned in the connecting region 104. Separation structure holes WLCH are spaced apart along the second direction Y, and may have a line shape in a plan view.

In a plan view, the sub-support structure hole 162H may be formed in the dummy regions DMR1 and DMR2 of the connecting region 104. The sub-support structure holes 162H may be spaced apart from the dummy regions DMR1 and DMR2 in the first direction X and the second direction Y, and may be arranged in an island shape in a plan view side by side along the second direction Y.

In a plan view, the main support structure hole 164H may be formed in the pad contact region PCA of the connecting region 104. A number of main support structure holes 164H may be greater than a number of separate structure holes WLCH and a number of sub-support structure holes 162H. The main support structure hole 164H may be arranged along the first direction X and the second direction Y in the pad contact region PCA, and may have a line shape in a plan view.

In a plan view, the contact electrode hole 186H may be formed in the pad contact region PCA of the connecting region 104. In a plan view, at least a portion of the contact electrode hole 186H may be surrounded by the main support structure hole 164H. The contact electrode hole 186H may be positioned parallel to the separation structure hole WLCH, the sub support structure hole 162H, and the main support structure hole 164H along the first direction X in a plan view.

In FIG. 9, the separation structure hole WLCH, the sub-support structure hole 162H, the main support structure hole 164H, and the contact electrode hole 186H have a circular shape in a plan view, the separation structure hole WLCH, the sub-support structure hole 162H, the main support structure hole 164H, and the contact electrode hole 186H are all illustrated as having substantially a same diameter, but the present disclosure is not limited thereto, and shapes and diameters of the separation structure hole WLCH, the sub-support structure hole 162H, the main support structure hole 164H, and the contact electrode hole 186H in a plan view may be variously changed.

In addition, a number, disposition, and positional relationship of each of the separation structure hole WLCH, the sub-support structure hole 162H, the main support structure hole 164H, and the contact electrode hole 186H are not limited thereto, and may be variously changed.

Subsequently, refer to FIG. 11 to FIG. 15, first, a process of expanding the separation structure holes WLCH and the main support structure holes 164H may be performed.

Accordingly, the separation structure holes WLCH arranged side by side along the second direction Y may be integrally connected to each other. That is, the separation structure hole WLCH may have a line shape extending in the second direction Y in a plan view.

In addition, the main support structure holes 164H spaced apart in the first direction X and the second direction Y may be integrally connected to each other. That is, similar to the separation structure hole WLCH, the main support structure hole 164H may have a line shape extending in the first direction X and the second direction Y.

Then, sacrificial layers 166P and 168P may be filled in the separation structure hole WLCH and the contact electrode hole 186H, respectively, and the sub-support structure 162 and the main support structure 164 may be formed by filling the sub-support structure hole 162H and the main support structure hole 164H with an insulating material.

The sacrificial layers 166P and 168P respectively filled in the separation structure hole WLCH and the contact electrode hole 186H may include a different material from the insulating material filled in each of the-sub support structure hole 162H and the main support structure hole 164H. For example, the sacrificial layers 166P and 168P respectively filled in the separation structure hole WLCH and the contact electrode hole 186H may be made of polysilicon. However, the sacrificial layers 166P and 168P respectively filled in the separation structure hole WLCH and the contact electrode hole 186H are not limited thereto, and may be variously changed.

The sacrificial layers 166P and 168P respectively filled in the separation structure hole WLCH and the contact electrode hole 186H may include, for example, an insulating material such as a silicon oxide, a silicon nitride, or a silicon nitride. However, the insulating material filled in each of the sub-support structure hole 162H and the main support structure hole 164H is not limited thereto, and may be variously changed.

As the insulating material is filled in the main support structure hole 164H, the main support structure 164 may include a first portion 164a extending in the second direction Y in the pad contact region PCA and a second portion 164b extending from the first portion 164a toward the first direction X intersecting the second direction Y. That is, the second portion 164b of the main supporting structure 164 may extend from the first portion 164a toward a first side and a second side of the first direction X in a plan view.

In addition, as the insulating material is filled in the sub-support structure hole 162H, the sub-support structure 162 may be formed.

Figure 12:
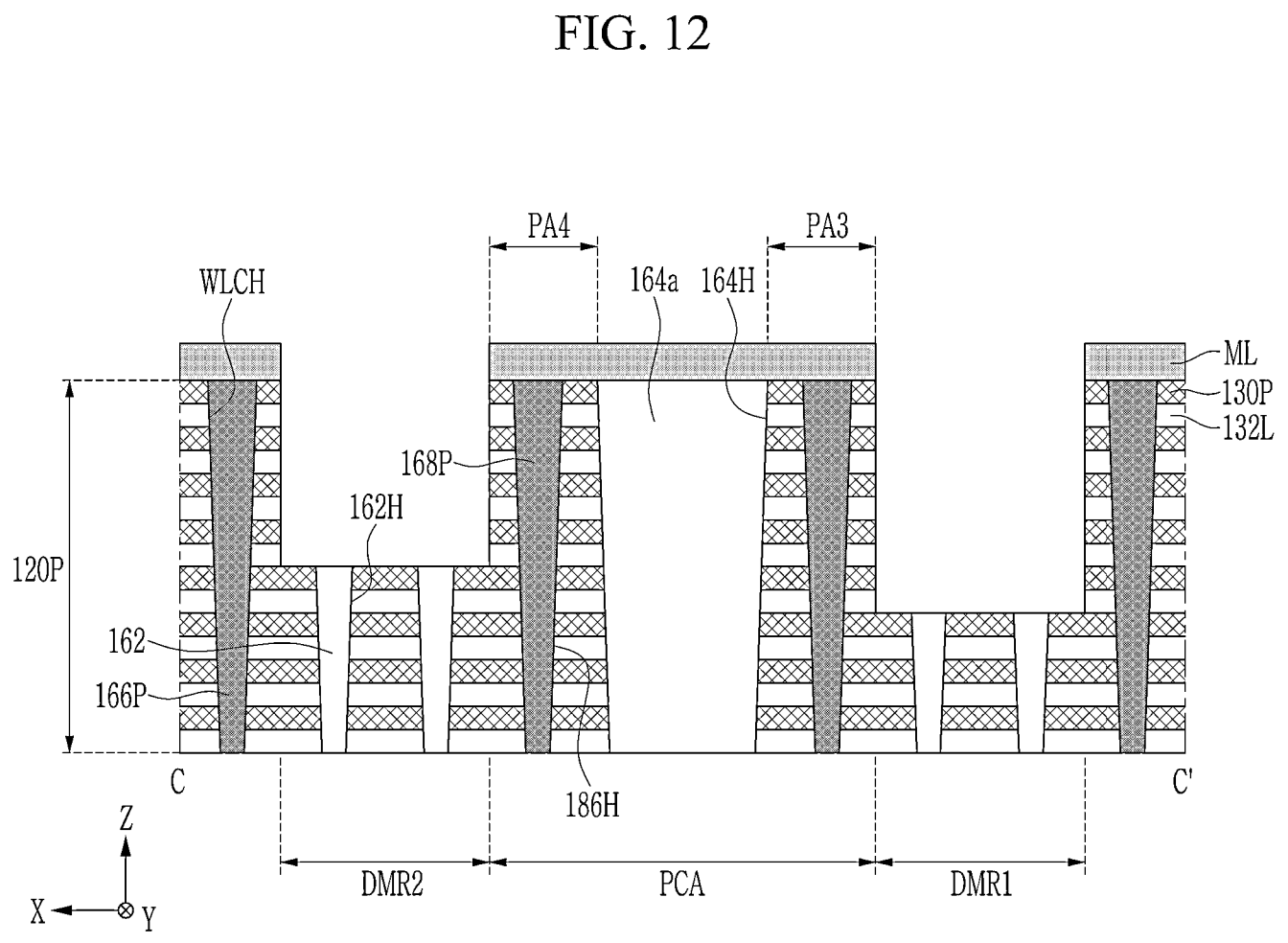

Subsequently, after forming a mask layer on the pad contact region PCA of the stack structure 120P and the separation structure hole WLCH positioned at an edge of the stack structure 120P, a mask pattern ML may be formed by patterning the mask layer. According to an example embodiment, the mask pattern ML positioned on the pad contact region PCA may expose a portion of the second portion 164b of the main support structure 164 in a plan view. That is, the mask pattern ML may expose an end of the second portion 164b of the main support structure 164 positioned at a first side and a second side in the first direction X. This is to secure a margin for misalignment by exposing a portion of the second portion 164b of the main support structure 164 in a plan view to prevent defects due to misalignment that may occur in a patterning process using the mask pattern ML Then, as illustrated in FIG. 12 and FIG. 13, using the mask pattern ML, the stack structure 120P positioned in the dummy regions DMR1 and DMR2 may be patterned to have a step shape.

A detailed description of the step shape of the stack structure 120P positioned in the dummy regions DMR1 and DMR2 will be described later with reference to FIG. 13 and FIG. 14A to FIG. 14D.

In a step of patterning the stack structure 120P positioned in the dummy regions DMR1 and DMR2 to have a step shape, as each of the sub-support structure 162 exposed by the mask pattern ML and the main support structure 164 partially exposed by the mask pattern ML includes a different material from that of the stack structure 120P exposed by the mask pattern ML,
A difference in etching degree may occur in the patterning step.

For example, in a step of partially patterning the stacked structure 120P exposed by the mask pattern ML and the main support structure 164 such that the stack structure 120P positioned in the dummy regions DMR1 and DMR2 has a step shape, the insulating material filling the sub-support structure hole 162H and the main support structure hole 164H may be more etched toward the third direction Z, which is the thickness direction, than the stack structure 120P.

Accordingly, each of upper surfaces of the sub-support structure 162 and the main support structure 164 positioned on each layer of the step-shaped stack structure 120P and extending through the step-shaped stack structure 120P may be positioned at a lower level than that of the upper surface of the sacrificial insulating layer 130P positioned on each layer of the step-shaped stack structure 120P.

Accordingly, the manufacturing method of the semiconductor device 10 according to an example embodiment may include a process step of additionally filling the sub-support structure hole 162H and the main support structure hole 164H with an insulating material such that each of the upper surfaces of the sub-support structure 162 and the main support structure 164 may be positioned at substantially a same level as that of the upper surface of the sacrificial insulating layer 130P positioned on each layer of the stepped stack structure 120P.

In addition, in some example embodiments, as the insulating material filling the sub-support structure hole 162H and the main support structure hole 164H, which will be described later, is etched more in the third direction Z, which is a thickness direction, than the stack structure 120P, an empty space formed in an upper region of each of the sub-support structure hole 162H and the main support structure hole 164H may be filled by the intermediate insulating layer 132M in a step of forming the intermediate insulating layer 132M, which will be described later.

The stack structure 120P positioned in the pad contact region PCA and the stack structure 120P surrounding the separation structure WLC may not be patterned by the mask pattern ML. Accordingly, thicknesses of the stack structure 120P positioned in the pad contact region PCA and the stack structure 120P surrounding the separation structure WLC may be thicker than a thickness of the stack structure 120 positioned in the dummy regions DMR1 and DMR2.

That is, upper surfaces of stack structure 120P positioned in the pad contact region PCA and the stack structure 120P surrounding the separation structure WLC may be positioned in the dummy regions DMR1 and DMR2, and may be positioned at a higher level than that of an upper surface of the stepped stack structure 120P.

In the stack structure 120P positioned in the pad contact region (PCA), a plurality of pad regions PA in which the pad electrode PD (see FIG. 2) connected to the gate electrode 130 (see FIG. 2) extending from the dummy regions DMR1 and DMR2 to the pad contact region PCA may be formed by a process steps to be described later. The stack structures 120P in which the pad regions PA are formed may be surrounded by the main support structure 164 in a plan view.

For example, the pad regions PA may include: a first pad region PA1, a third pad region PA3, a fifth pad region PA5, a seventh pad region PA7, and a ninth pad region PA9 positioned at a first side of the main support structure 164 in the first direction X and sequentially positioned along a direction from far to near with respect to the cell array region 102 and a second pad region PA2, a fourth pad region PA4, a sixth pad region PA6, an eighth pad region PA8, and a tenth pad region PA10 positioned at a second side of the main support structure 164 in the first direction X and sequentially positioned along the direction from far to near with respect to the cell array region 102.

That is, each of the first pad region PA1 and the second pad region PA2, the third pad region PA3 and the fourth pad region PA4, the fifth pad region PA5 and the sixth pad region PA6, the seventh pad region PA7 and the eighth pad region PA8, and the ninth pad region PA9 and the tenth pad region PA10 may face each other in the first direction X with the first portion 164a of the main support structure 164 interposed therebetween.

Subsequently, referring to FIG. 13 to FIG. 14D, a step shape formed in the stack structure 120P positioned in the dummy regions DMR1 and DMR2 will be described.

FIG. 13 illustrates a partial perspective view showing a partial region of the stack structure 120P positioned in the connecting region 104 to describe a method of manufacturing a semiconductor device according to an example embodiment. FIG. 14A to FIG. 14D illustrate partial top plan views respectively showing some layers of the stack structure 120P illustrated in FIG. 13.

Figure 11:
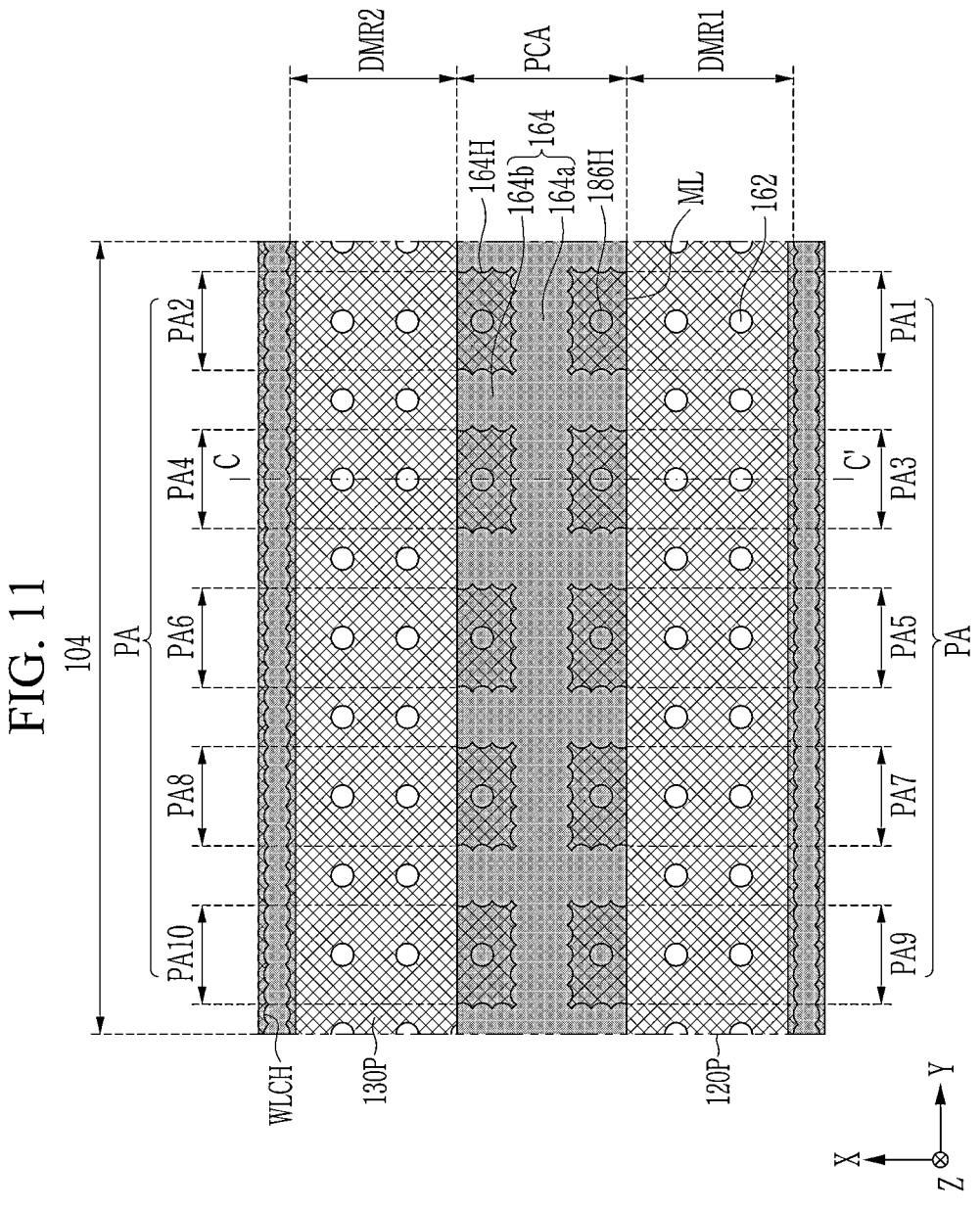
Figure 14A:
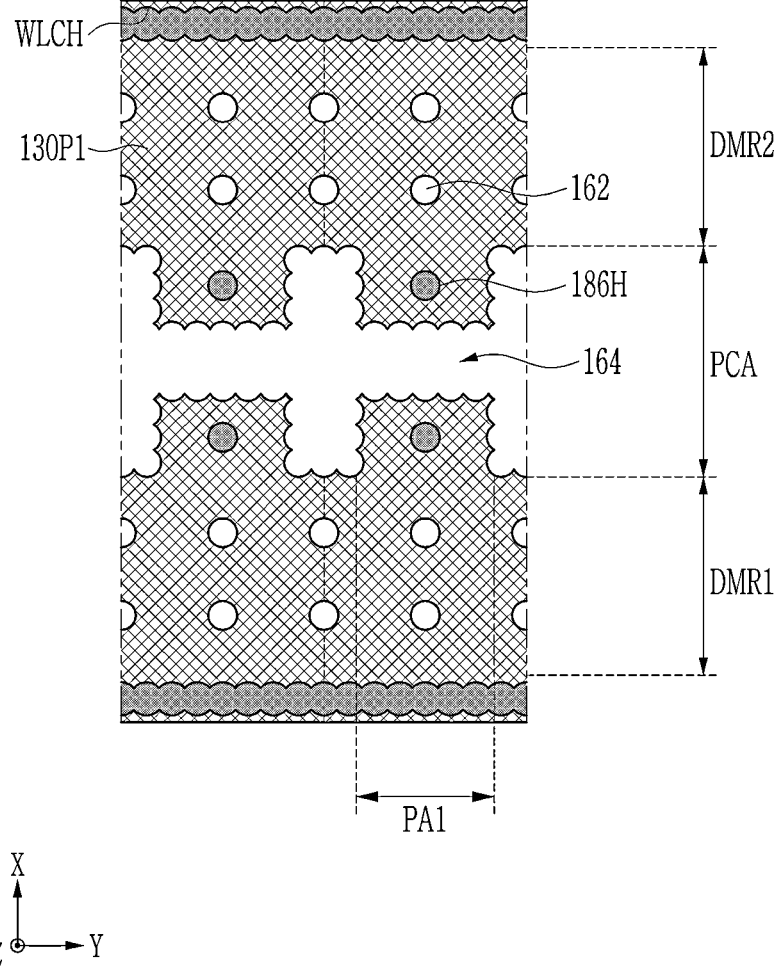
Figure 14B:
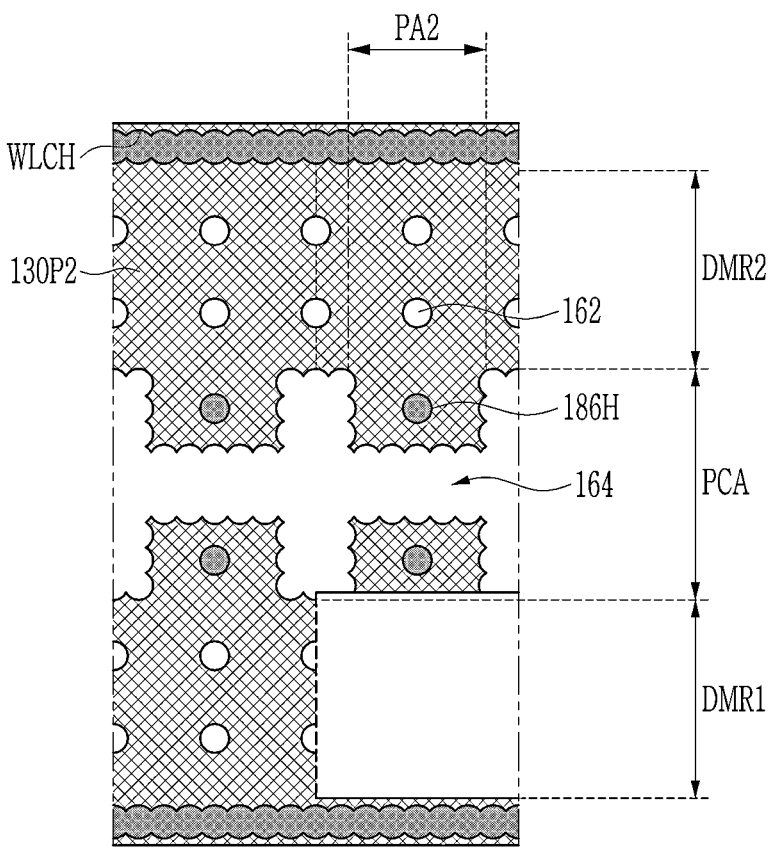
Figure 14B:
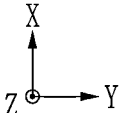
Figure 14C:
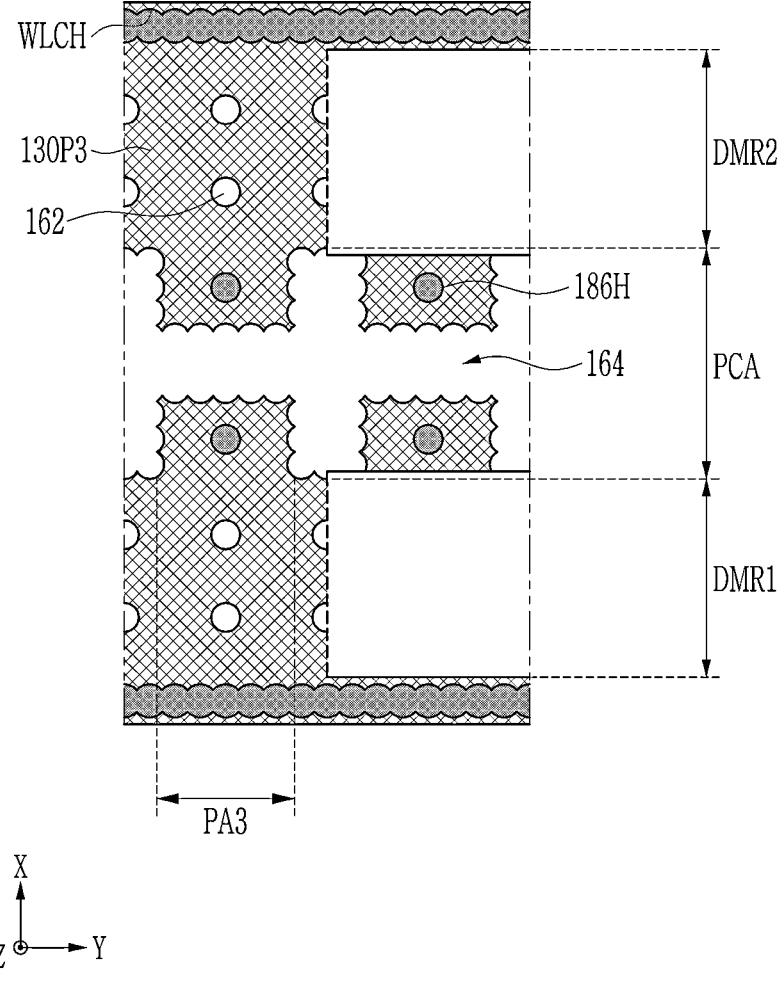
Figure 14D:
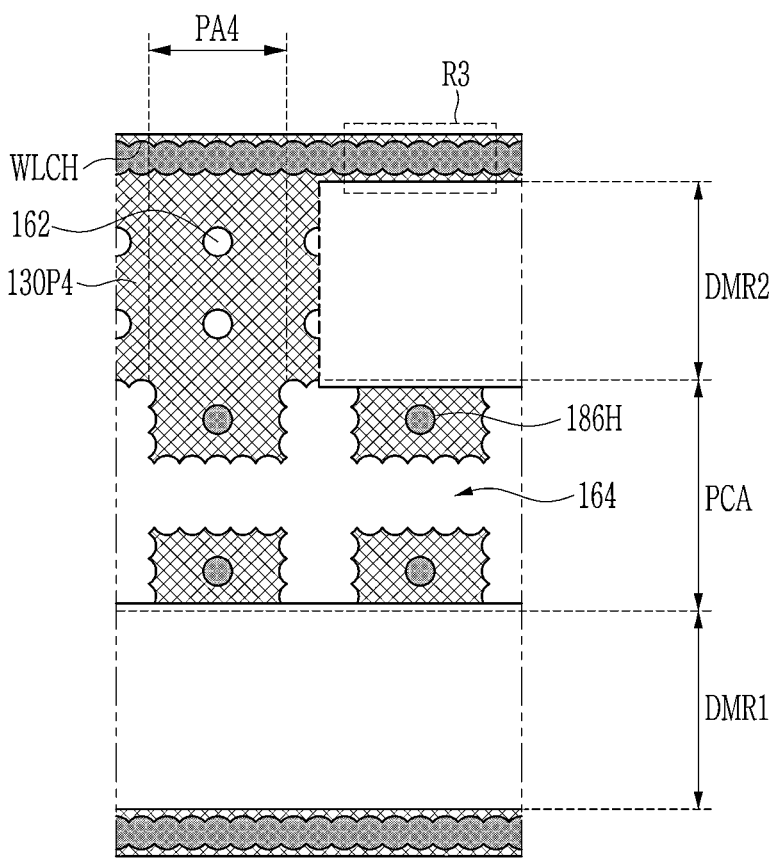
Figure 14D:
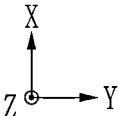
Figure 15:
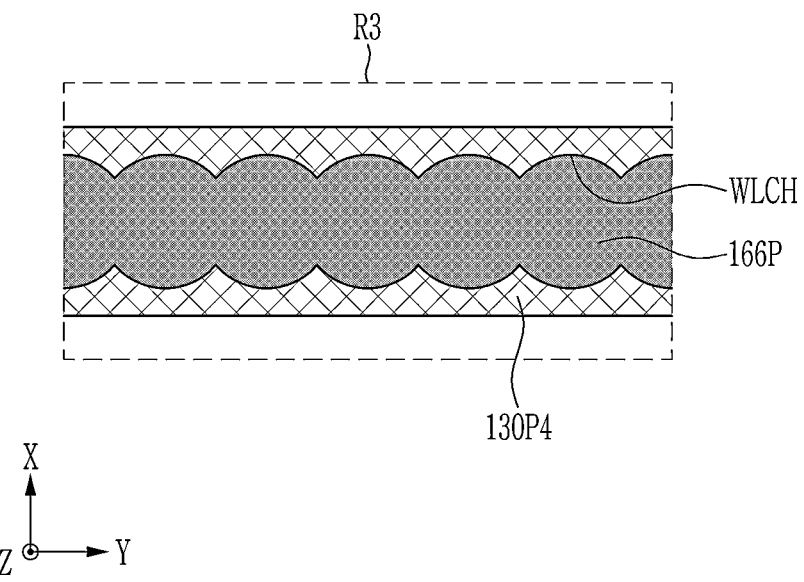
FIG. 15 illustrates a partially enlarged view of a region R3 of FIG. 14D.
Figure 16:
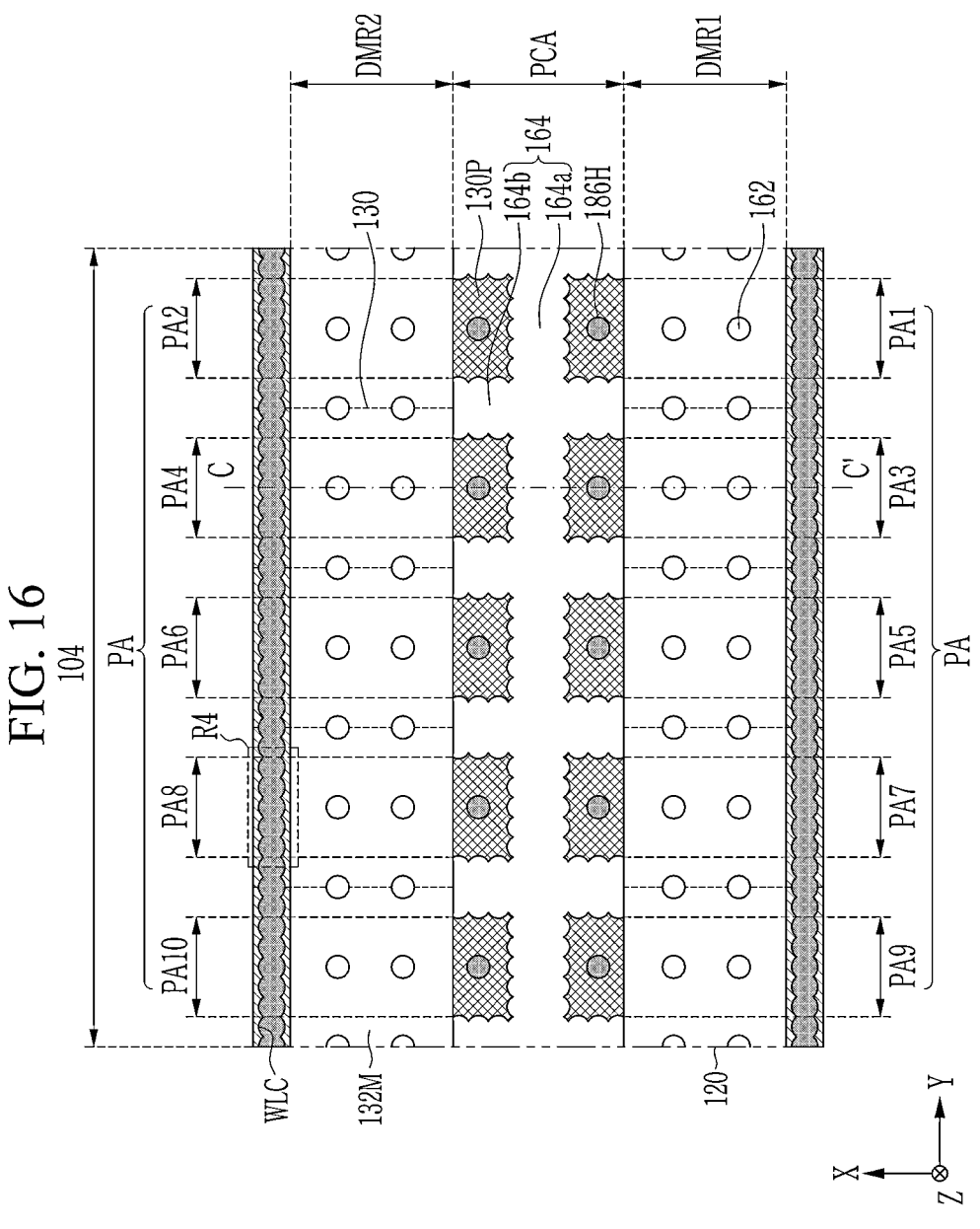

As illustrated in FIG. 13 to FIG. 14D, as described above, the stack structure 120P positioned in the dummy regions DMR1 and DMR2 of the connecting region 104 may have a step shape by patterning using the mask pattern ML (see FIG. 11).

Specifically, referring to FIGS. 13 to 14D, the stack structure 120P positioned at connecting region 104 may include a first sacrificial insulating layer 130P1, a second sacrificial insulating layer 130P2, a third sacrificial insulating layer 130P3, and a fourth sacrificial insulating layer 130P4 sequentially stacked.

As the stack structure 120P is patterned to form a step shape in the stack structure 120P positioned in the dummy regions DMR1 and DMR2, as illustrated in FIG. 14A to FIG. 14D, the first sacrificial insulating layer 130P1, the second sacrificial insulating layer 130P2, the third sacrificial insulating layer 130P3, and the fourth sacrificial insulating layer 130P4 included in the stack structure 120P may be patterned to have different areas and planar shapes in a plan view.

For example, the first sacrificial insulating layer 130P1 may be positioned in both the dummy regions DMR1 and DMR2 and the pad contact region PCA.

The second sacrificial insulating layer 130P2 may be positioned in the dummy regions DMR1 and DMR2 and the pad contact region PCA, and may have an area smaller than that of the first sacrificial insulating layer 130P1 in the first dummy region DMR1. That is, a length of the second sacrificial insulating layer 130P2 in the first dummy region DMR1 along the second direction Y may be shorter than a length of the first sacrificial insulating layer 130P1 in the first dummy region DMR1 along the second direction Y.

The third sacrificial insulating layer 130P3 may be positioned in the dummy regions DMR1 and DMR2 and the pad contact region PCA, and may have an area smaller than that of the second sacrificial insulating layer 130P2 in the second dummy region DMR2. That is, the third sacrificial insulating layer 130P3 may have substantially a same area as that of the second sacrificial insulating layer 130P2 in the first dummy region DMR1, and a length of the third sacrificial insulating layer 130P3 in the second dummy region DMR2 along the second direction Y may be shorter than a length of the second sacrificial insulating layer 130P2 in the second dummy region DMR2 along the second direction Y.

The fourth sacrificial insulating layer 130P4 may be positioned in the dummy regions DMR2 and the pad contact region PCA, and may have a smaller area than that of the first sacrificial insulating layer 130P3. That is, the fourth sacrificial insulating layer 130P4 may not be positioned in the first dummy region DMR1, and may have a substantially same area as that of the third sacrificial insulating layer 130P3 in the second dummy region DMR2.

Each of the first sacrificial insulating layer 130P1, the second sacrificial insulating layer 130P2, the third sacrificial insulating layer 130P3, and the fourth sacrificial insulating layer 130P4 may extend from the dummy regions DMR1 and DMR2 to the pad contact region PCA, and may be connected to the pad regions PA1, PA2, PA3, and PA4 positioned at different layers.

As such, as the first sacrificial insulating layer 130P1, the second sacrificial insulating layer 130P2, the third sacrificial insulating layer 130P3, and the fourth sacrificial insulating layer 130P4 having different areas by patterning the stacked structure 120P are sequentially stacked, the stack structure 120P positioned in the dummy regions DMR1 and DMR2 has a step shape, and step-shaped upper surfaces of the stack structure 120P positioned in the first dummy region DMR1 and the second dummy region DMR2 may be positioned at different levels.

The sacrificial insulating layers 130P extending from the first dummy region DMR1 to the second dummy region DMR2 may be disconnected by the main support structure 164 positioned in the pad contact region PCA.

Referring to FIG. 15 in addition to FIG. 12 and FIG. 13, the sacrificial layer 166P filling the isolation structure hole WLCH may be surrounded by the stack structure 120P in a process step of patterning the stack structure 120P positioned in the dummy regions DMR1 and DMR2 to form a step shape. In addition, a side surface of the sacrificial layer 166P filling the separation structure hole WLCH may be surrounded by the stack structure 120P in a cross-sectional view, and may directly contact the stack structure 120P.

FIG. 18 illustrates a partial perspective view showing a partial region of the gate stack structure 120 positioned in the connecting region 104 to describe a method of manufacturing a semiconductor device according to an example embodiment. FIG. 19A to FIG. 19D illustrate partial top plan views respectively showing some layers of the gate stack structure 120 illustrated in FIG. 18.

Subsequently, referring to FIG. 16 to FIG. 20, after forming the intermediate insulating layer 132M in the dummy regions DMR1 and DMR2, a process step of replacing the sacrificial insulating layer 130P of the stacking structure 120P with the gate electrode 130 may be performed.

Accordingly, the gate stack structure 120 in which the gate electrode 130 and the interlayer insulating layer 132L are cross-stacked may be formed. In addition, a portion of a side surface of the sacrificial layer 168P filling the contact electrode hole 186H may be surrounded by the gate stack structure 120, and a remaining portion of the side surface may be surrounded by the stack structure 120P. That is, a portion of the sacrificial insulating layer 130P of the stack structure 120P may not be replaced by the gate electrode 130. This is because the stack structure 120P surrounding the separation structure hole WLCH is spaced apart from the stack structure 120P located in the pad contact region PCA as illustrated in FIG. 14A to FIG. 14D.

Specifically, the intermediate insulating layer 132M may be formed in the dummy regions DMR1 and DMR2 in order to planarize a stepped step in the dummy regions DMR1 and DMR2. The intermediate insulating layer 132M may include the same material as the cell insulating layer 132 described above.

Subsequently, after removing the sacrificial layer 166P filled in the separation structure hole WLCH, the sacrificial insulating layer 130P positioned on the stack structure 120P may be removed through the separation structure hole WLCH, and the gate electrode 130 may be formed in a space where the sacrificial insulating layer 130P is removed. That is, after removing the sacrificial insulating layer 130P using an etching process, a metal material such as tungsten (W), copper (Cu), or aluminum (Al) may be deposited to form the gate electrode 130.

Further referring to FIG. 19A to 19D together with FIG. 14A to FIG. 14D, portions of the first sacrificial insulating layer 130P1, the second sacrificial insulating layer 130P2, the third sacrificial insulating layer 130P3, and the fourth sacrificial insulating layer 130P4 may be replaced with the first gate electrode 130_1, the second gate electrode 130_2, the third gate electrode 130_3, and the fourth gate electrode 130_4.

Specifically, the first sacrificial insulating layer 130P1 may be replaced with the first gate electrode 130_1 in the dummy regions DMR1, and DMR2 and the pad contact region PCA. Accordingly, the first gate electrode 130_1 connected to the first gate electrode 130_1 extending from the first dummy region DMR1 and positioned in the first pad area PA1 becomes the pad electrode PD.

The second sacrificial insulating layer 130P2 may be replaced with the second gate electrode 130_2 excluding a portion of the second sacrificial insulating layer 130P2 overlapping the first pad region PA1 in the dummy regions DMR1 and DMR2 and the pad contact region PCA. Accordingly, the second gate electrode 130_1 connected to the second gate electrode 130_1 extending from the second dummy region DMR2 and positioned in the second pad region PA2 becomes the pad electrode PD.

The third sacrificial insulating layer 130P3 may be replaced with the third gate electrode 130_3 excluding a portion of the third sacrificial insulating layer 130P3 overlapping the first pad region PA1 and the second pad region PA2 in the dummy regions DMR1 and DMR2 and the pad contact region PCA. Accordingly, the third gate electrode 130_3 connected to the third gate electrode 130_3 extending from the first dummy region DMR1 and positioned in the third pad area PA3 becomes the pad electrode PD.

The fourth sacrificial insulating layer 130P4 may be replaced with the fourth gate electrode 130_4 excluding a portion of the fourth sacrificial insulating layer 130P4 overlapping the first pad region PA1, the second pad region PA2, and the third pad region PA3 in the second dummy region DMR2 and the pad contact region PCA. Accordingly, the fourth gate electrode 130_4 connected to the fourth gate electrode 130_4 extending from the second dummy region DMR2 and positioned in the second pad region PA4 becomes the pad electrode PD.

In addition, the sacrificial insulating layers 130P1, 130P2, 130P3, and 130P4 surrounding the separation structure hole WLCH may be replaced with the first gate electrode 130_1, the second gate electrode 130_2, the third gate electrode 130_3, and the fourth gate electrode 130_4.

A reason why portions of the second sacrificial insulating layer 130P2, the third sacrificial insulating layer 130P3, and the fourth sacrificial insulating layer 130P4 positioned in the pad contact region PCA remain without being replaced by the gate electrode 130 is that each of the second sacrificial insulating layer 130P2, the third sacrificial insulating layer 130P3, and the fourth sacrificial insulating layer 130P4 positioned in the pad contact region PCA and each of the second sacrificial insulating layer 130P2, the third sacrificial insulating layer 130P3, and the fourth sacrificial insulating layer 130P4 surrounding the separation structure WLC are disconnected by the main support structure 164 and a space.

As described above, as the first gate electrode 130_1, the second gate electrode 130_2, the third gate electrode 130_3, and the fourth gate electrode 130_4 having different areas and shapes in a plan view are sequentially stacked, the gate electrodes 130 positioned in the dummy regions DMR1 and DMR2 have a step shape and extend from the dummy regions DMR1 and DMR2 to the pad region PA, and thus the pad electrodes PD connected to the gate electrodes 130 may be positioned at different levels.

In addition, as described above, as some of the sacrificial insulating layers 130P positioned in the pad contact region PCA remain without being replaced by the gate electrode 130, the stack structures 120P positioned on the pad electrodes PD may have different heights. As such, the stack structure 120P remaining on the pad electrode PD in the pad contact region PCA may be etched in a process step to be described later.

Figure 17:
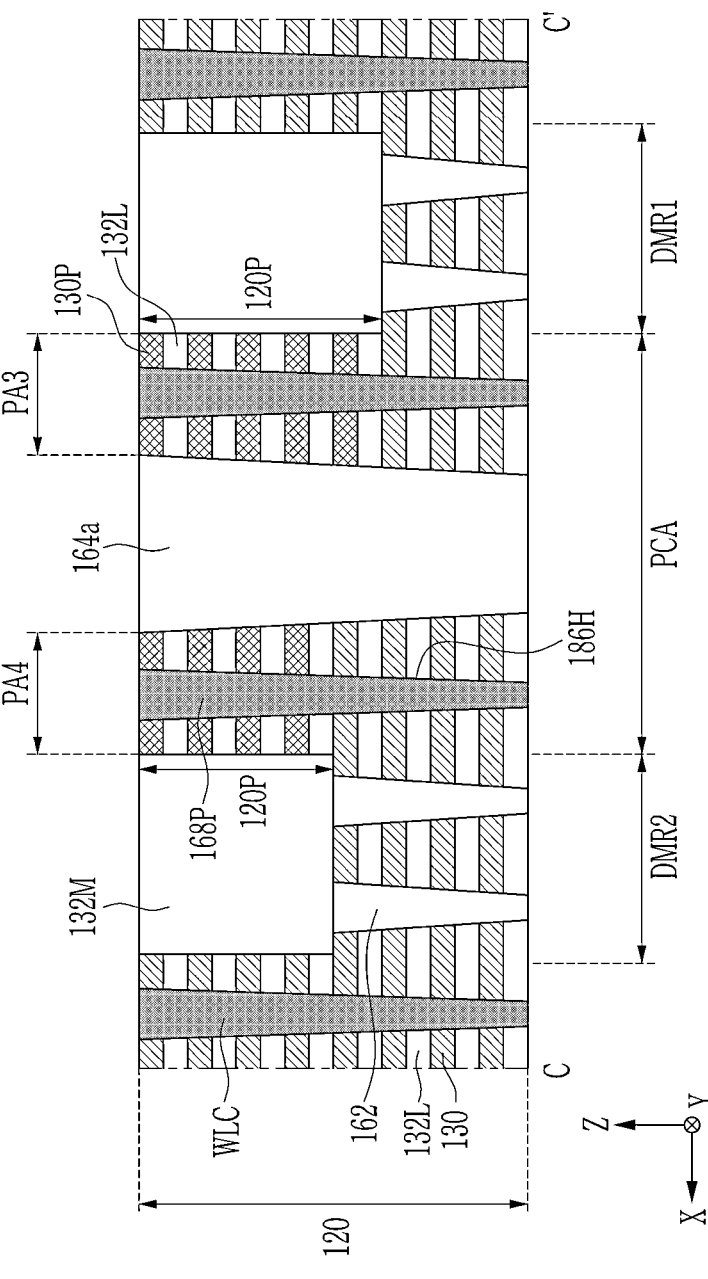

Subsequently, referring to FIG. 17, FIG. 18, and FIG. 20 in addition to FIG. 15, the separation structure WLC may be formed by filling the separation structure hole WLCH with various insulating materials. For example, the separating structure WLC may include an insulating material such as a silicon oxide, a silicon nitride, or a silicon oxynitride. However, a material included in the structure WLC is not limited thereto, and may be variously changed.

As the sacrificial insulating layer 130P is replaced by the gate electrode 130, the separation structure WLC may be surrounded by the gate stacking structure 120 in a plan view and in a cross-sectional view. The separation structure WLC may be spaced apart from the intermediate insulating layer 132M with the gate stack structure 120 provided therebetween. In addition, an upper surface of the separation structure WLC may be positioned at substantially a same level as an upper surface of the gate electrode 130. However, the present disclosure is not limited thereto, and a disposition relationship between the separation structure WLC and the gate stack structure 120 may be variously changed.

Figure 21:
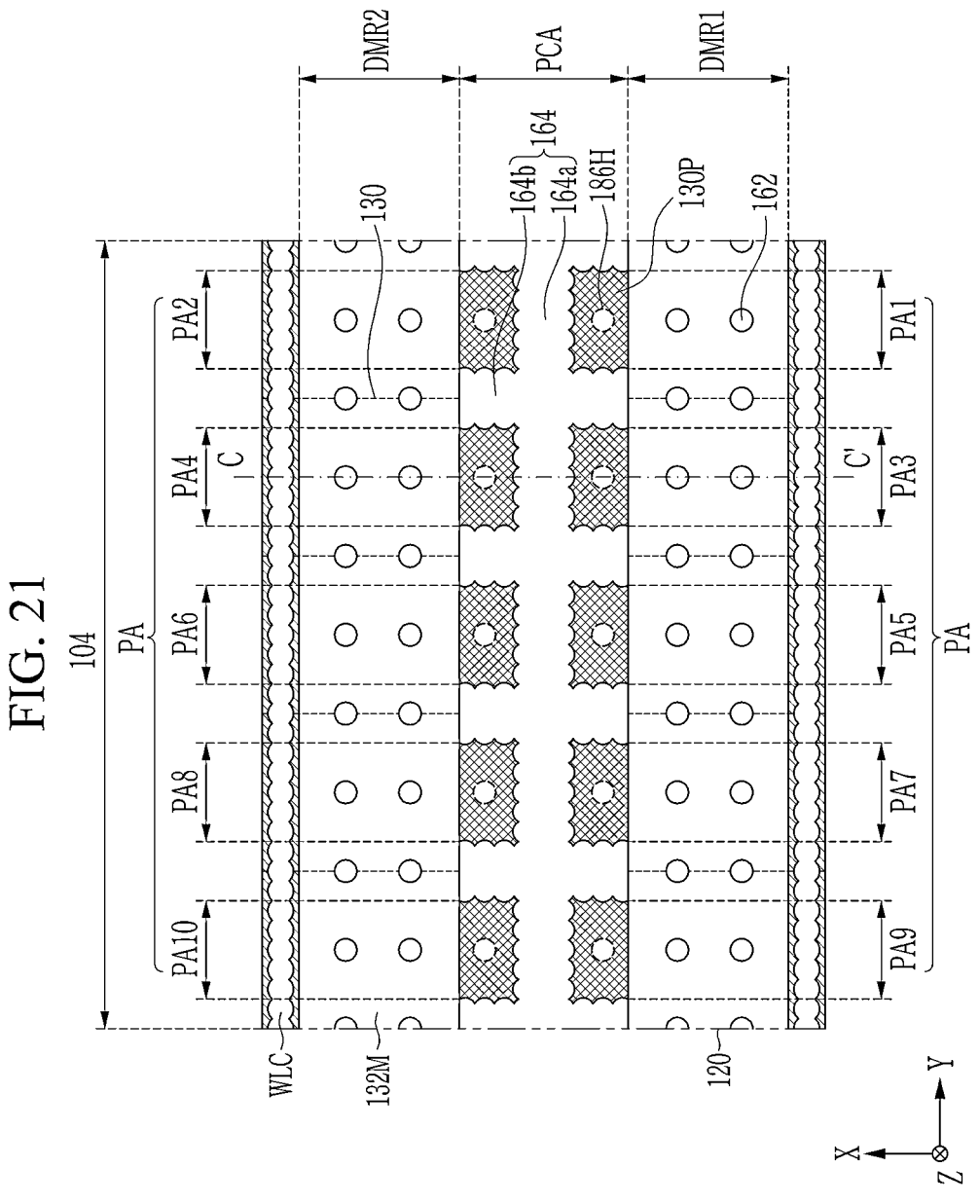
Figure 22:
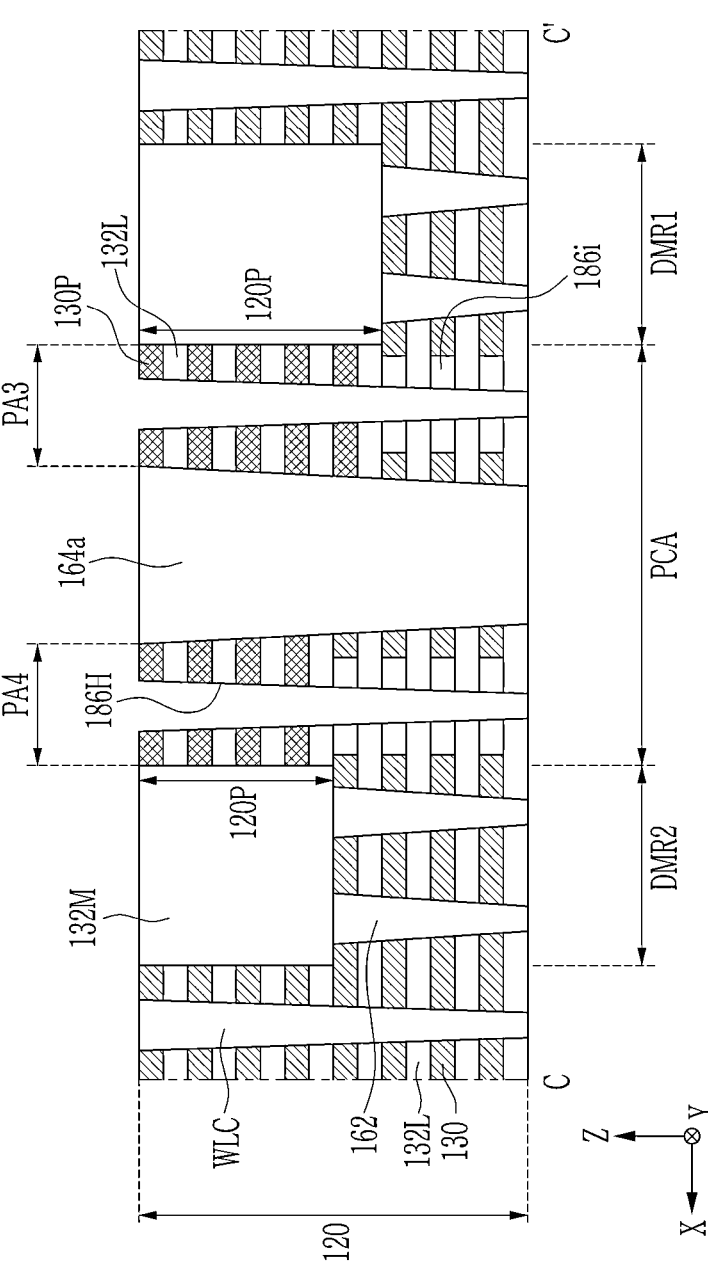

Subsequently, referring to FIG. 21 and FIG. 22, after removing the sacrificial layer 168P filled in the contact electrode hole 186H, a process of etching a portion of the gate electrode 130 positioned under the stack structure 120P may be performed. In the process of etching the portion of the gate electrode 130, as an etching process is performed using an etching material having high etching selectivity with respect to the gate electrode 130, the interlayer insulating layer 132L may remain without being etched.

Accordingly, a portion of the gate electrode 130 is etched toward a first side and a second side in the first direction X, and an empty space may be formed in a region where a portion of the gate electrode 130 is etched.

Subsequently, the insulation pattern 186i may be formed in an empty space formed by etching a portion of the gate electrode 130. The process of forming the insulation pattern 186i may include a process step of wet-etching an insulation pattern material layer located in a region other than the insulation pattern material layer filling an empty space formed by partially etching the gate electrode 130 after filling the contact electrode hole 186H with an insulation pattern material layer. However, a method for forming the insulation pattern 186i is not limited thereto, and may be variously changed.

Figure 23:
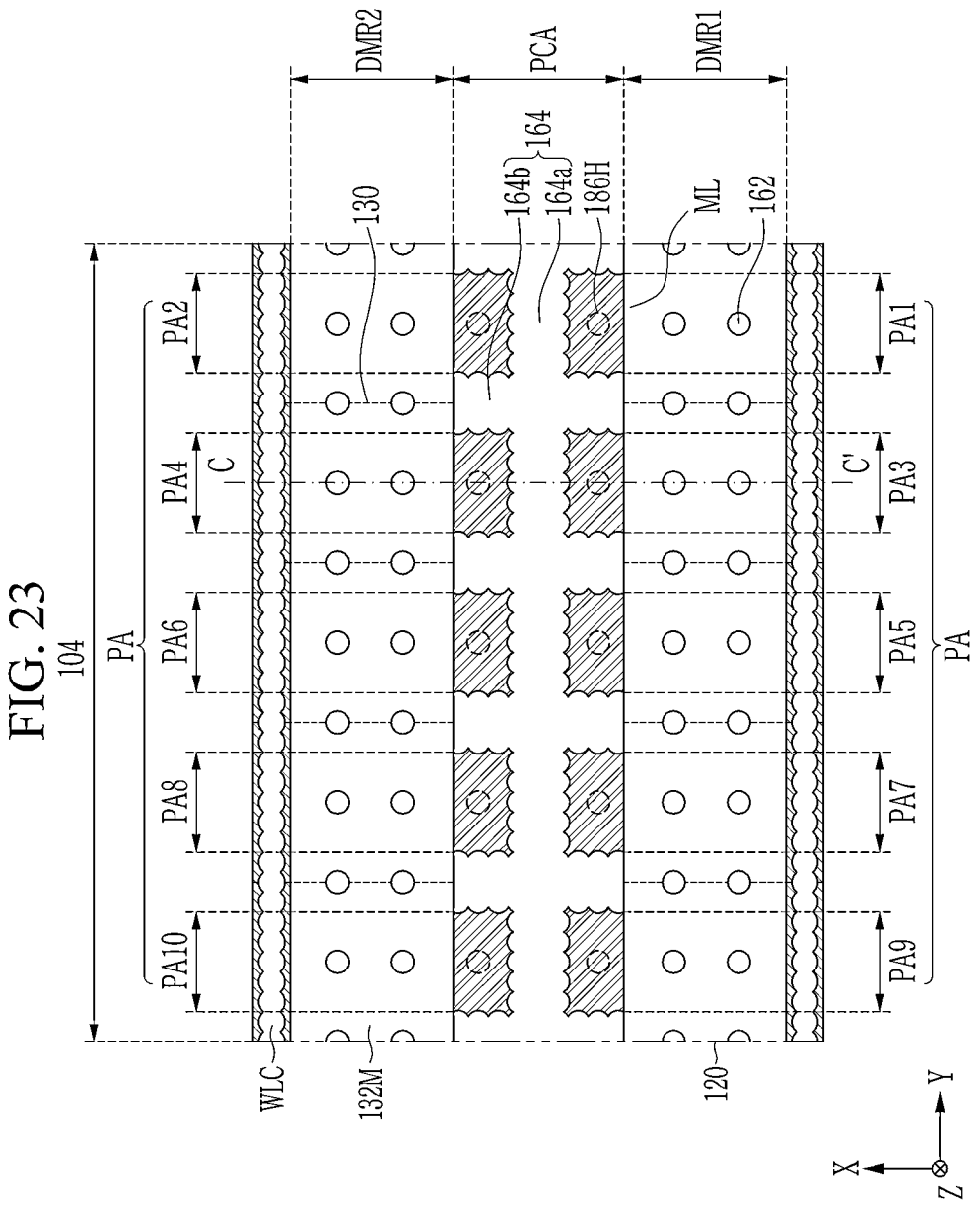
Figure 24:
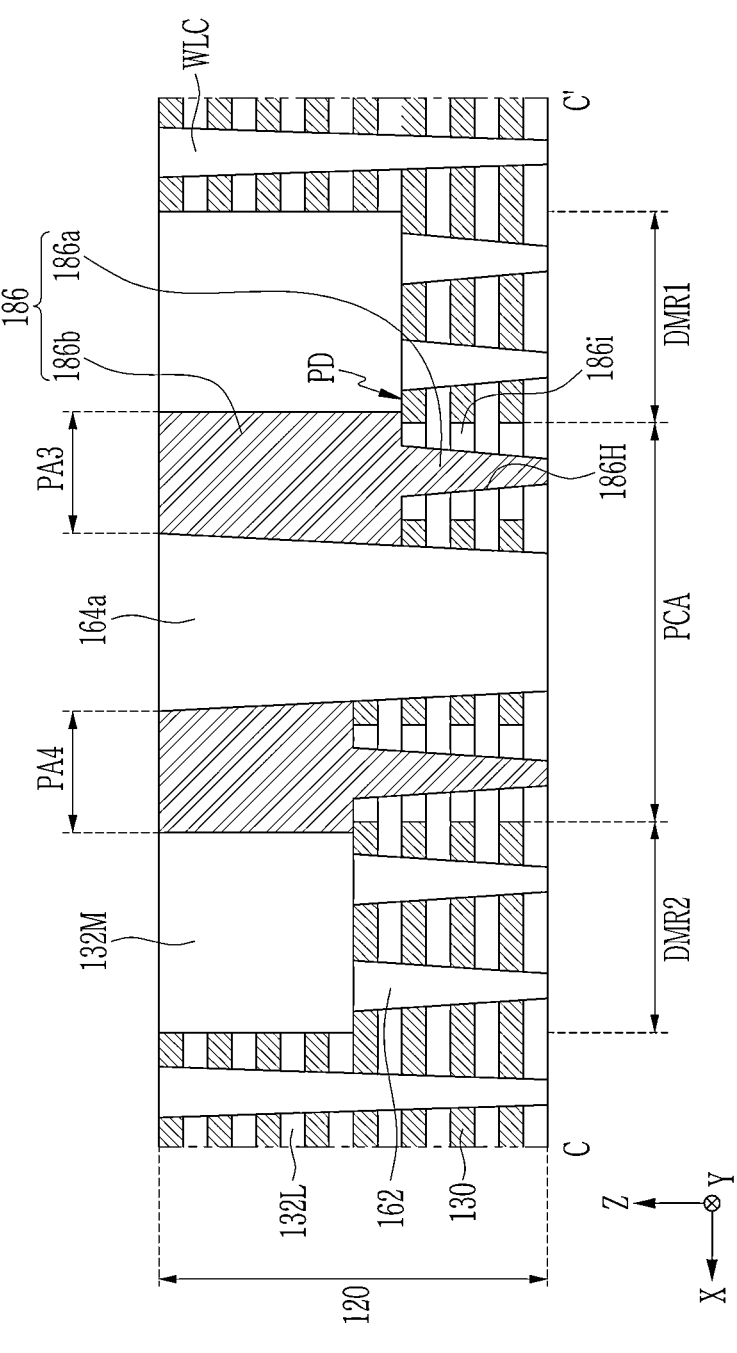

Subsequently, referring to FIG. 23 and FIG. 24, the interlayer insulating layer 132L of the stack structure 120P remaining on the pad electrode PD may be removed after selectively etching the sacrificial insulating layer 130P included in the stacked structure 120P remaining on the pad electrode PD.

In a process step of removing the interlayer insulating layer 132L of the stack structure 120P remaining on the pad electrode PD, a portion of the insulation pattern 186i may be etched together, so that a length of the insulation pattern 186i along the first direction X may be reduced.

Accordingly, a portion of the contact electrode hole 186H may extend through a portion of the gate stack structure 120, and a remaining portion may be positioned on the pad electrode PD, and may expose an upper surface of the pad electrode PD. However, a portion of the sacrificial insulating layer 130P and a portion of the interlayer insulating layer 132L may remain in a process step according to some example embodiments. That is, a portion of the sacrificial insulating layer 130P and a portion of the interlayer insulating layer 132L may remain, and may expose an upper surface of the pad electrode PD.

In addition, a width of the contact electrode hole 186H of the gate stack structure 120 may be smaller than that of the contact electrode hole 186H positioned on the pad electrode PD. That is, the contact electrode hole 186H may include portions having different widths.

Subsequently, a conductive material may be filled in the contact electrode hole 186H to form the contact electrode 186 connected to the upper surface of the pad electrode PD. The gate electrode 186 may include a conductive material. For example, the contact electrode 186 may include tungsten ((W), copper (Cu), or aluminum (Al). However, a material included in the contact electrode 186 is not limited thereto, and may be variously changed.

As described above, as the contact electrode hole 186H includes portions having different widths, in a process step of forming the contact electrode 186 in the contact electrode hole 186H, the contact electrode 186 may include portions having different widths in a cross-sectional view.

That is, the contact electrode 186 may include a first contact portion 186a extending through the gate stack structure 120, and a second contact portion 186b positioned on the first contact portion 186a and connected to an upper surface of the pad electrode PD. A width of the first contact portion 186a of the contact electrode 186 may be smaller than that of the second contact portion 186b.

The second contact portion 186b of the contact electrode 186 may completely cover the first contact portion 186a in a plan view, and may directly contact the side surface of the main support structure 164, and at least a portion of a side surface of the second contact portion 186b may be surrounded by the main support structure 164.

The first contact portion 186a of the contact electrode 186 may be insulated from the gate electrodes 130 positioned below the pad electrode PD by the insulation pattern 186i. In addition, as described above, as the pad electrodes PD positioned in the pad regions PA are positioned at different levels, each of the pad electrodes PD positioned in the pad regions PA may be connected to the contact electrode 186 at different levels. As the pad electrodes PD are positioned at different heights, lengths of the second contact portion 186b of the contact electrode 186 connected to the respective pad electrode PD along the third direction Z may be different.

In accordance with a manufacturing method of the semiconductor device 10 according to an example embodiment, if an etching process is performed on the stack structure 120P positioned in the pad contact region PCA to form the contact electrode holes 186H, each region of the stack structure 120P in which the contact electrode holes 186H are formed may be formed to include substantially same layers, and may have a same stack thickness.

As such, as the etching process for forming the contact electrode holes 186H proceeds in substantially a same environment, each region of the stack structure 120P in which the contact electrode holes 186H are formed may reduce occurrence of defects due to differences in process conditions that may occur in some areas of the stack structure 120P according to differences in process conditions, such as a type of stacked layers or a thickness of the stacked layers.

Accordingly, reliability of the semiconductor device may be improved, and productivity of the semiconductor device may be improved.

Next, an electronic system including a semiconductor device according to an example embodiment will be described with reference to FIG. 25.

FIG. 25 schematically illustrates an electronic system including a semiconductor device according to an example embodiment.

As illustrated in FIG. 25, the electron system 1000 according to an example embodiment may include a semiconductor device 1100 and a controller 1200 electrically connected to the semiconductor device 1100. The electronic system 1000 may be a storage device including one or a plurality of semiconductor devices 1100 or an electronic device including the storage device. For example, the electron system 1000 may be a solid state drive (SSD) device including one or the plurality of semiconductor devices 1100, a universal serial bus (USB), a computing system, a medical device, or a communication device.

The semiconductor device 1100 may be a non-volatile memory device, and may be, e.g., a NAND flash memory device described with reference to FIG. 1 to FIG. 8. The semiconductor device 1100 may include a first structure 1100F and a second structure 1100S on the first structure 1100F. In some example embodiments, the first structure 1100F may be positioned next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a word line WL, first and second gate upper lines UL1 and UL2, and first and second gate lower lines LL1 and LL2, and a memory cell string CSTR between the bit line BL and the common source line CSL.

In the second structure 1100S, each memory cell string CSTR may include lower transistors LT1 and LT2 adjacent to the common source line CSL, upper transistors UT1 and UT2 adjacent to the bit line BL, and a plurality of memory cell transistors MCT positioned between the lower transistors LT1 and LT2 and the upper transistors UT1 and UT2. A number of lower transistors LT1 and LT2 and a number of upper transistors UT1 and UT2 may be variously changed according to another example embodiment.

In some example embodiments, the lower transistors LT1 and LT2 may include ground selective transistors, and the upper transistors UT1 and UT2 may include string selective transistors. The first and second gate lower lines LL1 and LL2 may be gate electrodes of the lower transistors LT1 and LT2, respectively. The word line WL may be a gate electrode of the memory cell transistor MCT, and the gate upper lines UL1 and UL2 may be gate electrodes of the upper transistors UT1 and UT2, respectively.

The common source line CSL, the first and second gate lower lines LL1 and LL2, the word line WL, and the first and second gate upper lines UL1 and UL2 may be electrically connected to the decoder circuit 1110 through a first connecting wire 1115 extending from the first structure 1100F to the second structure 1100S. The bit line BL may be electrically connected to the page buffer 1120 through a second connecting wire 1125 extending to the second structure 1100S in the first structure 1100F.

In the first structure 1100F, the decoder circuit 1110 and the page buffer 1120 may execute a control operation on at least one memory cell transistor selected from among the memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/ output pad 1101 may be electrically connected to the logic circuit 1130 through an input/output connecting wire 1135 extending from the first structure 1100F to the second structure 1100S.

The controller 1200 may include a processor 1210, a NAND controller 1220, and a host interface 1230. According to another example embodiment, the electronic system 1000 may include a plurality of semiconductor devices 1100, and in this case, the controller 1200 may control the semiconductor devices 1100.

The processor 1210 may control an overall operation of the electron system 1000 including the controller 1200. The processor 1210 may operate according to predetermined firmware, and may access the semiconductor devices 1100 by controlling the NAND controller 1220. The NAND controller 1220 may include a NAND interface 1221 that processes communication with the semiconductor devices 1100. A control command for controlling the semiconductor device 1100, data to be recorded in the memory cell transistor MCT of the semiconductor device 1100, and data to be read from the memory cell transistor MCT of the semiconductor device 1100 may be transmitted through the NAND interface 1221. The host interface 1230 may provide a communication function between the electronic system 1000 and an external host. When a control command is received from an external host through the host interface 1230, the processor 1210 may control the semiconductor devices 1100 in response to the control command.

Figure 26:
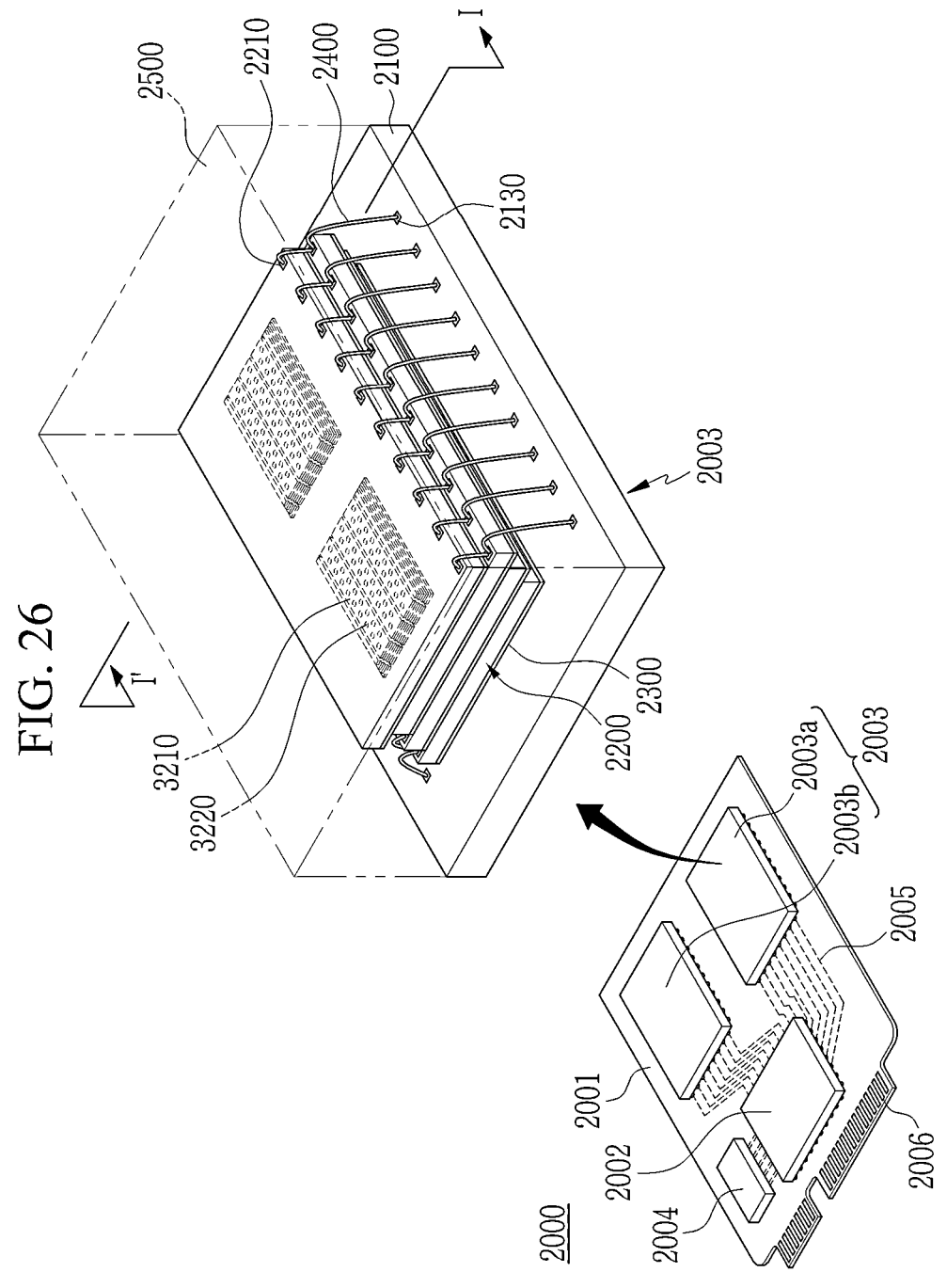
FIG. 26 illustrates a schematic perspective view showing an electronic system including a semiconductor device according to an example embodiment.

FIG. 26 illustrates a schematic perspective view showing an electronic system including a semiconductor device according to an example embodiment.

As illustrated in FIG. 26, an electronic system 2000 according to an example embodiment includes a main substrate 2001, a controller 2002 mounted on the main substrate 2001, one or more semiconductor packages 2003, and a DRAM 2004. The semiconductor package 2003 and the DRAM 2004 may be connected to the controller 2002 through a wire pattern 2005 positioned on the main substrate 2001.

The main substrate 2001 may include a connector 2006 including a plurality of pins coupled to an external host. A number and disposition of the pins in the connector 2006 may vary depending on a communication interface between the electronic system 2000 and the external host. In some example embodiments, the electronic system 2000 may communicate with the external host according to any one of interfaces such as a universal flash storage (USB), a peripheral component interconnect express (PCI-Express), a serial advanced technology attachment (SATA), M-Phy for universal flash storage (UFS), and the like.

In some example embodiments, the electronic system 2000 may operate with power supplied from an external host through the connector 2006. The electronic system 2000 may further include a power management integrated circuit (PMIC) that distributes power supplied from the external host to the controller 2002 and semiconductor package 2003.

The controller 2002 may record data in the semiconductor package 2003, or may read data from the semiconductor package 2003, and may improve an operation speed of the electronic system 2000.

The DRAM 2004 may be a buffer memory for buffering a speed difference between the semiconductor package 2003, which is a data storage space, and an external host. The DRAM 2004 included in the electronic system 2000 may also operate as a kind of cache memory, and may provide a space for temporarily storing data in the control operation for the semiconductor package 2003. When the electronic system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. The first and second semiconductor packages 2003*a* and 2003*b* may be semiconductor packages each including a plurality of semiconductor chips 2200. Each of the first and second semiconductor packages 2003*a* and 2003*b* may include a package substrate 2100, a semiconductor chip 2200 on the package substrate 2100, an adhesive layer 2300 disposed on a lower surface of each semiconductor chip 2200, a connecting structure 2400 that electrically connects the semiconductor chip 2200 and the package substrate 2100, and a molding layer 2500 covering the semiconductor chip 2200 and the connection structure 2400 on the package substrate 2100.

The package substrate 2100 may be a printed circuit board including a package upper pad 2130. Each semiconductor chip 2200 may include an input/output pad 2210. The input/output pad 2210 may correspond to the input/output pad 1101 of FIG. 25. Each semiconductor chip 2200 may include a gate stack structure 3210 and a channel structure 3220. The semiconductor chip 2200 may include the semiconductor device described with reference to FIG. 1 to FIG. 8.

In some example embodiments, the connecting structure 2400 may be a bonding wire electrically connecting the input/output pad 2210 and the package upper pad 2130. Accordingly, the semiconductor chips 2200 may be electrically connected to each other by using a bonded wire method, and may be electrically connected to the package upper pad 2130 of the package substrate 2100 in each of the first and second semiconductor packages 2003*a* and 2003*b*. According to an example embodiment, the semiconductor chips 2200 may be electrically connected to each other by a connecting structure including a through silicon via (TSV) instead of the bonding wire connecting structure 2400 in each of the first and second semiconductor packages 2003*a* and 2003*b*.

In some example embodiments, the controller 2002 and the semiconductor chip 2200 may be included in one package. For example, the controller 2002 and the semiconductor chip 2200 may be mounted on a separate interposer substrate that is different from the main substrate 2001, and the controller 2002 and the semiconductor chip 2200 may be connected to each other by a wire positioned on the interposer substrate.

Figure 27:
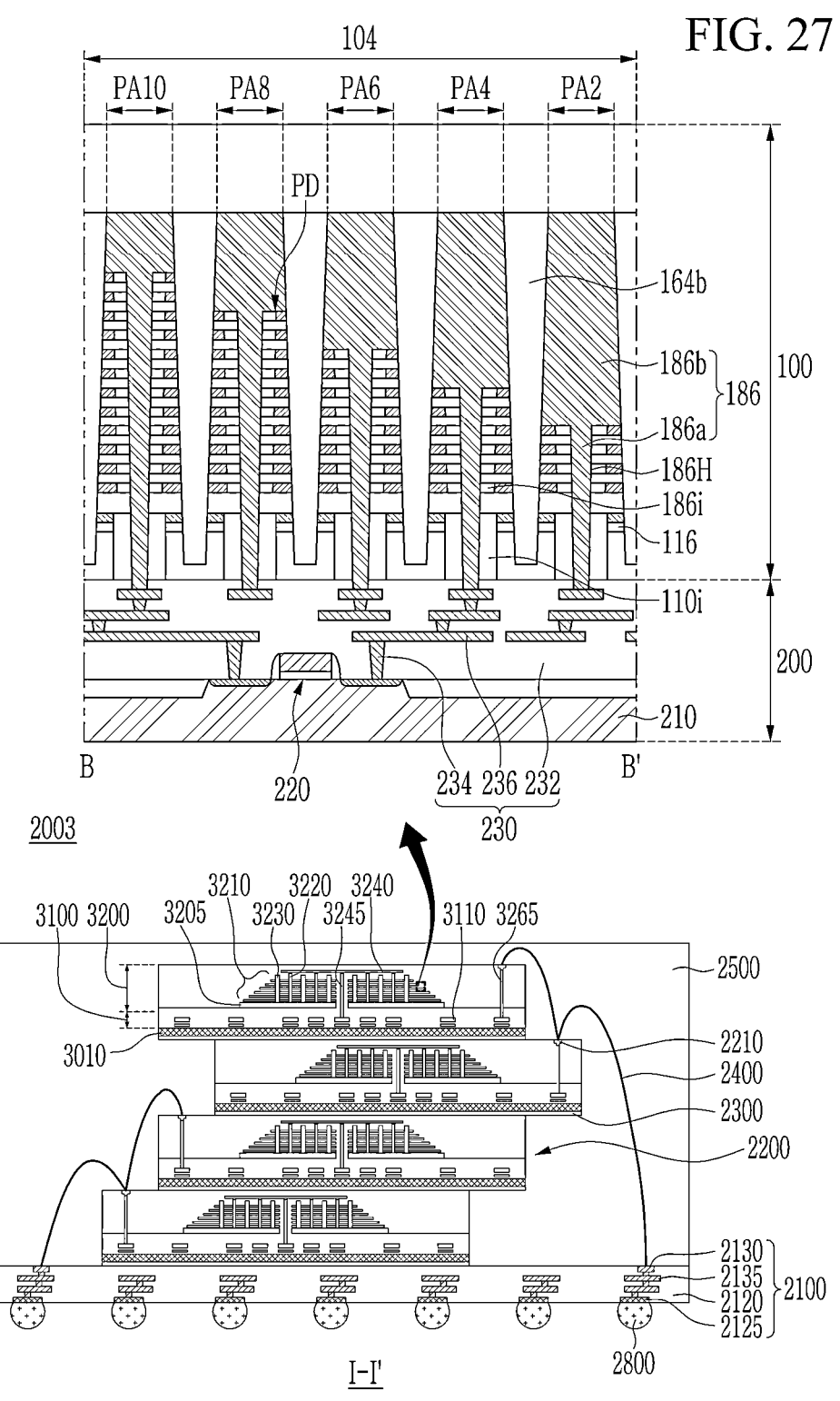
FIG. 27 and FIG. 28 each illustrate a schematic cross-sectional view showing a semiconductor package according to an example embodiment.
Figure 28:
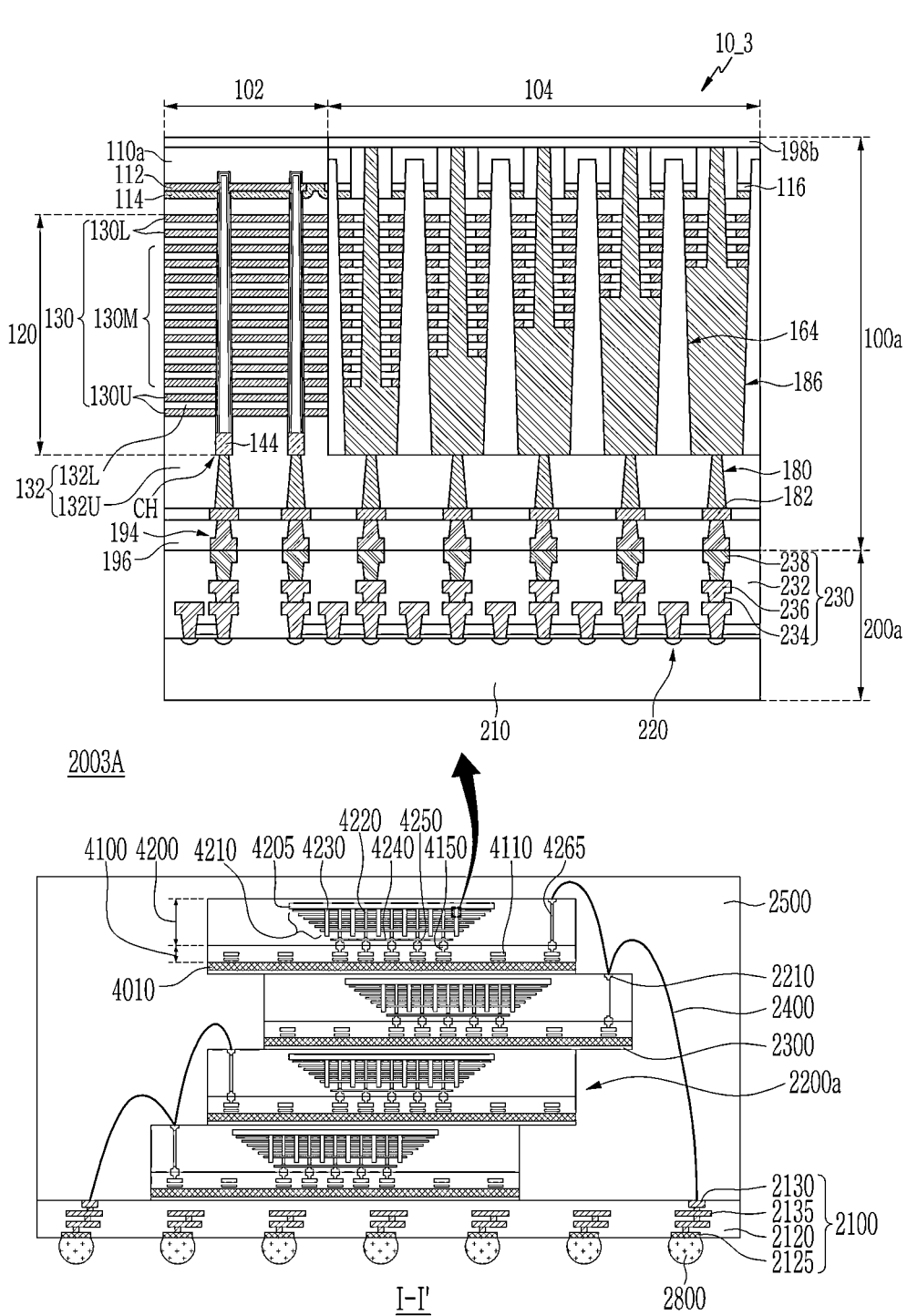

FIG. 27 and FIG. 28 each illustrate a schematic cross-sectional view showing a semiconductor package according to an example embodiment. FIG. 27 and FIG. 28 each illustrate an example embodiment of the semiconductor package 2003 of FIG. 26, and conceptually illustrates an area of the semiconductor package 2003 of FIG. 26 taken along a line I-I'.

Referring to FIG. 27, in the semiconductor package 2003, the package substrate 2100 may be a printed circuit board. The package substrate 2100 may include a package substrate body 2120, a package upper pad 2130 positioned on an upper surface of the package substrate body 2120, a lower pad 2125 positioned on a surface of the package substrate body 2120, and an inner wire 2135 that electrically connects the upper pad 2130 and the lower pad 2125 inside the package substrate body 2120. The upper pad 2130 may be electrically connected to the connecting structure 2400. The lower pad 2125 may be connected to the wire pattern 2005 of the main substrate 2001 of the electronic system 2000 through a conductive connector 2800 as illustrated in FIG. 23.

The semiconductor chip 2200 may each include a semiconductor substrate 3010, and a first structure 3100 and a second structure 3200 stacked in turn on the semiconductor substrate 3010. The first structure 3100 may include a peripheral circuit region including a peripheral wire 3110. The second structure 3200 may include a common source line 3205, a gate stack structure 3210 on the common source line 3205, a channel structure 3220 and a separating structure 3230 through the gate stack structure 3210, a bit line 3240 electrically connected to the channel structure 3220, and a gate connecting wire electrically connected to a word line WL (see FIG. 25) of the gate stack structure 3210.

In the semiconductor chip 2200 or the semiconductor device according to an example embodiment, as the etching process is performed in substantially the same environment, each region of the stack structure in which the contact electrodes 186 are formed may prevent occurrence of defects due to differences in etching conditions that may occur in some regions of a stack structure according to differences in process conditions, such as a type of stacked layers or a thickness of stacked layers. Accordingly, it is possible to improve reliability of the semiconductor device and also productivity of the semiconductor device by improving electrical characteristics of the contact electrode 186 connected to each of the pad electrodes PD provided in the pad region PA.

Each of the semiconductor chips 2200 may include a through wire 3245 that is electrically connected to the peripheral wire 3110 of the first structure 3100 and extends into the second structure 3200. The through wire 3245 may extend through the gate stack structure 3210, and may be further positioned outside the gate stack structure 3210. Each semiconductor chip 2200 may further include an input/output connection wire 3265 electrically connected to the peripheral wire 3110 of the first structure 3100 and an input/output pad 2210 electrically connected to the input/output connecting wire 3265 extending into the second structure 3200.

In an example embodiment, a plurality of semiconductor chips 2200 in the semiconductor package 2003 may be electrically connected to each other by a connecting structure 2400 having a form of a bonding wire. As another example, the semiconductor chips 2200 or a plurality of portions constituting the semiconductor chips 2200 may be electrically connected by a connecting structure including a through silicon via (TSV).

Referring to FIG. 28, in a semiconductor package 2003A, each semiconductor chip 2200 may include a semiconductor substrate 4010, a first structure 4100 on the semiconductor substrate 4010, and a second structure 4200 bonded to a first structure 4100 by wafer bonding on the first structure 4100.

The first structure 4100 may include a peripheral circuit region including a peripheral wire 4110 and a first junction structure 4150. The second structure 4200 may include a common source line 4205, a gate stack structure 4210 between the common source line 4205 and the first structure 4100, a channel structure 4220 and a separating structure 4230 extending through the gate stack structure 4210, and a second junction structure 4250 electrically connected to the word line WL (see FIG. 25, hereinafter the same) of each of the channel structure 4220 and the gate stack structure 4210. For example, the second junction structure 4250 may be electrically connected to the channel structure 4220 and the word line WL through a bit line 4240 electrically connected to the channel structure 4220 and a gate connecting wire electrically connected to the word line WL, respectively.

The first junction structure 4150 of the first structure 4100 and the second junction structure 4250 of the second structure 4200 may be bonded while contacting each other. A bonded portion of the first junction structure 4150 and the second junction structure 4250 may be formed of, e.g., copper (Cu).

In the semiconductor chip 2200 or the semiconductor device according to an example embodiment, as the etching process is performed in substantially the same environment, each region of the stack structure in which the contact electrodes 186 are formed may prevent occurrence of defects due to differences in etching conditions that may occur in some regions of a stack structure according to differences in process conditions, such as a type of stacked layers or a thickness of stacked layers. Accordingly, it is possible to improve reliability of the semiconductor device and also productivity of the semiconductor device by improving electrical characteristics of the contact electrode 186 connected to each of the pad electrodes PD provided in the pad region PA.

Each of the semiconductor chips 2200 may further include an input/output pad 2210 and an input/output connecting wire 4265 under the input/output pad 2210. The input/output connecting wire 4265 may be electrically connected to a portion of the second junction structure 4250.

In an example embodiment, a plurality of semiconductor chips 2200 in the semiconductor package 2003 may be electrically connected to each other by a connecting structure 2400 having a form of a bonding wire. As another example, the semiconductor chips 2200 or a plurality of portions constituting the semiconductor chips 2200 may be electrically connected by a connecting structure including the through silicon via (TSV).

Throughout the specification and claims, when a part is "connected" to another part, it includes not only a case where the part is "directly connected" but also the case where the parts are "indirectly connected" with another part in between.

Any functional blocks shown in the figures and described above may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

When either of the terms "about" or "substantially" is used in this specification in connection with a numerical value, it is intended that the associated numerical value includes a manufacturing or operational tolerance (e.g., +10%) around the stated numerical value. Moreover, when the word "generally" or "substantially" is used in connection with geometric shapes, it is intended that precision of the geometric shape is not required, but that latitude for the shape is within the scope of the disclosure. Additionally, regardless of whether numerical values or shapes are modified by the terms "about" or "substantially," it will be understood that these values and shapes should be construed as including a manufacturing or operational tolerance (e.g., ±10%) around the stated numerical values or shapes. Furthermore, it will be understood that when elements, functions, shapes, etc. are referenced as being the same, they may also be substantially the same or similar, even if the terminology substantially and similar are not used.

While this disclosure has been described in connection with what are presently considered to be practical example embodiments, it is to be understood that the disclosure is not limited to the disclosed example embodiments, but, on the contrary, is intended to cover various modifications and equivalents included within the spirit and scope of the appended claims.

What is claimed is:

1. A semiconductor device comprising:
   a circuit region configured to include a peripheral circuit structure on a substrate; and a cell region adjacent to the circuit region and configured to include a cell array region and a connecting region,
   wherein the cell region includes:
      a gate stack structure configured to include an interlayer insulating layer and a gate electrode which are alternately stacked on the substrate,
      a channel structure in the cell array region and configured to extend through the gate stack structure,
      a main support structure in the connecting region and configured to extend through the gate stack structure, and
      a contact electrode in the connecting region and connected to the gate electrode through the gate stack structure, and
   the main support structure includes:
      a first portion configured to extend along a first direction; and
      a second portion configured to extend from the first portion in a second direction crossing the first direction,
   wherein at least a portion of the contact electrode is surrounded by the first portion and the second portion of the main support structure.

2. The semiconductor device of claim 1, wherein
   the gate stack structure includes a plurality of gate electrodes separated by the interlayer insulating layer,
   the gate electrodes extend from the cell array region to the connecting region,
   the gate electrodes each include a pad electrode in the connecting region configured to be connected to the contact electrode, and
   the contact electrode is electrically connected to a pad electrode of one of the gate electrodes and insulated from remaining gate electrodes with an insulating pattern therebetween.

3. The semiconductor device of claim 2, further comprising
   a separation structure configured to extend from the cell array region to the connecting region and to extend through the gate stack structure,
   wherein the connecting region includes:
   a pad contact region including the main support structure, the pad electrode, and the contact electrode; and
   a dummy region between the pad contact region and the separation structure.

4. The semiconductor device of claim 3, further comprising
   an intermediate insulating layer configured to cover the gate stack structure in the dummy region,
   wherein the gate stack structure is between the separation structure and the intermediate insulating layer.

5. The semiconductor device of claim 3, further comprising

43 a sub-support structure in the dummy region and configured to extend through the gate stack structure,
wherein an upper surface of the main support structure is at a higher level than that of an upper surface of the sub-support structure.

6. The semiconductor device of claim 3, wherein
a plurality of sub-support structures arranged to be spaced apart from each other and having an island shape in a plan view are in the dummy region, and
the main support structure has a line shape in a plan view.

7. The semiconductor device of claim 3, wherein
an upper surface of the separation structure is at a same level as that of an upper surface of the main support structure,
the upper surface of the separation structure and the upper surface of the main support structure are at a higher level than an upper surface of the gate stack structure positioned in the dummy region, and
the gate stack structure in the dummy region has a step shape in a cross-sectional view.

8. The semiconductor device of claim 2, wherein
the contact electrode includes:
a first contact portion surrounded by the gate stack structure and connected to the peripheral circuit structure; and
a second contact portion on the first contact portion and the gate stack structure and connected to an upper surface of the pad electrode,
wherein the first contact portion of the contact electrode, the second contact portion of the contact electrode, and the pad electrode are surrounded by the main support structure in a plan view, and
an upper surface of the first contact portion of the contact electrode is entirely covered by the second contact portion of the contact electrode.

9. The semiconductor device of claim 1, wherein
the main support structure includes a plurality of second portions spaced apart along the first direction in a plan view,
the contact electrode is between the second portions of the main support structure in a plan view, and
the contact electrode directly contacts the first portion and the second portions of the main support structure.

10. The semiconductor device of claim 1, wherein
at least one of the first portion or the second portion of the main support structure has a line shape in a plan view.

11. The semiconductor device of claim 10, wherein
an edge of the main support structure has an embossing shape in a plan view.

12. A semiconductor device comprising:
a circuit region configured to include a peripheral circuit structure on a substrate; and
a cell region adjacent to the circuit region and configured to include a cell array region and a connecting region,
wherein the cell region includes
a gate stack structure configured to include a plurality of interlayer insulating layers and a plurality of gate electrodes alternately stacked on the substrate,
a channel structure in the cell array region configured to extend through the gate stack structure,
a support structure in the connecting region to extend through the gate stack structure, and
a contact electrode in the connecting region connected to the gate electrode through the gate stack structure,
wherein each of the gate electrodes includes a pad electrode in the connecting region,

the contact electrode is electrically connected to a pad electrode of one of the gate electrodes and insulated from remaining gate electrodes with an insulating pattern provided therebetween, and
the contact electrode is at least partially surrounded by the support structure in a plan view, and
includes
a first contact portion surrounded by the gate stack structure in a cross-sectional view, and connected to the peripheral circuit structure; and
a second contact portion on the first contact portion and on the gate stack structure and connected to an upper surface of the pad electrode.

13. The semiconductor device of claim 12, wherein
a width of the first contact portion is smaller than a width of the second contact portion.

14. The semiconductor device of claim 13, wherein
the first contact portion is surrounded by the interlayer insulating layers and the insulating pattern, and
the second contact portion is surrounded by the support structure.

15. The semiconductor device of claim 14, wherein
the first contact portion directly contacts the interlayer insulating layer and the insulating pattern, and
the second contact portion directly contacts the support structure.

16. The semiconductor device of claim 12, wherein
the contact electrode includes a plurality of contact electrodes spaced apart from each other with a support structure provided therebetween, and
vertical lengths of second contact portions of respective contact electrodes of the plurality of contact electrodes are different.

17. The semiconductor device of claim 16, wherein
the vertical lengths of the second contact portions of at least some of the respective contact electrodes increase as a distance from the cell array region increases.

18. The semiconductor device of claim 12, wherein
an upper surface of the contact electrode and an upper surface of the support structure are at a same level.

19. The semiconductor device of claim 12, wherein
a width of the support structure and a width of the first contact portion become narrower toward the substrate in a cross-sectional view, and
a width of the second contact portion increases toward the substrate.

20. An electronic system comprising:
a main substrate;
a semiconductor device on the main substrate; and
a controller electrically connected to the semiconductor device on the main substrate,
wherein the semiconductor device includes: a circuit region configured to include a peripheral circuit structure on a substrate, and
a cell region adjacent to the circuit region and configured to include a cell array region and a connecting region,
wherein the cell region includes:
a gate stack structure configured to include a plurality of interlayer insulating layers and a plurality of gate electrodes which are alternately stacked on the substrate,
a channel structure in the cell array region and to configured to extend through the gate stack structure,
a support structure in the connecting region and configured to extend through the gate stack structure, and a contact electrode in the connecting region and connected to the gate electrode through the gate stack structure, wherein each of the gate electrodes includes a pad electrode in the connecting region configured to be connected to the contact electrode, and the contact electrode is electrically connected to a pad electrode of one of the gate electrodes and insulated from remaining gate electrodes with an insulating pattern provided therebetween, and the contact electrode is at least partially surrounded by the support structure in a plan view, and includes a first contact portion surrounded by the gate stack structure in a cross-sectional view, and connected to the peripheral circuit structure, and a second contact portion on the first contact portion and on the gate stack structure and connected to an upper surface of the pad electrode.

* * * * *